US012563963B2

(12) United States Patent
Senkovskyy et al.

(10) Patent No.: US 12,563,963 B2
(45) Date of Patent: Feb. 24, 2026

(54) ELECTRON INJECTION LAYER FOR AN ORGANIC LIGHT-EMITTING DIODE (OLED)

(71) Applicant: NOVALED GMBH, Dresden (DE)

(72) Inventors: Volodymyr Senkovskyy, Dresden (DE); Jerome Ganier, Dresden (DE); Carsten Rothe, Dresden (DE)

(73) Assignee: Novaled GmbH, Dresden (DE)

( * ) Notice: Subject to any disclaimer, the term of this patent is extended or adjusted under 35 U.S.C. 154(b) by 660 days.

(21) Appl. No.: 16/062,974

(22) PCT Filed: Dec. 14, 2016

(86) PCT No.: PCT/EP2016/080958
§ 371 (c)(1),
(2) Date: Jun. 15, 2018

(87) PCT Pub. No.: WO2017/102822
PCT Pub. Date: Jun. 22, 2017

(65) Prior Publication Data

US 2019/0006589 A1 Jan. 3, 2019

(30) Foreign Application Priority Data

Dec. 18, 2015 (EP) .................................... 15201418

(51) Int. Cl.
*H01L 51/00* (2006.01)
*C07F 9/53* (2006.01)
(Continued)

(52) U.S. Cl.
CPC ........... *H10K 85/60* (2023.02); *C07F 9/5333* (2013.01); *C07F 9/5728* (2013.01);
(Continued)

(58) Field of Classification Search
None
See application file for complete search history.

(56) References Cited

U.S. PATENT DOCUMENTS 6,420,200 B1 * 7/2002 Yamazaki ........... H01L 27/1214 438/30
9,461,249 B2 10/2016 Vestweber et al.
(Continued)

FOREIGN PATENT DOCUMENTS

JP 2003338377 A 11/2003
KR 20060127138 A 12/2006
(Continued)

OTHER PUBLICATIONS

PCT International Search Report and Written Opinion for PCT Application No. PCT/EP2016/080958 mailed Mar. 1, 2017 (7 pages).

*Primary Examiner* — Jay Yang
(74) *Attorney, Agent, or Firm* — Eversheds Sutherland (US) LLP

(57) ABSTRACT

The invention relates to Organic light emitting diode comprising at least one emission layer, an electron injection layer and at least one cathode electrode, wherein:

the electron injection layer comprises an organic phosphine compound, wherein the electron injection layer is free of a metal, metal salt, metal complex and metal organic compound;

the cathode electrode comprises at least a first cathode electrode layer, wherein the first cathode electrode layer comprises a first zero-valent metal selected from the group comprising alkali metal, alkaline earth metal, rare earth metal and/or a group 3 transition metal; and (Continued)

the electron injection layer is arranged in direct contact to the first cathode electrode layer.

12 Claims, 5 Drawing Sheets

(51) Int. Cl.

| | |
|---|---|
| ***C07F 9/572*** | (2006.01) |
| ***C07F 9/576*** | (2006.01) |
| ***C07F 9/655*** | (2006.01) |
| ***C07F 9/6568*** | (2006.01) |
| ***H10K 50/17*** | (2023.01) |
| ***H10K 85/60*** | (2023.01) |
| *H10K 50/16* | (2023.01) |
| *H10K 59/32* | (2023.01) |
| *H10K 59/80* | (2023.01) |
| *H10K 71/40* | (2023.01) |

(52) U.S. Cl.

CPC ........ *C07F 9/5765* (2013.01); *C07F 9/65517* (2013.01); *C07F 9/65685* (2013.01); *H10K 50/171* (2023.02); *H10K 85/615* (2023.02); *H10K 85/622* (2023.02); *H10K 85/626* (2023.02); *H10K 85/657* (2023.02); *H10K 85/6572* (2023.02); *H10K 85/6574* (2023.02); *H10K 50/16* (2023.02); *H10K 59/32* (2023.02); *H10K 59/8052* (2023.02); *H10K 71/40* (2023.02)

(56) References Cited

U.S. PATENT DOCUMENTS

| | | | | |
|---|---|---|---|---|
| 2004/0140758 | A1* | 7/2004 | Raychaudhuri | ..... H01L 51/5088 313/504 |
| 2004/0197601 | A1 | 10/2004 | Thompson et al. | |
| 2014/0077190 | A1 | 3/2014 | Kim et al. | |
| 2014/0135530 | A1 | 5/2014 | Zhang et al. | |
| 2016/0343950 | A1* | 11/2016 | Kawamura | ....... C07F 9/655354 |

FOREIGN PATENT DOCUMENTS

| | | | |
|---|---|---|---|
| KR | 20070015545 | A | 2/2007 |
| KR | 20090128382 | A | 12/2009 |
| WO | WO-2015/115530 | A1 * | 8/2015 |

* cited by examiner

ELECTRON INJECTION LAYER FOR AN ORGANIC LIGHT-EMITTING DIODE (OLED)

CROSS REFERENCE TO RELATED APPLICATIONS

This application is a U.S. national stage application of PCT/EP2016/080958, filed Dec. 14, 2016, which claims priority to European Application No. 15201418.9, filed Dec. 18, 2015. The content of these applications is hereby incorporated by reference.

The present invention relates to an electron injection layer (EIL) comprising an organic phosphine compound for an organic light-emitting diode (OLED), and a method of manufacturing the organic light-emitting diode (OLED) comprising the electron injection layer (EIL).

DESCRIPTION OF THE RELATED ART

Organic light-emitting diodes (OLEDs), which are self-emitting devices, have a wide viewing angle, excellent contrast, quick response, high brightness, excellent driving voltage characteristics, and color reproduction. A typical OLED includes an anode electrode a hole injection layer (HIL), a hole transport layer (HTL), an emission layer (EML), an electron transport layer (ETL), and a cathode electrode, which are sequentially stacked on a substrate. In this regard, the HIL, the HTL, the EML, and the ETL are thin films formed from organic compounds.

When a voltage is applied to the anode electrode and the cathode electrode, holes injected from the anode electrode move to the EML, via the HIL and HTL, and electrons injected from the cathode electrode move to the EML, via the ETL. The holes and electrons recombine in the EML to generate excitons.

When the excitons drop from an excited state to a ground state, light is emitted. The injection and flow of holes and electrons should be balanced, so that an OLED having the above-described structure has excellent efficiency and/or a long lifetime.

Alkali halides and alkali organic complexes have been used to enhance electron injection from the cathode electrode into the emission layer. Lithium halides and lithium organic complexes have been found to be particularly effective at enhancing electron injection from aluminum cathode electrode. However, the use of lithium halides and lithium organic complexes can be accompanied by health and safety risks, so that it is desirable to avoid the use of these compounds. This affects in particular the two most commonly used compounds in the electron injection layer, LiF and LiQ (lithium 8-hydroxyquinolate).

LiF has the disadvantage of being toxic and LiQ has the disadvantage of being mutagenic.

Thus, it is still desired providing an electron injection layer comprising compounds which pose a reduced health and safety risk by being less or non-toxic and/or carrying a reduced mutagenic risk.

Further, the deposition of metal salts, metal complexes or metal compounds in the manufacture of electron injection layers is time and energy consuming Additionally, the co-deposition of metals and organic compounds to obtain a metal-doped organic layer is difficult to control. Thus, it is still desired providing an electron injection layer that is free of metals, metal salts, metal complexes or metal compounds.

Additionally, it is still desired to provide an electron injection layer that reduces the operating voltage of an OLED.

SUMMARY

One aspect of the present invention is to provide a method of reducing the operating voltage for OLEDs, and/or increasing the external quantum efficiency EQE, for top and/or bottom emission organic light-emitting diodes (OLED). The invention relates to an electron injection layer (EIL) for use in an organic light-emitting diode (OLED).

The invention relates further to an organic light-emitting diode (OLED) comprising an anode electrode a hole injection layer (HIL), a hole transport layer (HTL), optional an electron blocking layer (EBL), an emission layer (EML), optional a hole blocking layer (HBL), optional an electron transport layer (ETL), an electron injection layer (EIL), and a first cathode electrode layer, wherein the layers are arranged in that order as well as a method of manufacturing the same.

According to an aspect of the present invention, there is provided an organic light emitting diode (OLED) comprising at least one emission layer, an electron injection layer and at least one cathode electrode, wherein

- the electron injection layer comprises an organic phosphine compound, wherein the electron injection layer is free of a metal, metal salt, metal complex and metal organic compound;
- the cathode electrode comprises at least a first cathode electrode layer, wherein the first cathode electrode layer comprises a first zero-valent metal selected from the group comprising alkali metal, alkaline earth metal, rare earth metal and/or a group 3 transition metal; and
- the electron injection layer is arranged in direct contact to the first cathode electrode layer.

It has been surprisingly found that an electron injection layer comprising an organic phosphine compound, selected from the group of organic phosphine oxide, organic thioxophosphine compound and/or an organic selenoxophosphine compound, and which is free of a metal, metal salt, metal complex and metal organic compound, allows very low operating voltages and/or high external quantum efficiency EQE to be achieved without deposition of toxic or mutagenic lithium halide or lithium organic complex. Additionally, as only one electron injection layer of organic phosphine compound is deposited, the deposition rate can be controlled easily.

An electron injection layer according to the invention can be rapidly deposited, followed by rapid deposition of the first cathode electrode layer and optional second cathode electrode layer. A significant benefit in terms of TACT time and yield is achieved, as difficult to control co-deposition of matrix compound and dopant are avoided. Further, the organic phosphine compounds of the present invention have been found to be more thermally stable than lithium halides and lithium organic complexes which have traditionally been used, thereby reducing the risk of decomposition in the evaporation source.

Preferred examples of organic phosphine compounds are organic compounds consisting predominantly from covalently bound C, H, O, N, S, P and Se, preferably C, H, O, N and P.

According to a more preferred aspect, the organic phosphine compound is free of metal atoms.

According to a more preferred aspect, the organic phosphine compound comprises a conjugated system of at least six, more preferably at least ten delocalized electrons.

Examples of conjugated systems of delocalized electrons are systems of alternating pi- and sigma bonds. Optionally, one or more two-atom structural units having the pi-bond between its atoms can be replaced by an atom bearing at least one lone electron pair, typically by a divalent atom selected from O, S or Se, or by a trivalent atom selected from N or P. Preferably, the conjugated system of delocalized electrons comprises at least one aromatic or heteroaromatic ring according to the Hückel rule. Also preferably, the organic phosphine compound may comprise at least two aromatic or heteroaromatic rings which are either linked by a covalent bond or condensed.

Preferably, the electron injection layer according to the invention comprises an organic phosphine oxide compound.

In a preferred embodiment, the electron injection layer according to the invention is free of emitter compounds.

The electron injection layer comprises an organic phosphine compound, preferably with a dipole moment >2.5 Debye, thereby reducing the barrier to electron injection from the cathode electrode into the emission layer or electron transport layer, if present.

Preferably, the electron injection layer is free of non-phosphine compounds. In particular it is free of high triplet level aryl compounds, benzimidazole compounds, phenanthroline compounds, ketone compounds, pyrimidine compounds and triazine compounds.

In a preferred embodiment, the electron injection layer may comprise or consists of an organic phosphine compound selected from the group of organic phosphine oxide compound/s, organic thioxophosphine compound/s or organic selenoxophosphine compound/s. Even more preferred, the electron injection layer may consist of an organic phosphine oxide compound.

The electron injection layer comprises an organic compound and is therefore not a cathode electrode.

The first cathode electrode layer does not comprise or consist of an organic compound and therefore is not an electron injection layer.

In a preferred embodiment, the first cathode electrode layer may be free of organic compounds, organic metal complexes and metal halides.

The first cathode electrode layer comprises at least one zero-valent metal selected from the group comprising alkali metal, alkaline earth metal, rare earth metal and/or a group 3 transition metal. These metals may also be described as electropositive metals or metals with a low workfunction. Very low operating voltages and high external quantum efficiency EQE are achieved when the first cathode electrode layer is in direct contact with an electron injection layer comprising an organic phosphine compound. Thereby, the battery life of mobile devices is increased.

According to another aspect of the present invention, there is provided an organic light emitting diode (OLED) comprising at least one emission layer, an electron injection layer and at least one cathode electrode, wherein the electron injection layer comprises an organic phosphine compound, wherein the electron injection layer is free of a metal, metal salt, metal complex and metal organic compound;

the cathode electrode comprises at least a first cathode electrode layer, wherein the first cathode electrode layer comprises a first zero-valent metal selected from the group comprising alkali metal, alkaline earth metal, rare earth metal and/or a group 3 transition metal; and the electron injection layer is arranged in direct contact to the first cathode electrode layer; and wherein the electron injection layer have a thickness of ≥1 nm and ≤10 nm, preferably ≥2 nm to ≤6 nm, preferably of ≥3 nm to ≤5 nm and more preferred of ≥3 nm to ≤4 nm.

According to another aspect there is provided an organic light emitting diode (OLED) wherein:

the organic phosphine compound of the electron injection layer (180) is an organic phosphine compound of Formula Ia:

Formula (Ia)

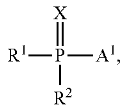

wherein:

X is selected from O, S, Se;

$R^1$ and $R^2$ are independently selected from $C_1$ to $C_{12}$ alkyl, substituted or unsubstituted $C_6$ to $C_{20}$ aryl and substituted or unsubstituted $C_5$ to $C_{20}$ heteroaryl; or $R^1$ and $R^2$ are bridged with an alkene-di-yl group forming with the P atom a substituted or unsubstituted five, six or seven member ring; and $A^1$ is phenyl or selected from Formula (II):

Formula (II)

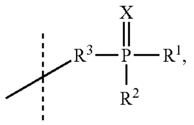

wherein $R^3$ is selected from $C_1$ to $C_8$ alkane-di-yl, substituted or unsubstituted $C_6$ to $C_{20}$ arylene and substituted or unsubstituted $C_5$ to $C_{20}$ heteroarylene; or $A^1$ is selected from Formula (III)

Formula (III)

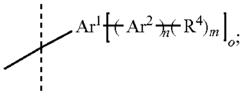

wherein n is selected from 0 or 1;

m is selected from 1 or 2;

is selected from 1 or 2;

and m is 1 if o is 2;

$Ar^1$ is selected from substituted or unsubstituted $C_6$ to $C_{20}$ arylene and substituted or unsubstituted $C_5$ to $C_{20}$ heteroarylene;

$Ar^2$ is selected from substituted or unsubstituted $C_{18}$ to $C_{40}$ arylene and substituted or unsubstituted $C_{10}$ to $C_{40}$ heteroarylene;

$R^4$ is selected from H, $C_1$ to $C_{12}$ alkyl, substituted or unsubstituted $C_6$ to $C_{20}$ aryl and substituted or unsubstituted $C_5$ to $C_{20}$ heteroaryl; wherein the cathode electrode comprises at least a first cathode electrode layer, wherein the first cathode electrode layer comprises a first zero-valent metal selected from the group comprising alkali metal, alkaline earth metal, rare earth metal and/or a group 3 transition metal; and the electron injection layer is arranged in direct contact to the first cathode electrode layer.

According to another aspect there is provided an organic light emitting diode (OLED) wherein:

the organic phosphine compound of the electron injection layer (180) is an organic phosphine compound of Formula Ia:

Formula (Ia)

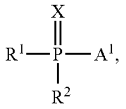

wherein:

X is selected from O, S, Se;

$R^1$ and $R^2$ are independently selected from $C_1$ to $C_{12}$ alkyl, substituted or unsubstituted $C_6$ to $C_{20}$ aryl and substituted or unsubstituted $C_5$ to $C_{20}$ heteroaryl; or $R^1$ and $R^2$ are bridged with an alkene-di-yl group forming with the P atom a substituted or unsubstituted five, six or seven member ring; and $A^1$ is phenyl or selected from Formula (II):

Formula (II)

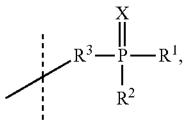

wherein $R^3$ is selected from $C_1$ to $C_8$ alkane-di-yl, substituted or unsubstituted $C_6$ to $C_{20}$ arylene and substituted or unsubstituted $C_5$ to $C_{20}$ heteroarylene; or $A^1$ is selected from Formula (III)

Formula (III)

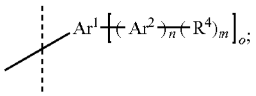

wherein n is selected from 0 or 1;

m is selected from 1 or 2;

is selected from 1 or 2;

and m is 1 if o is 2;

$Ar^1$ is selected from substituted or unsubstituted $C_6$ to $C_{20}$ arylene and substituted or unsubstituted $C_5$ to $C_{20}$ heteroarylene;

$Ar^2$ is selected from substituted or unsubstituted $C_{18}$ to $C_{40}$ arylene and substituted or unsubstituted $C_{10}$ to $C_{40}$ heteroarylene;

$R^4$ is selected from H, $C_1$ to $C_{12}$ alkyl, substituted or unsubstituted $C_6$ to $C_{20}$ aryl and substituted or unsubstituted $C_5$ to $C_{20}$ heteroaryl; wherein the cathode electrode comprises at least a first cathode electrode layer, wherein the first cathode electrode layer comprises a first zero-valent metal selected from the group comprising alkali metal, alkaline earth metal, rare earth metal and/or a group 3 transition metal; and the electron injection layer is arranged in direct contact to the first cathode electrode layer; and wherein the electron injection layer is free of a metal, metal salt, metal complex and metal organic compound.

According to another aspect there is provided an organic light emitting diode (OLED) wherein:

the organic phosphine compound of the electron injection layer (180) is an organic phosphine compound of Formula Ia:

Formula (Ia)

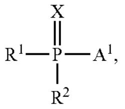

wherein:

X is selected from O, S, Se;

$R^1$ and $R^2$ are independently selected from $C_1$ to $C_{12}$ alkyl, substituted or unsubstituted $C_6$ to $C_{20}$ aryl and substituted or unsubstituted $C_5$ to $C_{20}$ heteroaryl; or $R^1$ and $R^2$ are bridged with an alkene-di-yl group forming with the P atom a substituted or unsubstituted five, six or seven member ring; and $A^1$ is phenyl or selected from Formula (II):

Formula (II)

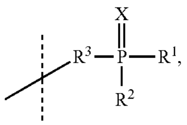

wherein $R^3$ is selected from $C_1$ to $C_8$ alkane-di-yl, substituted or unsubstituted $C_6$ to $C_{20}$ arylene and substituted or unsubstituted $C_5$ to $C_{20}$ heteroarylene; or $A^1$ is selected from Formula (III)

Formula (III)

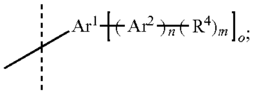

wherein n is selected from 0 or 1;

m is selected from 1 or 2;

is selected from 1 or 2;

and m is 1 if o is 2;

$Ar^1$ is selected from substituted or unsubstituted $C_6$ to $C_{20}$ arylene and substituted or unsubstituted $C_5$ to $C_{20}$ heteroarylene;

$Ar^2$ is selected from substituted or unsubstituted $C_{18}$ to $C_{40}$ arylene and substituted or unsubstituted $C_{10}$ to $C_{40}$ heteroarylene;

$R^4$ is selected from H, $C_1$ to $C_{12}$ alkyl, substituted or unsubstituted $C_6$ to $C_{20}$ aryl and substituted or unsubstituted $C_5$ to $C_{20}$ heteroaryl; wherein the cathode electrode comprises at least a first cathode electrode layer, wherein the first cathode electrode layer comprises a first zero-valent metal selected from the group comprising alkali metal, alkaline earth metal, rare earth metal and/or a group 3 transition metal; wherein the electron injection layer is arranged in direct contact to the first cathode electrode layer; wherein the electron injection layer is free of a metal, metal salt, metal complex and metal organic compound; and wherein the electron injection layer have a thickness of ≥1 nm and ≤10 nm, preferably ≥2 nm to ≤6 nm, preferably of ≥3 nm to ≤5 nm and more preferred of ≥3 nm to ≤4 nm.

According to another aspect there is provided an organic light emitting diode, wherein for:

o=2 the organic phosphine compound of the electron injection layer is a compound having the Formula Ib:

(Ib)

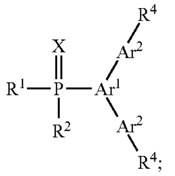

or o=1 the organic phosphine compound of the electron injection layer is a compound having the Formula Ic, Id, Ie or If:

(Ic)

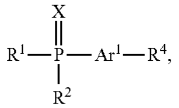

(Id)

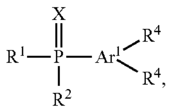

(Ie)

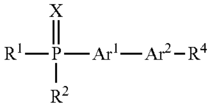

or (If)

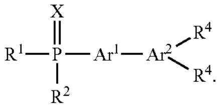

According to another aspect there is provided an organic light emitting diode (OLED) wherein:

the organic phosphine compound of the electron injection layer is selected from the group comprising an organic phosphine compound of Formula Ib:

Formula (Ib)

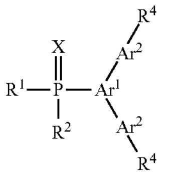

wherein:

X is selected from O, S, Se;

$R^1$ and $R^2$ are independently selected from $C_1$ to $C_{12}$ alkyl, substituted or unsubstituted $C_6$ to $C_{20}$ aryl and substituted or unsubstituted $C_5$ to $C_{20}$ heteroaryl; or $R^1$ and $R^2$ are bridged with an alkene-di-yl group forming with the P atom a substituted or unsubstituted five, six or seven member ring; and $Ar^1$ is selected from substituted or unsubstituted $C_6$ to $C_{20}$ arylene and substituted or unsubstituted $C_5$ to $C_{20}$ heteroarylene;

$Ar^2$ is selected from substituted or unsubstituted $C_{18}$ to $C_{40}$ arylene and substituted or unsubstituted $C_{10}$ to $C_{40}$ heteroarylene;

$R^4$ is selected from H, $C_1$ to $C_{12}$ alkyl, substituted or unsubstituted $C_6$ to $C_{20}$ aryl and substituted or unsubstituted $C_5$ to $C_{20}$ heteroaryl; wherein the cathode electrode comprises at least a first cathode electrode layer, and wherein the first cathode electrode layer comprises a first zero-valent metal selected from the group comprising alkali metal, alkaline earth metal, rare earth metal and/or a group 3 transition metal; and the electron injection layer is arranged in direct contact to the first cathode electrode layer and wherein the electron injection layer is free of a metal, metal salt, metal complex and metal organic compound.

According to another aspect there is provided an organic light emitting diode (OLED) wherein:

the organic phosphine compound of the electron injection layer is selected from the group comprising an organic phosphine compound of Formula Ic and Id:

(Ic)

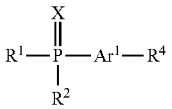

and (Id)

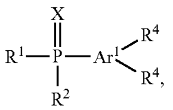

wherein:

X is selected from O, S, Se;

$R^1$ and $R^2$ are independently selected from $C_1$ to $C_{12}$ alkyl, substituted or unsubstituted $C_6$ to $C_{20}$ aryl and substituted or unsubstituted $C_5$ to $C_{20}$ heteroaryl; or $R^1$ and $R^2$ are bridged with an alkene-di-yl group forming with the P atom a substituted or unsubstituted five, six or seven member ring; and $Ar^1$ is selected from substituted or unsubstituted $C_6$ to $C_{20}$ arylene and substituted or unsubstituted $C_5$ to $C_{20}$ heteroarylene;

$R^4$ is selected from H, $C_1$ to $C_{12}$ alkyl, substituted or unsubstituted $C_6$ to $C_{20}$ aryl and substituted or unsubstituted $C_5$ to $C_{20}$ heteroaryl; wherein the cathode electrode comprises at least a first cathode electrode layer, and wherein the first cathode electrode layer comprises a first zero-valent metal selected from the group comprising alkali metal, alkaline earth metal, rare earth metal and/or a group 3 transition metal; and the electron injection layer is arranged in direct contact to the first cathode electrode layer and wherein the electron injection layer is free of a metal, metal salt, metal complex and metal organic compound.

According to another aspect there is provided an organic light emitting diode (OLED) wherein:

the organic phosphine compound of the electron injection layer is selected from the group comprising an organic phosphine compound of Formula Id or If:

(Id)

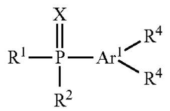

or (If)

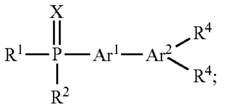

wherein:

X is selected from O, S, Se;

$R^1$ and $R^2$ are independently selected from $C_1$ to $C_{12}$ alkyl, substituted or unsubstituted $C_6$ to $C_{20}$ aryl and substituted or unsubstituted $C_5$ to $C_{20}$ heteroaryl; or $R^1$ and $R^2$ are bridged with an alkene-di-yl group forming with the P atom a substituted or unsubstituted five, six or seven member ring; and $Ar^1$ is selected from substituted or unsubstituted $C_6$ to $C_{20}$ arylene and substituted or unsubstituted $C_5$ to $C_{20}$ heteroarylene;

$Ar^2$ is selected from substituted or unsubstituted $C_{18}$ to $C_{40}$ arylene and substituted or unsubstituted $C_{10}$ to $C_{40}$ heteroarylene;

$R^4$ is selected from H, $C_1$ to $C_{12}$ alkyl, substituted or unsubstituted $C_6$ to $C_{20}$ aryl and substituted or unsubstituted $C_5$ to $C_{20}$ heteroaryl; wherein the cathode electrode comprises at least a first cathode electrode layer, and wherein the first cathode electrode layer comprises a first zero-valent metal selected from the group comprising alkali metal, alkaline earth metal, rare earth metal and/or a group 3 transition metal; and the electron injection layer is arranged in direct contact to the first cathode electrode layer and wherein the electron injection layer is free of a metal, metal salt, metal complex and metal organic compound.

The operating voltage, also named U, is measured in Volt (V) at 10 milliAmpere per square centimetre ($mA/cm^2$) in bottom emission devices and at 15 $mA/cm^2$ in top emission devices.

The external quantum efficiency, also named EQE, is measured in percent (%). The color space is described by coordinates CIE-x and CIE-y (International Commission on Illumination 1931). For blue emission the CIE-y is of particular importance. A smaller CIE-y denotes a deeper blue color.

The highest occupied molecular orbital, also named HOMO, and lowest unoccupied molecular orbital, also named LUMO, are measured in electron volt (eV).

The term "OLED", "organic light emitting diode" and "organic light-emitting diode" are simultaneously used and have the same meaning.

The term "transition metal" means and includes any element in the d-block of the periodic table, which includes groups 3 to 12 elements on the periodic table.

The term "main group metal" means and includes any metal in the main groups of the periodic table.

The term "phosphine compound" or "organic phosphine compound" means and includes compounds selected from the group of organic phosphine oxide compound, organic thioxophosphine compound or organic selenoxophosphine compound.

As used herein, "weight percent", "wt.-%", "percent by weight", "% by weight", and variations thereof refer to a composition, component, substance or agent as the weight of that composition, component, substance or agent of the respective electron transport layer divided by the total weight of the composition thereof and multiplied by 100. It is understood that the total weight percent amount of all components, substances or agents of the respective electron transport layer are selected such that it does not exceed 100 wt.-%.

As used herein, "volume percent", "vol.-%", "percent by volume", "% by volume", and variations thereof refer to an elemental metal, a composition, component, substance or agent as the volume of that elemental metal, component, substance or agent of the respective electron transport layer divided by the total volume of the respective electron transport layer thereof and multiplied by 100. It is understood that the total volume percent amount of all elemental metal, components, substances or agents of the respective cathode electrode layer are selected such that it does not exceed 100 vol.-%.

All numeric values are herein assumed to be modified by the term "about", whether or not explicitly indicated. As used herein, the term "about" refers to variation in the numerical quantity that can occur. Whether or not, modified by the term "about", the claims include equivalents to the quantities.

It should be noted that, as used in this specification and the appended claims, the singular forms "a", "an", and "the" include plural referents unless the content clearly dictates otherwise.

The term "free of", "does not contain", "does not comprise" does not exclude impurities which may be present in the compounds prior to deposition. Impurities have no technical effect with respect to the object achieved by the present invention.

The term "phosphine" as used in the specification and claims comprises compounds according to formula Ia including phosphole and phosphepine.

The term "alkyl" refers to straight-chain branched or cyclic alkyl groups.

The alkyl groups can be selected from the group comprising methyl, ethyl and the isomers of propyl, butyl or pentyl, such as isopropyl, isobutyl, tert.-butyl, sec.-butyl, isopentyl and/or cyclo-hexyl.

The term "alkane-di-yl" as used herein refers to a straight-chain, branched or cyclic alkane-di-yl group. The alkane-di-yl group is a saturated group which is bonded to two phosphorus atoms.

The term "alkene-di-yl" as used herein refers to a group comprising single and double carbon-carbon bonds. Preferably, double bonds and single bonds alternate to form a five, six or seven membered ring with a phosphorus atom.

The term "aryl" refers to aromatic groups. The term "aryl" as used herewith shall encompass phenyl (C6-aryl), fused aromatics, such as naphthalene, anthracene, phenanthrene, tetracene etc. Further encompassed are bi-phenyl and oligo- or polyphenyls, such as terphenyl etc. Further encompassed shall be any further aromatic hydrocarbon substituents, such as fluorenyl etc.

The term "arylene" refers to aromatic groups. The term "arylene" as used herewith shall encompass phenylene (C6-arylene), fused aromatics, such as naphthalene-di-yl, anthracene-di-yl, phenanthrene-di-yl, tetracene-di-yl, binaphthylene-di-yl etc. Further encompassed are bi-phenylene and oligo- or polyphenylenes, such as terphenylene etc. Further encompassed shall be any further aromatic groups, such as fluorine-di-yl etc.

The term "heteroarylene" refers to aromatic heterocycles. The term "heteroarylene" as used herewith shall encompass pyridine-di-yl, quinolone-di-yl, carbazol-di-yl, xanthene-di-yl, phenoxazine-di-yl etc.

Herein, when a first element is referred to as being formed or disposed "on" a second element, the first element can be disposed directly on the second element or one or more other elements may be disposed there between. When a first element is referred to as being formed or disposed "directly on" a second element, no other elements are disposed there between.

The term "contacting sandwiched" refers to an arrangement of three layers whereby the layer in the middle is in direct contact with the two adjacent layers.

The anode electrode and cathode electrode may be described as anode electrode/cathode electrode or anode electrode/cathode electrode or anode electrode layer/cathode electrode layer.

Cathode Electrode

The cathode electrode is formed on the EIL according to the invention. The cathode comprises at least a first cathode electrode layer, and wherein the first cathode electrode layer comprises a first zero-valent metal selected from the group comprising alkali metal, alkaline earth metal, rare earth metal and/or a group 3 transition metal; and the electron injection layer is arranged in direct contact to the first cathode electrode layer and wherein the electron injection layer is free of a metal, metal salt, metal complex and metal organic compound.

According to preferred embodiment the first zero-valent metal can be selected from the group comprising Li, Na, K, Rb, Cs, Mg, Ca, Sr, Ba, Yb, Sm, Eu, Nd, Tb, Gd, Ce, La, Sc and Y, more preferred the first zero-valent metal is selected from the group comprising Li, Na, Mg, Ca, Ba, Yb, and further more preferred the first zero-valent metal is selected from the group comprising Li, Mg, Ba, Yb.

Particularly low operating voltage and high manufacturing yield may be obtained when the first zero-valent metal is selected from this group.

According to another aspect there is provided an organic light emitting diode (OLED) wherein the first cathode electrode layer is free of a metal halide and/or free of a metal organic complex.

According to a preferred embodiment, the first cathode electrode layer comprises or consists of the first zero-valent metal.

According to another aspect there is provided an organic light emitting diode (OLED) wherein the first cathode electrode layer may further comprises a second zero-valent metal, wherein the second zero-valent metal can be selected from a main group metal or a transition metal, wherein the second zero-valent metal is selected different from the first zero-valent metal. Preferably, the second zero-valent metal may be selected from the group comprising Li, Na, K, Cs, Mg, Ca, Sr, Ba, Sc, Y, Ti, V, Cr, Mn, Mn, Fe, Fe, Co, Co, Ni, Cu, Cu, Zn, Ag, Au, Au, Al, Ga, In, Sn, Sn, Te, Bi or Pb; and more preferred the second zero-valent metal may be selected from the group comprising Ag, Au, Zn, Te, Yb, Ga, Bi, Ba, Ca, Al and most preferred the second zero-valent metal may be selected from the group comprising Ag, Zn, Te, Yb, Ga, and/or Bi.

The second zero-valent metal may improve reliability of the deposition process and mechanical stability of the deposited layer and thereby improve manufacturing yield when selected from this list. Additionally, the second zero-valent metal may improve reflectivity of the first cathode electrode layer.

According to a preferred embodiment the first cathode electrode layer can comprises at least about ≥15 vol.-% to about ≤99 vol.-% of the first zero-valent metal and less than about ≥85 vol.-% to about ≤1 vol.-% of the second zero-valent metal; preferably ≥15 vol.-% to about ≤95 vol.-% of the first zero-valent metal and less than about ≥85 vol.-% to about ≤5 vol.-% of the second zero-valent metal; more preferred ≥20 vol.-% to about ≤90 vol.-% of the first zero-valent metal and less than about ≥80 vol.-% to about ≤10 vol.-% of the second zero-valent metal; also preferred ≥15 vol.-% to about ≤80 vol.-% of the first zero-valent metal and less than about ≥85 vol.-% to about ≤20 vol.-% of the second zero-valent metal.

Particularly preferred the first cathode electrode layer comprises at least about ≥20 vol.-% to about ≤85 vol.-% of the first zero-valent metal, selected from Mg and less than about ≥80 vol.-% to about ≤15 vol.-% of the second zero-valent metal selected from Ag.

According to another aspect there is provided an organic light emitting diode (OLED) wherein:

the organic phosphine compound of the electron injection layer (180) is selected from the group comprising an organic phosphine compound of Formula Ia:

Formula (Ia)

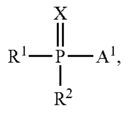

wherein:

X is selected from O, S, Se;

$R^1$ and $R^2$ are independently selected from $C_1$ to $C_{12}$ alkyl, substituted or unsubstituted $C_6$ to $C_{20}$ aryl and substituted or unsubstituted $C_5$ to $C_{20}$ heteroaryl; or $R^1$ and $R^2$ are bridged with an alkene-di-yl group forming with the P atom a substituted or unsubstituted five, six or seven member ring; and $A^1$ is phenyl or selected from Formula (II):

Formula (II)

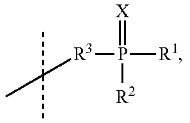

wherein $R^3$ is selected from $C_1$ to $C_8$ alkne-di-yl, substituted or unsubstituted $C_6$ to $C_{20}$ arylene and substituted or unsubstituted $C_5$ to $C_{20}$ heteroarylene; or $A^1$ is selected from Formula (III)

Formula (III)

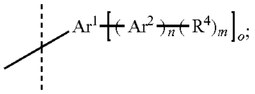

wherein n is selected from 0 or 1;

m is selected from 1 or 2;

is selected from 1 or 2;

and m is 1 if o is 2;

$Ar^1$ is selected from substituted or unsubstituted $C_6$ to $C_{20}$ arylene and substituted or unsubstituted $C_5$ to $C_{20}$ heteroarylene;

$Ar^2$ is selected from substituted or unsubstituted $C_{18}$ to $C_{40}$ arylene and substituted or unsubstituted $C_{10}$ to $C_{40}$ heteroarylene;

$R^4$ is selected from H, $C_1$ to $C_{12}$ alkyl, substituted or unsubstituted $C_6$ to $C_{20}$ aryl and substituted or unsubstituted $C_5$ to $C_{20}$ heteroaryl; wherein the cathode electrode comprises at least a first cathode electrode layer, and wherein the first cathode electrode layer comprises a first zero-valent metal selected from the group comprising alkali metal, alkaline earth metal, rare earth metal and/or a group 3 transition metal, wherein the first cathode electrode layer comprises in addition a second zero-valent metal, wherein the second zero-valent metal is selected from a main group metal or a transition metal, wherein the second zero-valent metal is different from the first zero-valent metal and wherein the first cathode electrode layer is free of a metal halide and/or free of a metal organic complex; and the electron injection layer is arranged in direct contact to the first cathode electrode layer and wherein the electron injection layer is free of a metal, metal salt, metal complex and metal organic compound.

According to another aspect of the present invention, the cathode electrode comprises a first cathode electrode layer and a second cathode electrode layer, wherein the composition of the first cathode electrode layer differs from the composition of the second cathode electrode layer.

According to another aspect there is provided an organic light emitting diode (OLED) wherein:

the organic phosphine compound of the electron injection layer (180) is selected from the group comprising an organic phosphine compound of Formula Ia:

Formula (Ia)

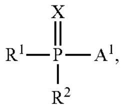

wherein:

X is selected from O, S, Se;

$R^1$ and $R^2$ are independently selected from $C_1$ to $C_{12}$ alkyl, substituted or unsubstituted $C_6$ to $C_{20}$ aryl and substituted or unsubstituted $C_5$ to $C_{20}$ heteroaryl; or $R^1$ and $R^2$ are bridged with an alkene-di-yl group forming with the P atom a substituted or unsubstituted five, six or seven member ring; and $A^1$ is phenyl or selected from Formula (II):

Formula (II)

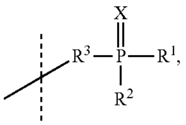

wherein $R^3$ is selected from $C_1$ to $C_8$ alkane-di-yl, substituted or unsubstituted $C_6$ to $C_{20}$ arylene and substituted or unsubstituted $C_5$ to $C_{20}$ heteroarylene; or $A^1$ is selected from Formula (III)

Formula (III)

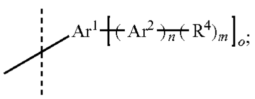

wherein n is selected from 0 or 1;

m is selected from 1 or 2;

is selected from 1 or 2;

and m is 1 if o is 2;

$Ar^1$ is selected from substituted or unsubstituted $C_6$ to $C_{20}$ arylene and substituted or unsubstituted $C_5$ to $C_{20}$ heteroarylene;

$Ar^2$ is selected from substituted or unsubstituted $C_{18}$ to $C_{40}$ arylene and substituted or unsubstituted $C_{10}$ to $C_{40}$ heteroarylene;

$R^4$ is selected from H, $C_1$ to $C_{12}$ alkyl, substituted or unsubstituted $C_6$ to $C_{20}$ aryl and substituted or unsubstituted $C_5$ to $C_{20}$ heteroaryl; wherein the cathode electrode comprises a first cathode electrode layer and a second cathode electrode layer, and wherein the first cathode electrode layer comprises a first zero-valent metal selected from the group comprising alkali metal, alkaline earth metal, rare earth metal and/or a group 3 transition metal, wherein the first cathode electrode layer comprises in addition a second zero-valent metal, wherein the second zero-valent metal is selected from a main group metal or a transition metal, wherein the second zero-valent metal is different from the first zero-valent metal and wherein the first cathode electrode layer is free of a metal halide and/or free of a metal organic complex; wherein the composition of the first cathode electrode layer differs from the composition of the second cathode electrode layer; and the electron injection layer is arranged in direct contact to the first cathode electrode layer and wherein the electron injection layer is free of a metal, metal salt, metal complex and metal organic compound.

The second cathode electrode layer may protect the first cathode electrode layer from the environment. Additionally it may enhance outcoupling of light emission in devices when light is emitted through the cathode electrode.

In another aspect of the present invention, the second cathode electrode layer comprises at least a third metal, in form of a zero-valent metal, alloy and/or as oxide, wherein the third metal is selected from a main group metal, transition metal or rare earth metal, preferably the third metal is selected from zero-valent Ag, Al, Cu and Au, MgAg alloy, indium tin oxide (ITO), indium zinc oxide (IZO), ytterbium oxide ($Yb_2O_3$), indium gallium zinc oxide (IGZO) and more preferred the third metal is selected from zero-valent Ag and Al, and MgAg alloy; and most preferred the third metal is selected from zero-valent Ag and Al.

According to another aspect there is provided an organic light emitting diode (OLED) wherein:

the organic phosphine compound of the electron injection layer (180) is selected from the group comprising an organic phosphine compound of Formula Ia:

Formula (Ia)

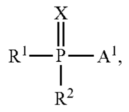

wherein:

X is selected from O, S, Se;

$R^1$ and $R^2$ are independently selected from $C_1$ to $C_{12}$ alkyl, substituted or unsubstituted $C_6$ to $C_{20}$ aryl and substituted or unsubstituted $C_5$ to $C_{20}$ heteroaryl; or $R^1$ and $R^2$ are bridged with an alkene-di-yl group forming with the P atom a substituted or unsubstituted five, six or seven member ring; and $A^1$ is phenyl or selected from Formula (II):

Formula (II)

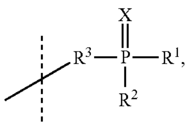

wherein $R^3$ is selected from $C_1$ to $C_8$ alkane-di-yl, substituted or unsubstituted $C_6$ to $C_{20}$ arylene and substituted or unsubstituted $C_5$ to $C_{20}$ heteroarylene; or $A^1$ is selected from Formula (III)

Formula (III)

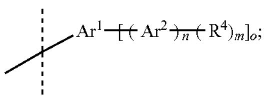

wherein n is selected from 0 or 1;

m is selected from 1 or 2;

is selected from 1 or 2;

and m is 1 if o is 2;

$Ar^1$ is selected from substituted or unsubstituted $C_6$ to $C_{20}$ arylene and substituted or unsubstituted $C_5$ to $C_{20}$ heteroarylene;

$Ar^2$ is selected from substituted or unsubstituted $C_{18}$ to $C_{40}$ arylene and substituted or unsubstituted $C_{10}$ to $C_{40}$ heteroarylene;

$R^4$ is selected from H, $C_1$ to $C_{12}$ alkyl, substituted or unsubstituted $C_6$ to $C_{20}$ aryl and substituted or unsubstituted $C_5$ to $C_{20}$ heteroaryl; wherein the cathode electrode comprises a first cathode electrode layer and a second cathode electrode layer, and wherein the first cathode electrode layer comprises a first zero-valent metal selected from the group comprising alkali metal, alkaline earth metal, rare earth metal and/or a group 3 transition metal, wherein the first cathode electrode layer comprises in addition a second zero-valent metal, wherein the second zero-valent metal is selected from a main group metal or a transition metal, wherein the second zero-valent metal is different from the first zero-valent metal and wherein the first cathode electrode layer is free of a metal halide and/or free of a metal organic complex; wherein the composition of the first cathode electrode layer differs from the composition of the second cathode electrode layer; wherein the second cathode electrode layer comprises at least a third metal, in form of a zero-valent metal, alloy and/or as oxide, wherein the third metal is selected from a main group metal, transition metal or rare earth metal, preferably the third metal is selected from zero-valent Ag, Al, Cu and Au, MgAg alloy, indium tin oxide (ITO), indium zinc oxide (IZO), ytterbium oxide ($Yb_2O_3$), indium gallium zinc oxide (IGZO) and more preferred the third metal is selected from zero-valent Ag and Al, and MgAg alloy; and most preferred the third metal is selected from zero-valent Ag and Al; and the electron injection layer is arranged in direct contact to the first cathode electrode layer and wherein the electron injection layer is free of a metal, metal salt, metal complex and metal organic compound.

According to another aspect there is provided an organic light emitting diode (OLED) wherein:

the organic phosphine compound of the electron injection layer (180) is selected from the group comprising an organic phosphine compound of Formula Ia:

Formula (Ia)

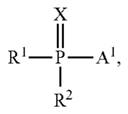

wherein:

X is O;

$R^1$ and $R^2$ are independently selected from $C_1$ to $C_{12}$ alkyl, substituted or unsubstituted $C_6$ to $C_{20}$ aryl or substituted or unsubstituted $C_5$ to $C_{20}$ heteroaryl; or $R^1$ and $R^2$ are bridged with an alkene-di-yl group forming with the P atom a substituted or unsubstituted five, six or seven membered ring; and $A^1$ is phenyl or selected from Formula (II):

Formula (II)

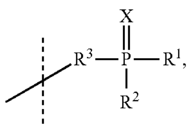

wherein $R^3$ is selected from $C_1$ to $C_8$ alkane-di-yl, substituted or unsubstituted $C_6$ to $C_{20}$ arylene, or substituted or unsubstituted $C_5$ to $C_{20}$ heteroarylene; or $A^1$ is selected from Formula (III)

Formula (III)

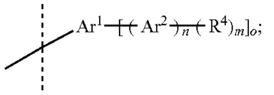

wherein n is selected from 0 or 1;

m is selected from 1 or 2;

is selected from 1 or 2;

and m is 1 if o is 2;

$Ar^1$ is selected from substituted or unsubstituted $C_6$ to $C_{20}$ arylene and substituted or unsubstituted $C_5$ to $C_{20}$ heteroarylene;

$Ar^2$ is selected from substituted or unsubstituted $C_{18}$ to $C_{40}$ arylene and substituted or unsubstituted $C_{10}$ to $C_{40}$ heteroarylene;

$R^4$ is selected from H, $C_1$ to $C_{12}$ alkyl, substituted or unsubstituted $C_6$ to $C_{20}$ aryl and substituted or unsubstituted $C_5$ to $C_{20}$ heteroaryl; wherein the cathode electrode comprises at least a first cathode electrode layer, and wherein the first cathode electrode layer comprises a first zero-valent metal selected from the group comprising alkali metal, alkaline earth metal, rare earth metal and/or a group 3 transition metal, wherein the first cathode electrode layer comprises in addition a second zero-valent metal, wherein the second zero-valent metal is selected from a main group metal or a transition metal, wherein the second zero-valent metal is different from the first zero-valent metal and wherein the first cathode electrode layer is free of a metal halide and/or free of a metal organic complex, and wherein the cathode electrode comprises optionally a second cathode electrode layer; and the electron injection layer is arranged in direct contact to the first cathode electrode layer and wherein the electron injection layer is free of a metal, metal salt, metal complex and metal organic compound.

The thickness of the first cathode electrode layer may be in the range of about 0.2 nm to 100 nm, preferably 1 to 50 nm. If no second cathode electrode layer is present, the thickness of the first cathode electrode layer may be in the range of 1 to 25 nm. If a second cathode electrode layer is present, the thickness of the first cathode electrode layer may be in the range of 0.2 to 5 nm.

The thickness of the second cathode electrode layer may be in the range of 0.5 to 500 nm, preferably 10 to 200 nm, even more preferred 50 to 150 nm.

When the thickness of the cathode electrode is in the range of 5 nm to 50 nm, the cathode electrode may be transparent even if a metal or metal alloy is used.

Electron Injection Layer (EIL)

The EIL according to the invention may be formed on the emission layer or electron transport layer, if present, preferably directly on the emission layer or electron transport layer, if present. Deposition and coating conditions for forming the EIL are similar to those for formation of the HIL, although the deposition and coating conditions may vary, according to a material that is used to form the EIL.

The thickness of the EIL may be in the range of about 1 nm to 10 nm. According to a preferred embodiment the electron injection layer may a thickness of ≥1 nm and ≤10 nm, preferably ≥2 nm to ≤6 nm, preferably of ≥3 nm to ≤5 nm and more preferred of ≥3 nm to ≤4 nm. When the thickness of the EIL is within this range, the EIL according to the invention may have improved electron-injecting properties, especially a substantial decrease in operating voltage and/or increase in external quantum efficiency EQE.

According to another aspect $Ar^1$ and $Ar^2$ of the organic phosphine compound, preferably organic phosphine oxide compound, according to Formula Ia may be defined, wherein $Ar^1$ is selected from substituted $C_6$ to $C_{20}$ arylene, and/or substituted $C_5$ to $C_{20}$ heteroarylene, wherein the $C_6$ to $C_{20}$ arylene, and/or $C_5$ to $C_{20}$ heteroarylene is substituted with at least one $C_1$ to $C_{12}$ alkyl and/or at least one $C_1$ to $C_{12}$ heteroalkyl group; and $Ar^2$ is selected from substituted $C_{18}$ to $C_{40}$ arylene and/or substituted $C_{10}$ to $C_{40}$ heteroarylene, wherein the $C_{18}$ to $C_{40}$ arylene and/or $C_{10}$ to $C_{40}$ heteroarylene is substituted with at least one $C_1$ to $C_{12}$ alkyl and/or at least one $C_1$ to $C_{12}$ heteroalkyl group; or preferably $Ar^1$=substituted $C_6$ to $C_{20}$ arylene and/or substituted $C_5$ to $C_{20}$ heteroarylene, wherein the $C_6$ to $C_{20}$ arylene and/or $C_5$ to $C_{20}$ heteroarylene is substituted with at least one $C_1$ to $C_6$ alkyl and/or $C_1$ to $C_6$ heteroalkyl group; and $Ar^2$=substituted $C_{18}$ to $C_{40}$ arylene and/or substituted $C_{10}$ to $C_{40}$ heteroarylene, wherein the $C_{18}$ to $C_{40}$ arylene and/or $C_{10}$ to $C_{40}$ heteroarylene is substituted with at least one $C_1$ to $C_6$ alkyl and/or $C_1$ to $C_6$ heteroalkyl group; or more preferred $Ar^1$=substituted $C_6$ to $C_{20}$ arylene and/or substituted $C_5$ to $C_{20}$ heteroarylene, wherein the $C_6$ to $C_{20}$ arylene and/or $C_5$ to $C_{20}$ heteroarylene is substituted with at least one $C_1$ to $C_4$ alkyl and/or $C_1$ to $C_4$ heteroalkyl group; and $Ar^2$=substituted $C_{18}$ to $C_{40}$ arylene and/or substituted $C_{10}$ to $C_{40}$ heteroarylene, wherein the $C_{18}$ to $C_{40}$ arylene and/or $C_{10}$ to $C_{40}$ heteroarylene is substituted with at least one $C_1$ to $C_4$ alkyl and/or $C_1$ to $C_4$ heteroalkyl group.

According to another aspect $R^1$ to $R^4$ of the organic phosphine compound, preferably organic phosphine oxide compound, according to Formula Ia may be defined, wherein $R^1$ and $R^2$ are independently selected from substituted $C_6$ to $C_{20}$ aryl, and/or substituted $C_5$ to $C_{20}$ heteroaryl, wherein the $C_6$ to $C_{20}$ aryl, and/or $C_5$ to $C_{20}$ heteroaryl is substituted with at least one $C_1$ to $C_{12}$ alkyl and/or at least one $C_1$ to $C_{12}$ heteroalkyl group, and preferably $R^1$ and $R^2$ is selected the same; and/or $R^3$ is independently selected from substituted $C_6$ to $C_{20}$ arylene, and/or substituted $C_5$ to $C_{20}$ heteroarylene, wherein the $C_6$ to $C_{20}$ arylene, and/or $C_5$ to $C_{20}$ heteroarylene is substituted with at least one $C_1$ to $C_{12}$ alkyl and/or at least one $C_1$ to $C_{12}$ heteroalkyl group, and/or $R^4$ is independently selected from substituted $C_6$ to $C_{20}$ aryl, and/or substituted $C_5$ to $C_{20}$ heteroaryl, wherein the $C_6$ to $C_{20}$ aryl, and/or $C_5$ to $C_{20}$ heteroaryl is substituted with at least one $C_1$ to $C_{12}$ alkyl and/or at least one $C_1$ to $C_{12}$ heteroalkyl group.

According to another aspect $R^1$ to $R^4$, X, n, m, $Ar^1$ and $Ar^2$ of the organic phosphine compound, preferably organic phosphine oxide compound, according to Formula Ia may be defined, wherein $R^1$ and $R^2$ is independently selected from $C_1$ to $C_4$ alkyl, unsubstituted or substituted $C_6$ to $C_{10}$ aryl or unsubstituted or substituted $C_5$ to $C_{10}$ heteroaryl; preferably $R^1$ and $R^2$ is independently selected from methyl, phenyl, naphthyl, phenanthryl, pyrenyl or pyridyl; further preferred $R^1$ and $R^2$ are independently selected from methyl, phenyl and pyridyl; and more preferred $R^1$ and $R^2$ is selected the same; and/or X is O or S, and preferably O; and/or $R^3$ is selected from $C_1$ to $C_6$ alkane-di-yl, unsubstituted or substituted $C_6$ to $C_{10}$ arylene or unsubstituted or substituted $C_5$ to $C_{10}$ heteroarylene, and preferably selected from $C_1$ to $C_4$ alkane-di-yl; and/or $R^4$ is selected from H, phenyl, biphenyl, terphenyl, fluorenyl, naphthyl, anthranyl, phenanthryl, pyrenyl, carbazoyl, dibenzofuranyl, dinapthofuranyl, preferably H, phenyl, biphenyl or naphthyl, and more preferred H; and/or n is 0 or 1, and preferably n is 1, preferably for n=2 than $Ar^1$ is phenyl, and more preferred for n=1, $R^1$ and $R^2$ are phenyl and $R^4$ is H;

m is 1 or 2 if n is 0 or 1, and m is 2 if n is 2; and/or $Ar^1$ is preferably selected from phenylene, biphenylene, terphenylene, naphthylene, fluorenylene, pyridylene, quinolinylene, and pyrimidinylene; and/or $Ar^2$ is selected from fluorenylene, anthranylene, pyrenylene, phenanthrylene, carbazoylene, benzo[c]acridinylene, dibenzo[c,h]acridinylene, dibenzo[a, j]acridinylene.

According to another aspect $R^1$ to $R^4$, $Ar^1$ and $Ar^2$ of the organic phosphine compound, preferably organic phosphine oxide compound, according to Formula Ia may be defined, wherein $R^1$, $R^2$, $R^3$, $R^4$, $Ar^1$ and/or $Ar^2$ are unsubstituted.

According to another aspect $R^1$ and $R^2$ of the organic phosphine compound, preferably organic phosphine oxide compound, according to Formula Ia may be independently selected from $C_1$ to $C_{12}$ alkyl, preferably $C_1$ to $C_8$, even more preferred $C_1$ to $C_6$, and may be most preferred $C_1$ to $C_4$.

According to another aspect $R^4$ of the organic phosphine compound, preferably organic phosphine oxide compound, according to Formula Ia may be selected from $C_1$ to $C_{12}$ alkyl, preferably $C_1$ to $C_8$, even more preferred $C_1$ to $C_6$, most preferred $C_1$ to $C_4$.

According to another aspect $Ar^2$ of the organic phosphine compound, preferably organic phosphine oxide compound, according to Formula Ia may be defined, wherein $Ar^2$ is selected from a compound according to Formula IVa to IVh:

(IVa)

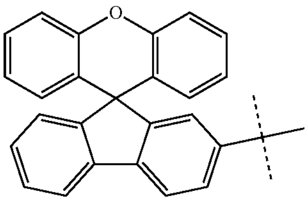

,

-continued (IVb)

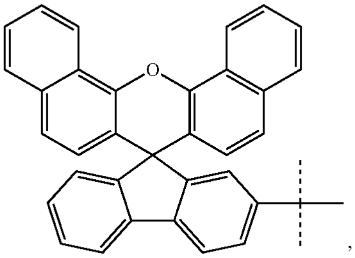

, (IVc)

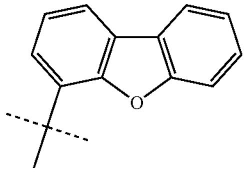

, (IVd)

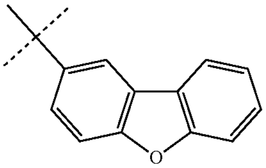

, (IVe)

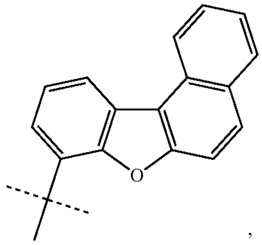

, (IVf)

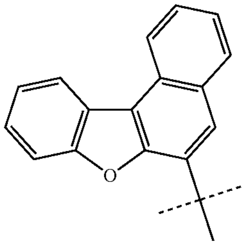

, (IVg)

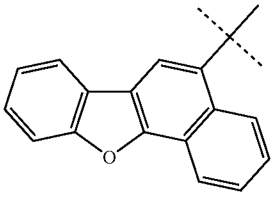

, (IVh)

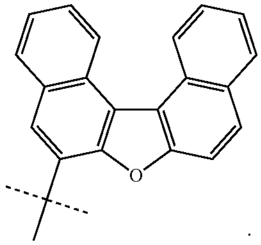

.

According to another aspect, the electron injection layer comprises an organic phosphine compound of Formula (Ia) and $A^1$ is selected from Formula (II). Preferably, $R^3$ is selected from $C_1$ to $C_6$ alkane-di-yl, unsubstituted or substituted $C_6$ to $C_{10}$ arylene or unsubstituted or substituted $C_5$ to $C_{10}$ heteroarylene, and preferably selected from $C_1$ to $C_4$ alkane-di-yl. Preferred examples are shown in Table 1 below. These compounds have been found to have particularly beneficial effect on operating voltage.

TABLE 1

| Phosphine oxide compounds of Formula (Ia) wherein A1 is Formula (II) | |
|---|---|
| Name | Structure |
| ethane-1,2-diylbis(diphenylphosphine oxide) | 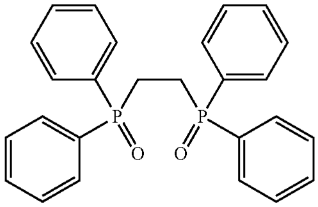 [SMILES: O=P(CCP(=O)(c1ccccc1)c1ccccc1)(c1ccccc1)c1ccccc1] |
| butane-1,4-diylbis(diphenylphosphine oxide) | 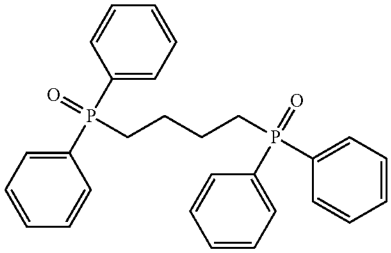 [SMILES: O=P(CCCCP(=O)(c1ccccc1)c1ccccc1)(c1ccccc1)c1ccccc1] |
| ethane-1,2-diylbis(di(naphthalen-2-yl)phosphine oxide) | 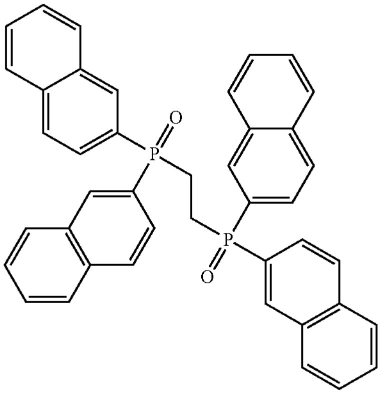 [SMILES: O=P(CCP(=O)(c1ccc2ccccc2c1)c1ccc2ccccc2c1)(c1ccc2ccccc2c1)c1ccc2ccccc2c1] |
| (9-phenyl-9H-carbazole-2,7-diyl)bis(diphenylphosphine oxide | 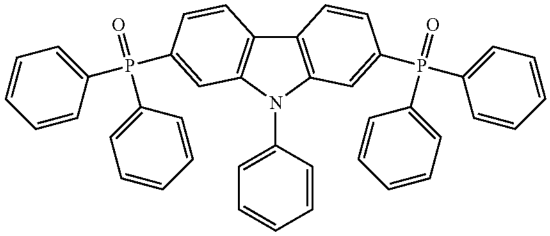 [SMILES: O=P(c1ccccc1)(c1ccccc1)c1ccc2c3ccc(P(=O)(c4ccccc4)c4ccccc4)cc3n(-c3ccccc3)c2c1] |

TABLE 1-continued

| Phosphine oxide compounds of Formula (Ia) wherein A1 is Formula (II) | |
|---|---|
| Name | Structure |
| [1,1':4',1''-terphenyl]-3,5-diylbis(diphenylphosphine oxide) | 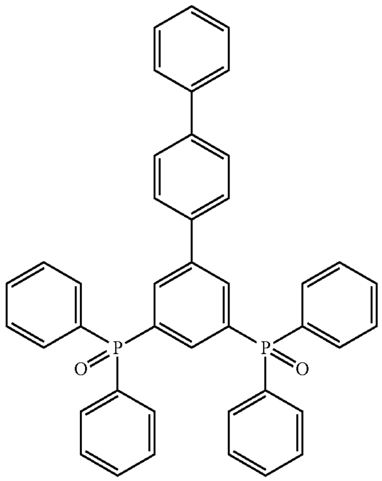 [SMILES: O=P(c1ccccc1)(c1ccccc1)c1cc(-c2ccc(-c3ccccc3)cc2)cc(P(=O)(c2ccccc2)c2ccccc2)c1] |
| [1,1'-binaphthalene]-2,2'-diylbis(diphenylphosphine oxide) | 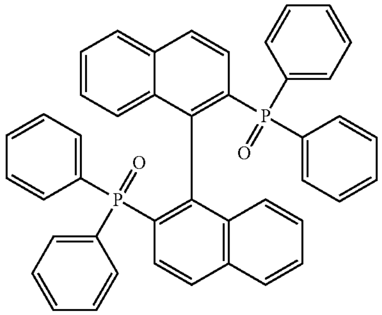 [SMILES: O=P(c1ccccc1)(c1ccccc1)c1ccc2ccccc2c1-c1c(P(=O)(c2ccccc2)c2ccccc2)ccc2ccccc12] |

According to another aspect, the electron injection layer comprises an organic phosphine compound of Formula (Ia) and $A^1$ is selected from Formula (III). Preferably, o is 1 and n is 0 or 1 and m is 1 or 2. The molecular weight of these compounds is in a range which is particularly suitable for vacuum deposition and particularly low operating voltages are achieved. Particularly preferred examples are shown in Table 2 below.

TABLE 2

| Phosphine oxide compounds of Formula (Ia) wherein A1 is Formula (III) | |
|---|---|
| Name | Structure |
| (4-(anthracen-9-yl)phenyl)diphenylphosphine oxide | 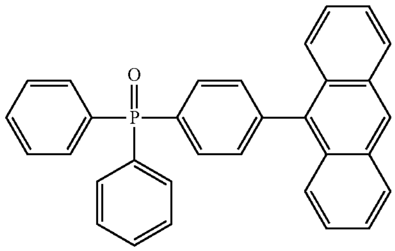 [SMILES: O=P(c1ccccc1)(c1ccccc1)c1ccc(-c2c3ccccc3cc3ccccc23)cc1] |

TABLE 2-continued

| Phosphine oxide compounds of Formula (Ia) wherein A1 is Formula (III) | |
|---|---|
| Name | Structure |
| 3-(phenanthren-9-yl)phenyl)diphenylphosphine oxide | 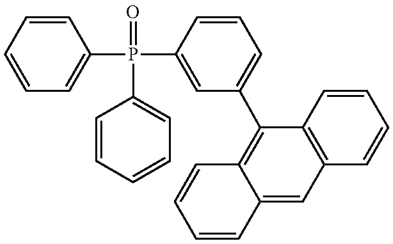 [SMILES: O=P(c1ccccc1)(c1ccccc1)c1cccc(-c2c3ccccc3cc3ccccc23)c1] |
| (4-(phenanthren-9-yl)phenyl)diphenylphosphine oxide | 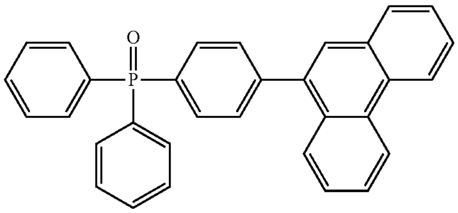 [SMILES: O=P(c1ccccc1)(c1ccccc1)c1ccc(-c2cc3ccccc3c3ccccc23)cc1] |
| (3-(phenanthren-9-yl)phenyl)diphenylphosphine oxide | 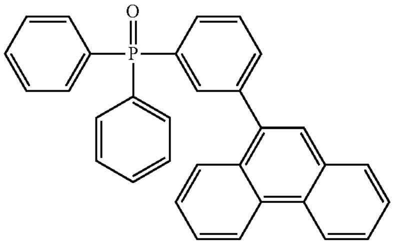 [SMILES: O=P(c1ccccc1)(c1ccccc1)c1cccc(-c2cc3ccccc3c3ccccc23)c1] |
| diphenyl(3-pyren-1-yl)phenyl)phosphine oxide | 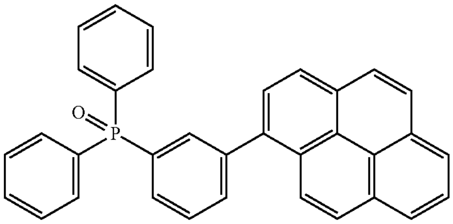 [SMILES: O=P(c1ccccc1)(c1ccccc1)c1cccc(-c2ccc3ccc4cccc5ccc2c3c45)c1] |
| diphenyl(4'-(pyren-1-yl)-[1,1'-biphenyl]-3-yl)phosphine oxide | 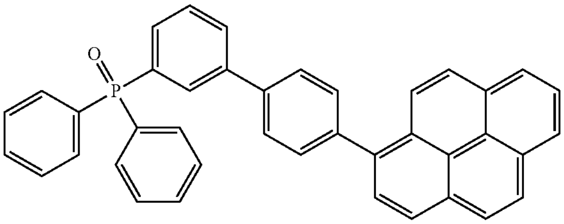 [SMILES: O=P(c1ccccc1)(c1ccccc1)c1cccc(-c2ccc(-c3ccc4ccc5cccc6ccc3c4c56)cc2)c1] |
| diphenyl(3'-(pyren-1-yl)-[1,1'-biphenyl]-3-yl)phosphine oxide | 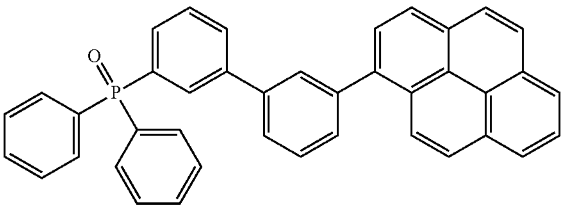 [SMILES: O=P(c1ccccc1)(c1ccccc1)c1cccc(-c2cccc(-c3ccc4ccc5cccc6ccc3c4c56)c2)c1] |

TABLE 2-continued

| Phosphine oxide compounds of Formula (Ia) wherein A1 is Formula (III) | |
|---|---|
| Name | Structure |
| diphenyl(3'-(pyren-1-yl)-[1,1'-biphenyl]-4-yl)phosphine oxide | 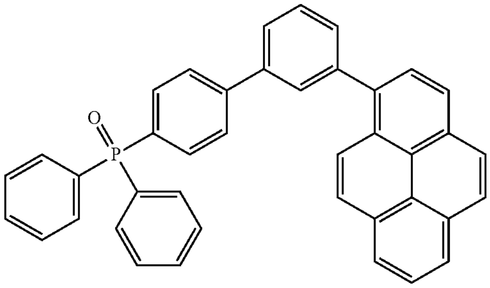 [SMILES: O=P(c1ccccc1)(c1ccccc1)c1ccc(-c2cccc(-c3ccc4ccc5cccc6ccc3c4c56)c2)cc1] |
| diphenyl(3''-(pyren-1-yl)-[1,1':4',1''-terphenyl]-3-yl)phosphine oxxide | 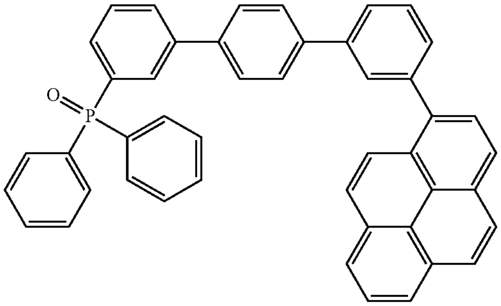 [SMILES: O=P(c1ccccc1)(c1ccccc1)c1cccc(-c2ccc(-c3cccc(-c4ccc5ccc6cccc7ccc4c5c67)c3)cc2)c1] |
| (3-(dinaphtho[2,1-b:1',2'-d]furan-6-yl)phenyl)diphenylphosphine oxide | 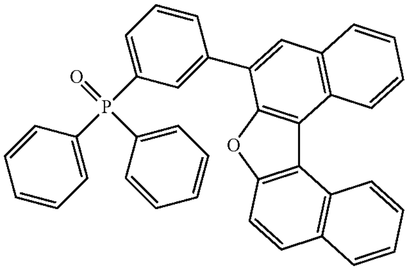 [SMILES: O=P(c1ccccc1)(c1ccccc1)c1cccc(-c2cc3ccccc3c3c2oc2ccc4ccccc4c23)c1] |
| diphenyl(4-(9-phenyl-9H-carbazol-3-yl)phenyl)phosphine oxide | 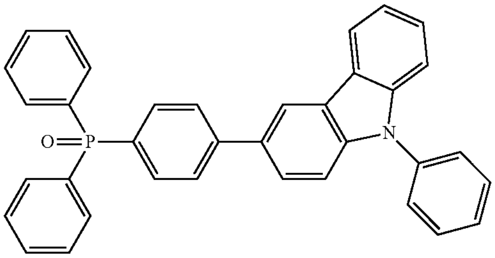 [SMILES: O=P(c1ccccc1)(c1ccccc1)c1ccc(-c2ccc3c(c2)c2ccccc2n3-c2ccccc2)cc1] |
| (3',5'-di(pyren-1-yl)-[1,1'-biphenyl]-3-yl)diphenylphosphine oxide | 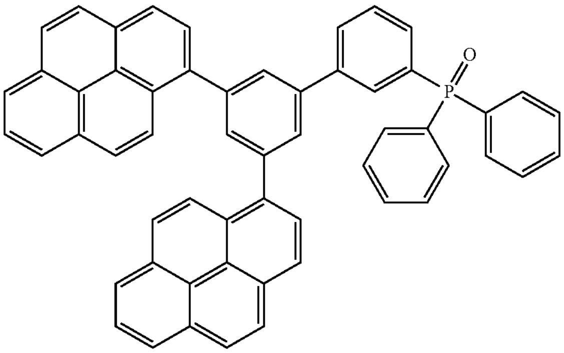 [SMILES: O=P(c1ccccc1)(c1ccccc1)c1cccc(-c2cc(-c3ccc4ccc5cccc6ccc3c4c56)cc(-c3ccc4ccc5cccc6ccc3c4c56)c2)c1] |

In another preferred embodiment, o is 2 and n is 0 or 1 and m is 1. The crystallinity of these compounds is reduced and low operating voltages are achieved. Particularly preferred examples are shown in Table 2 above.

In another aspect, the electron injection layer comprises a phosphine oxide compound of Formula (Ia), wherein $A^1$ is phenyl and $R^1$ and $R^2$ are bridged with an alkene-di-yl group forming with the P atom a five and seven membered ring. High glass transition temperature Tg and particularly low operating voltage is achieved. Particularly preferred compounds are shown in Table 3.

TABLE 3

Phosphine oxide compounds of Formula (Ia), wherein $R^1$ and $R^2$ are bridged with an alkene-di-yl group forming with the P atom a five and seven membered ring

| Name | Structure |
|---|---|
| 3-Phenyl-3H-benzo[b] dinaphtho[2,1-d:1',2'-f] phosphepine-3-oxide | 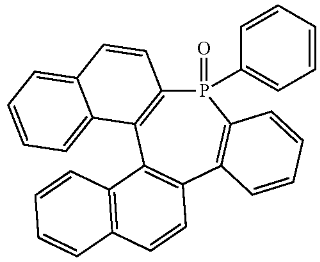 [SMILES: O=P1(c2ccccc2)c2ccccc2-c2ccc3ccccc3c2-c2c1ccc1ccccc21] |
| 1,2,3,4,5-pentaphenylphosphole 1-oxide | 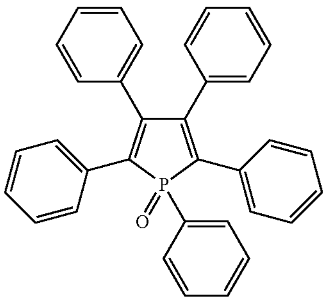 [SMILES: O=P1(c2ccccc2)C(c2ccccc2)=C(c2ccccc2)C(c2ccccc2)=C1c1ccccc1] |
| 5-phenylbenzo[b]phosphindole 5-oxide | 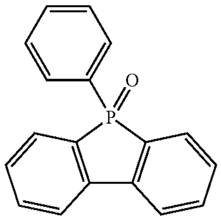 [SMILES: O=P1(c2ccccc2)c2ccccc2-c2ccccc21] |

According to another aspect the organic phosphine oxide compound according to the invention may be selected from a compound according to:

- Formula Va to Vai:

(Va)

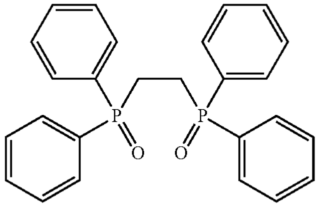

,

-continued (Vb)

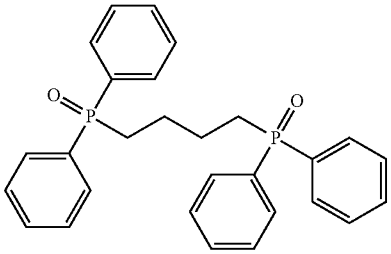

, (Vc)

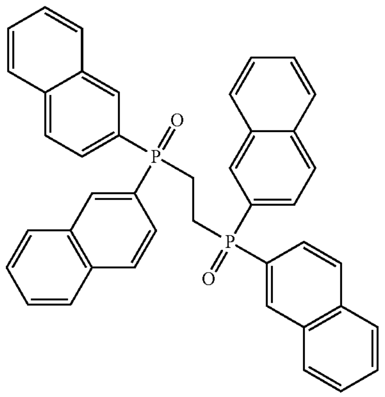

, (Vd)

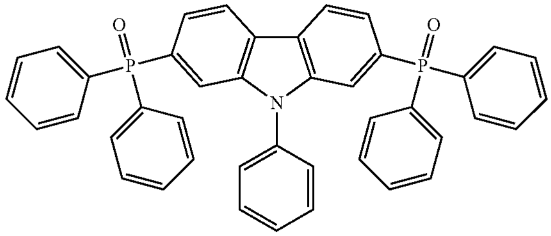

, (Ve)

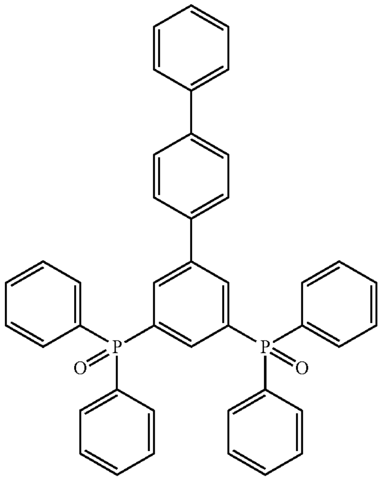

, or

-continued
- Formula Vf to Vq:
(Vf)
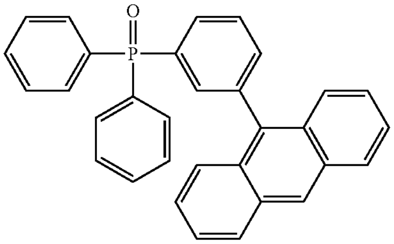,
(Vg)
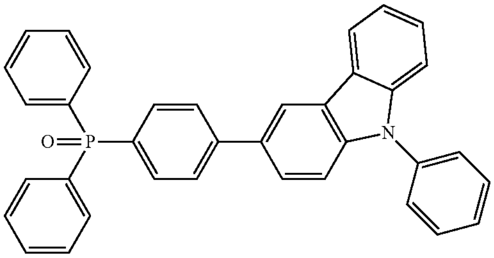,
(Vh)
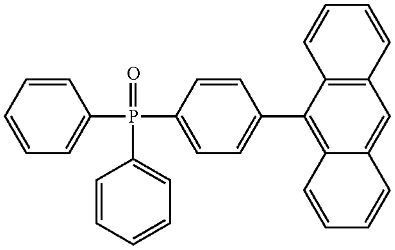,
(Vi)
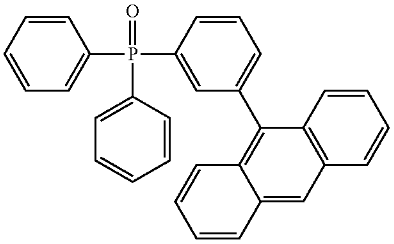,
(Vj)
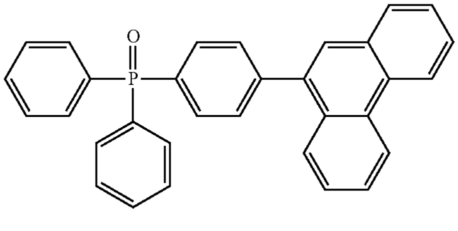,
(Vk)
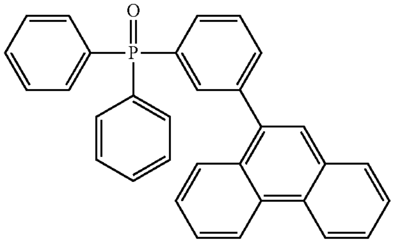,
-continued
(Vl)
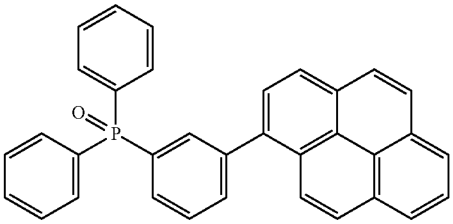,
(Vm)
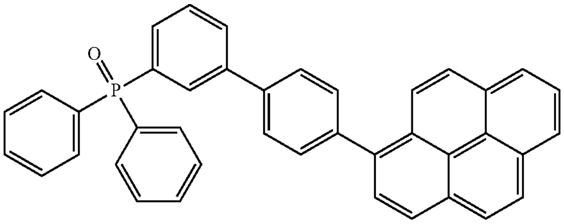,
(Vn)
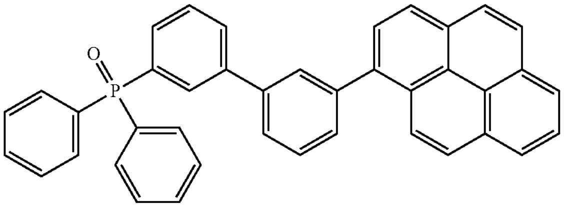,
(Vo)
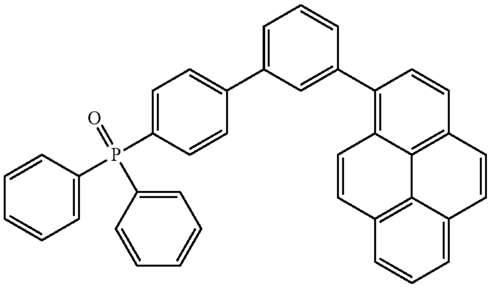,
(Vp)
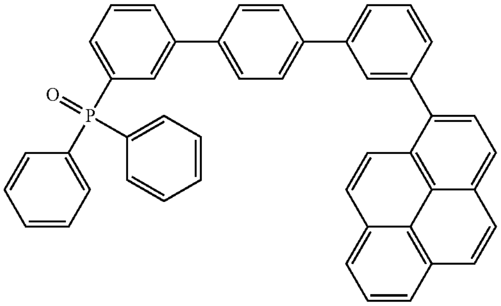,
(Vq)
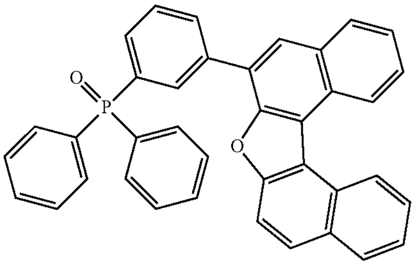, or -continued
- Formula Vr to Vt:
(Vr)
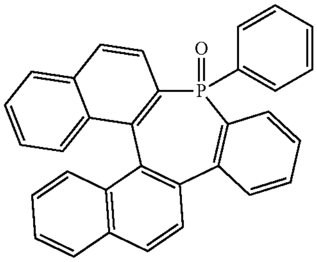
,
(Vs)
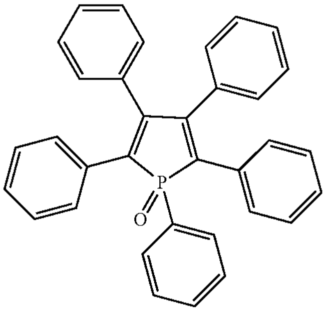
,
(Vt)
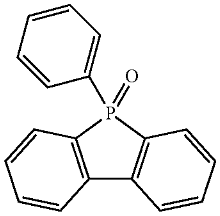
,
- Formula Vu to Vai:
(Vu)
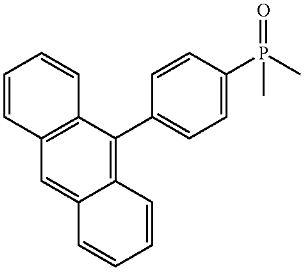
,
(Vv)
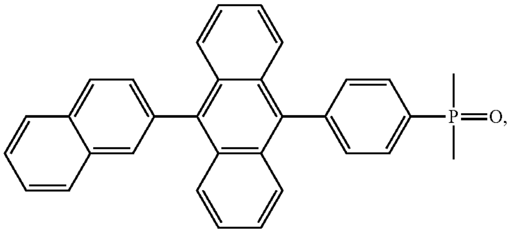
-continued
(Vw)
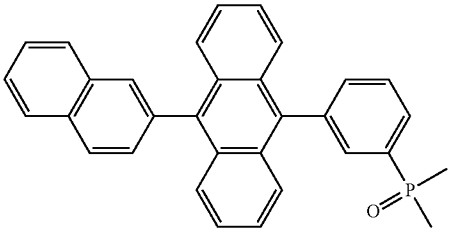
,
(Vx)
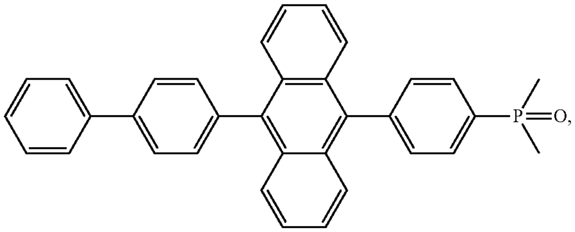
(Vy)
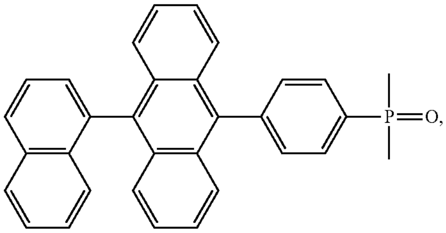
(Vz)
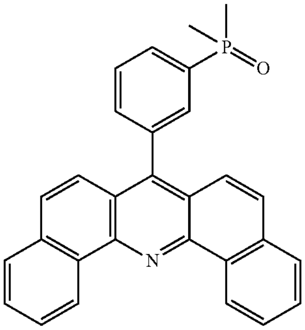
,
(Vaa)
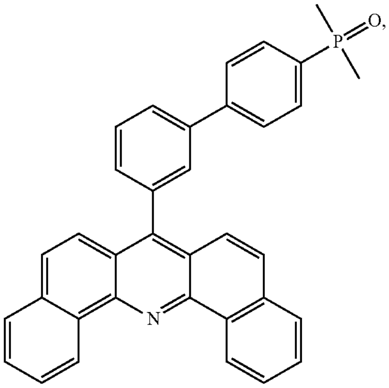

-continued (Vab)

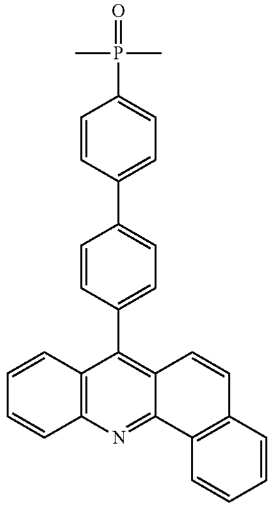
, (Vac)

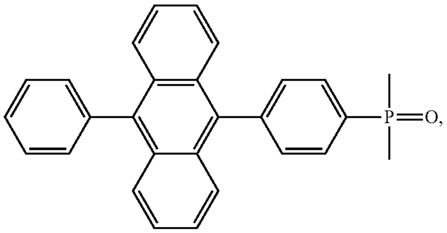

(Vad)

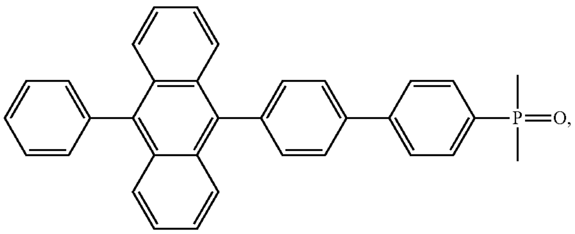

(Vae)

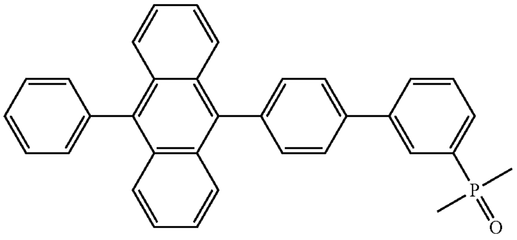
, (Vaf)

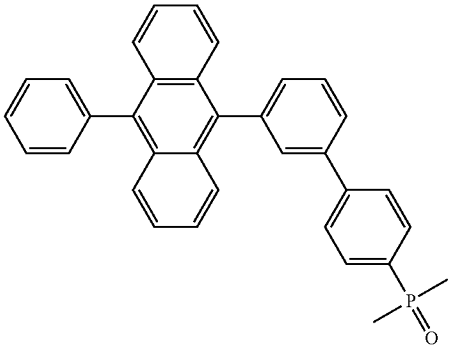
,

-continued (Vag)

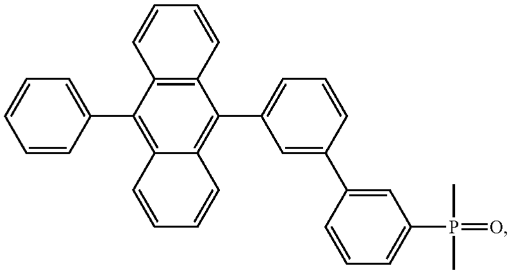

(Vah)

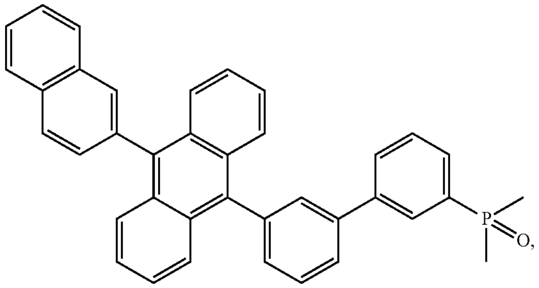

(Vai)

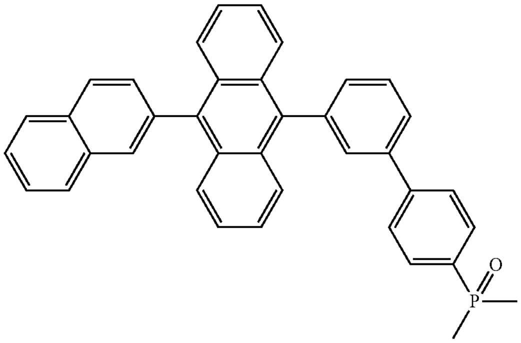
.

Electron Transport Layer (ETL)

The OLED according to the present invention may not contain an electron transport layer (ETL). However, the OLED according to the present invention may optional contain an electron transport layer (ETL).

The electron transport layer is arranged between the emission layer and the electron injection layer according to the invention. The electron transport layer facilitates electron transport from the electron injection layer according to invention into the emission layer. Preferably, the electron transport layer is contacting sandwiched between the emission layer and the electron injection layer according to the invention. In another preferred embodiment, the electron transport layer is contacting sandwiched between the hole blocking layer and the electron injection layer according to the invention.

Preferably, the electron transport layer is free of emitter dopants. In another preferred aspect, the electron transport layer is free of metal, metal halide, metal salt and/or lithium organic metal complex.

According to various embodiments the OLED may comprises an electron transport layer or an electron transport layer stack comprising at least a first electron transport layer and at least a second electron transport layer.

According to various embodiments of the OLED of the present invention the electron transport layer may comprises at least one matrix compound. Preferably, the at least one matrix compound is a substantially covalent matrix compound. Further preferred, the matrix compound of the electron transport layer is an organic matrix compound.

It is to be understood that "substantially covalent" means compounds comprising elements bound together mostly by covalent bonds. Substantially covalent matrix material consists of at least one substantially covalent compound. Substantially covalent materials can comprise low molecular weight compounds which may be, preferably, stable enough to be processable by vacuum thermal evaporation (VTE). Alternatively, substantially covalent materials can comprise polymeric compounds, preferably, compounds soluble in a solvent and thus processable in form of a solution. It is to be understood that a polymeric substantially covalent material may be crosslinked to form an infinite irregular network, however, it is supposed that such crosslinked polymeric substantially covalent matrix compounds still comprise both skeletal as well as peripheral atoms. Skeletal atoms of the substantially covalent compound are covalently bound to at least two neighboring atoms.

A compound comprising cations and anions is considered as substantially covalent, if at least the cation or at least the anion comprises at least nine covalently bound atoms.

Preferred examples of substantially covalent matrix compounds are organic matrix compounds consisting predominantly from covalently bound C, H, O, N, S, which may optionally comprise also covalently bound B, P, As, Se. Organometallic compounds comprising covalent bonds carbon-metal, metal complexes comprising organic ligands and metal salts of organic acids are further examples of organic compounds that may serve as organic matrix compounds.

According to a more preferred aspect, the organic matrix compound lacks metal atoms and majority of its skeletal atoms is selected from C, O, S, N According to a more preferred aspect, the substantially covalent matrix compound comprises a conjugated system of at least six, more preferably at least ten, even more preferably at least fourteen delocalized electrons.

Examples of conjugated systems of delocalized electrons are systems of alternating pi- and sigma bonds. Optionally, one or more two-atom structural units having the pi-bond between its atoms can be replaced by an atom bearing at least one lone electron pair, typically by a divalent atom selected from O, S, Se, Te or by a trivalent atom selected from N, P, As, Sb, Bi. Preferably, the conjugated system of delocalized electrons comprises at least one aromatic or heteroaromatic ring according to the Hückel rule. Also preferably, the substantially covalent matrix compound may comprise at least two aromatic or heteroaromatic rings which are either linked by a covalent bond or condensed.

Preferably the electron transport layer comprises a first matrix compound, more preferred a first organic matrix compound.

According to a more preferred aspect the first organic matrix compound can be an organic matrix compound and selected from the group comprising benzo[k]fluoranthene, pyrene, anthracene, fluorene, spiro(bifluorene), phenanthrene, perylene, triptycene, spiro[fluorene-9,9'-xanthene], coronene, triphenylene, xanthene, benzofurane, dibenzofurane, dinaphthofurane, acridine, benzo[c]acridine, dibenzo[c,h]acridine, dibenzo[a, j]acridine, triazine, pyridine, pyrimidine, carbazole, phenyltriazole, benzimidazole, phenanthroline, oxadiazole, benzooxazole, oxazole, quinazoline, benzo[h]quinazoline, pyrido[3,2-h]quinazoline, pyrimido[4,5-f]quinazoline, quinoline, benzoquinoline, pyrrolo[2,1-a]isoquinonlin, benzofuro [2,3-d]pyridazine, thienopyrimidine, dithienothiophene, benzothienopyrimidine, benzothienopyrimidine, phosphine oxide, phosphole, triaryl borane, 2-(benzo[d]oxazol-2-yl)phenoxy metal complex, 2-(benzo[d]thiazol-2-yl)phenoxy metal complex or mixtures thereof.

According to a more preferred aspect there is provided an organic light emitting diode (OLED) wherein the organic light emitting diode comprises at least one electron transport layer comprising at least one organic matrix compound, wherein the electron injection layer is contacting sandwiched between the first cathode electrode layer and the electron transport layer. The electron transport layer may comprises a first organic matrix compound with a dipole moment of about ≥0 Debye and about ≤2.5 Debye, preferably ≥0 Debye and <2.3 Debye, more preferably ≥0 Debye and ≤2 Debye.

According to a more preferred aspect there is provided an organic light emitting diode (OLED) wherein the organic light emitting diode comprising at least two electron transport layer of a first electron transport layer and a second electron transport layer. The first electron transport layer may comprises a first organic matrix compound and the second electron transport layer may comprises a second organic matrix compound, wherein the first organic matrix compound of the first electron transport layer may differs from the second organic matrix compound of the second electron transport layer.

According to a more preferred aspect the second organic matrix compound in the second electron transport layer and compound in the electron injection layer is selected the same. The first electron transport layer comprises a different matrix compound.

The electron transport layer/s, the electron injection layer/s and cathode electrode layer/s may differ each in their composition.

According to a more preferred aspect the electron injection layer can be contacting sandwiched between the first cathode electrode layer and the first electron transport layer. The first organic matrix compound of the first electron transport layer and the second organic matrix compound of the second electron transport layer having a dipole moment of about ≥0 Debye and about ≤2.5 Debye, preferably ≥0 Debye and ≤2.3 Debye, more preferably ≥0 Debye and <2 Debye. However, the first organic matrix compound of the first electron transport layer and the second organic matrix compound of the second electron transport layer are select such, that they differ in their dipole moment.

According to an embodiment, the dipole moment of the first organic matrix compound may be selected ≥0 Debye and ≤2.5 Debye, the first organic matrix compound can also be described as non-polar matrix compound.

The dipole moment $|\vec{\mu}|$ of a molecule containing N atoms is given by:

$$\vec{\mu} = \sum_{i}^{N} q_i \vec{r_i}$$

$$|\vec{\mu}| = \sqrt{\mu_x^2 + \mu_y^2 + \mu_z^2}$$

where $q_i$ and $\vec{r_i}$ are the partial charge and position of atom i in the molecule. The dipole moment is determined by a semi-empirical molecular orbital method. The values in Table 5 were calculated using the method as described below. The partial charges and atomic positions are obtained using either the DFT functional of Becke and Perdew BP with a def-SV(P) basis or the hybrid functional B3LYP with a def2-TZVP basis set as implemented in the program package TURBOMOLE V6.5. If more than one conformation is viable, the conformation with the lowest total energy is selected to determine the dipole moment.

For example, the first organic matrix compound may have a dipole moment between 0 and 2.5 Debye, the first organic matrix compound may contain a center of inversion I, a horizontal mirror plane, more than one $C_n$ axis (n>1), and/or n $C_2$ perpendicular to $C_n$.

If the first organic matrix compound has a dipole moment between 0 and 2.5 Debye, the first organic matrix compound may contain an anthracene group, a pyrene group, a perylene group, a coronene group, a benzo[k]fluoranthene group, a fluorene group, a xanthene group, a dibenzo[c,h]acridine group, a dibenzo[a,j]acridine group, a benzo[c]acridine group, a triaryl borane group, a dithienothiophene group, a triazine group or a benzothienopyrimidine group.

If the first organic matrix compounds has a dipole moment of about ≥0 Debye and about ≤2.5 Debye, the first organic matrix compound may be free of an imidazole group, a phenanthroline group, a phosphine oxide group, an oxazole group, an oxadiazole group, a triazole group, a pyrimidine group, a quinazoline group, a benzo[h]quinazoline group or a pyrido[3,2-h]quinazoline group.

In a preferred embodiment, the first organic matrix compound is selected from the following compounds or derivatives thereof, the compounds being anthracene, pyrene, coronene, triphenylene, fluorene, spiro-fluorene, xanthene, carbazole, dibenzo[c,h]acridine, dibenzo[a,j]acridine, benzo[c]acridine, triaryl borane compounds, 2-(benzo[d]oxazol-2-yl)phenoxy metal complex; 2-(benzo[k]thiazol-2-yl)phenoxy metal complex, triazine, benzothienopyrimidine, dithienothiophene, benzo[k]fluoranthene, perylene or mixtures thereof.

It may be further preferred that the first organic matrix compound comprises a triaryl borane compound of formula (1)

(1)

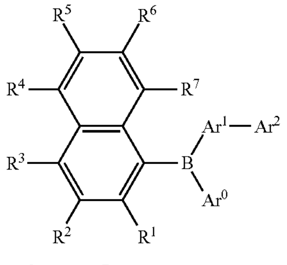

wherein $R^1$, $R^3$ and $R^7$ are independently selected from a group consisting of H, D, $C_1$-$C_{16}$ alkyl and $C_1$-$C_{16}$ alkoxy;

$R^2$, $R^4$, $R^5$ and $R^6$ are independently selected from a group consisting of H, D, $C_1$-$C_{16}$ alkyl, $C_1$-$C_{16}$ alkoxy and $C_6$-$C_{20}$ aryl;

$Ar^0$ is selected from substituted or unsubstituted $C_6$-$C_{20}$ aryl, wherein, in case that $Ar^0$ is substituted, the substituents are independently selected from a group consisting of D, $C_1$-$C_{16}$ alkyl, $C_1$-$C_{16}$ alkoxy and $C_6$-$C_{20}$ aryl; and $Ar^1$ is selected from substituted or unsubstituted $C_6$-$C_{20}$ arylene, wherein, in case that $Ar^1$ is substituted, the substituents are independently selected from a group consisting of D, $C_1$-$C_{16}$ alkyl, $C_1$-$C_{16}$ alkoxy and $C_6$-$C_{20}$ aryl; and $Ar^2$ is selected from $Ar^2$ is selected from a group consisting of H, D, substituted or unsubstituted $C_6$-$C_{40}$ aryl and $C_5$-$C_{40}$ heteroaryl.

Preferably, $Ar^0$ is selected from substituted or unsubstituted phenyl or napthyl, wherein, in case that $Ar^0$ is substituted, the substituents are independently selected from a group consisting of D, $C_1$-$C_{16}$ alkyl, $C_1$-$C_{16}$ alkoxy and $C_6$-$C_{20}$ aryl.

Triaryl borane compounds of formula (1):

(1)

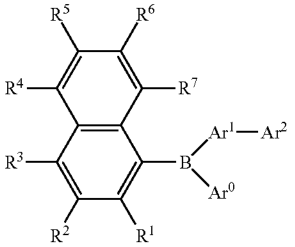

are disclosed in WO2015049030A2 and EP15187135.7.

In a further preferred embodiment, the first organic matrix compound comprises a dibenzo[c,h]acridine compound of formula (2)

(2)

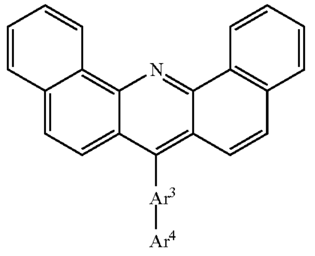

and/or a dibenzo[a,j]acridine compound of formula (3)

(3)

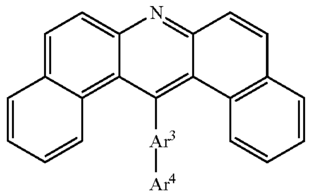

and/or a benzo[c]acridine compound of formula (4)

(4)

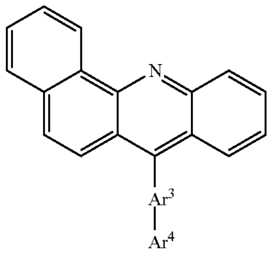

wherein $Ar^3$ is independently selected from $C_6$-$C_{20}$ arylene, preferably phenylene, biphenylene, or fluorenylene;

$Ar^4$ is independently selected from unsubstituted or substituted $C_6$-$C_{40}$ aryl, preferably phenyl, naphthyl, anthranyl, pyrenyl, or phenanthryl;

and in case that $Ar^4$ is substituted, the one or more substituents may be independently selected from the group consisting of $C_1$-$C_{12}$ alkyl and $C_1$-$C_{12}$ heteroalkyl, wherein $C_1$-$C_5$ alkyl is preferred.

Suitable dibenzo[c,h]acridine compounds are disclosed in EP 2 395 571. Suitable dibenzo[a,j]acridine are disclosed in EP 2 312 663. Suitable benzo[c]acridine compounds are disclosed in WO 2015/083948.

In a further embodiment, it is preferred that the first organic matrix compound comprises a dibenzo[c,h]acridine compound substituted with $C_6$-$C_{40}$ aryl, $C_5$-$C_{40}$ heteroaryl and/or $C_1$-$C_{12}$ alkyl groups, preferably 7-(naphthalen-2-yl) dibenzo[c,f]acridine, 7-(3-(pyren-1-yl)phenyl)dibenzo[c,h] acridine, 7-(3-(pyridin-4-yl)phenyl)dibenzo[c,h]acridine.

In a further embodiment, it is preferred that the first organic matrix compound comprises a dibenzo[a,j]acridine compound substituted with $C_6$-$C_{40}$ aryl, $C_5$-$C_{40}$ heteroaryl and/or $C_1$-$C_{12}$ alkyl groups, preferably 14-(3-(pyren-1-yl) phenyedibenzo[a, j]acridine.

In a further embodiment, it is preferred that the first organic matrix compound comprises a benzo[c]acridine compound substituted with $C_6$-$C_{40}$ aryl, $C_5$-$C_{40}$ heteroaryl and/or $C_1$-$C_{12}$ alkyl groups, preferably 7-(3-(pyren-1-yl) phenyl)benzo[c]acridine.

It may be further preferred that the first organic matrix compound comprises a triazine compound of formula (5)

(5)

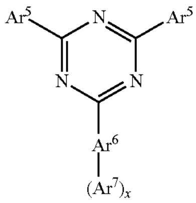

wherein $Ar^5$ is independently selected from unsubstituted or substituted $C_6$-$C_{20}$ aryl or $Ar^{5.1}$-$Ar^{5.2}$, wherein $Ar^{5.1}$ is selected from unsubstituted or substituted $C_6$-$C_{20}$ arylene and $Ar^{5.2}$ is selected from unsubstituted or substituted $C_6$-$C_{20}$ aryl or unsubstituted and substituted $C_5$-$C_{20}$ heteroaryl;

$Ar^6$ is selected from unsubstituted or substituted $C_6$-$C_{20}$ arylene, preferably phenylene, biphenylene, terphenylene, fluorenylene;

$Ar^7$ is independently selected from a group consisting of substituted or unsubstituted aryl, substituted or unsubstituted heteroaryl, the aryl and the heteroaryl having 6 to 40 ring-forming atoms, preferably phenyl, naphthyl, phenantryl, fluorenyl, terphenyl, pyridyl, quinolyl, pyrimidyl, triazinyl, benzo[h]quinolinyl, or benzo[4,5] thieno[3,2-c]pyrimidine;

x is selected from 1 or 2, wherein in case that $Ar^5$ is substituted the one or more substituents may independently be selected from $C_1$-$C_{12}$ alkyl and $C_1$-$C_{12}$ heteroalkyl, preferably $C_1$-$C_5$ alkyl;

and in case that $Ar^7$ is substituted, the one or more substituents may be independently selected from $C_1$-$C_{12}$ alkyl and $C_1$-$C_{12}$ heteroalkyl, preferably $C_1$-$C_5$ alkyl, and from $C_6$-$C_{20}$ aryl.

Suitable triazine compounds are disclosed in US 2011/284832, WO 2014/171541, WO 2015/008866, WO2015/105313, JP 2015-074649 A, and JP 2015-126140 and KR 2015/0088712, and WO16171358A1.

Furthermore, it is preferred that the first organic matrix compound comprises a triazine compound substituted with $C_6$-$C_{40}$ aryl, $C_5$-$C_{40}$ heteroaryl and/or $C_1$-$C_{12}$ alkyl groups, preferably 3-[4-(4,6-di-2-naphthalenyl-1,3,5-triazin-2-yl) phenyl]quinolone, 2-[3-(6'-methyl[2,2'-bipyridin]-5-yl)-5-(9-phenanthrenyl)phenyl]-4,6-diphenyl-1,3,5-triazine, 2-(3-(phenanthren-9-yl)-5-(pyridin-2-yl)phenyl)-4,6-diphenyl-1,3,5-triazine, 2,4-diphenyl-6-(5'''-phenyl-[1,1':3',1'':3'',1''':3''',1''-quinquephenyl]-3-yl)-1,3,5-triazine, 2-([1,1'-biphenyl]-3-yl)-4-(3'-(4,6-diphenyl-1,3,5-triazin-2-yl)-[1,1'-biphenyl]-3-yl)-6-phenyl-1,3,5-triazine and/or 2-(3'-(4,6-diphenyl-1,3,5-triazin-2-yl)-[1,1'-biphenyl]-3-yl)-4-phenylbenzo[4,5]thieno[3,2-d]pyrimidine.

In a further preferred embodiment, the first organic matrix compound comprises a 2-(benzo[d]oxazol-2-yl)phenoxy metal complex or 2-(benzo[d]thiazol-2-yl)phenoxy metal complex of formula (6)

(6)

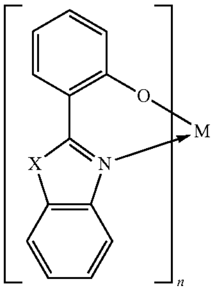

wherein M is a metal selected from Al, Zr or Sc;

X is selected from O or S; and n is selected from 3 or 4.

Suitable 2-(benzo[d]oxazol-2-yl)phenoxy metal complex or 2-(benzo[d]thiazol-2-yl)phenoxy metal complex are disclosed in WO 2010/020352.

In a preferred embodiment, the first organic matrix compound comprises a benzothienopyrimidine compound substituted with $C_6$-$C_{40}$ aryl, $C_5$-$C_{40}$ heteroaryl and/or $C_1$-$C_{12}$ alkyl groups, preferably 2-phenyl-4-(4',5',6'-triphenyl-[1,1':2',1'':3'',1'''-quaterphenyl]-3'''-yl)benzo[4,5]thieno[3,2-d]pyrimidine. Suitable benzothienopyrimidine compounds are disclosed in W 2015/0105316.

In a preferred embodiment, the first organic matrix compound comprises a benzo[k]fluoranthene compound substituted with $C_6$-$C_{40}$ aryl, $C_5$-$C_{40}$ heteroaryl and/or $C_1$-$C_{12}$ alkyl groups, preferably 7,12-diphenylbenzo[k]fluoranthene. Suitable benzo[k]fluoranthene compounds are disclosed in JP10189247 A2.

In a preferred embodiment, the first organic matrix compound comprises a perylene compound substituted with $C_6$-$C_{40}$ aryl, $C_5$-$C_{40}$ heteroaryl and/or $C_1$-$C_{12}$ alkyl groups, preferably 3,9-bis([1,1'-biphenyl]-2-yl)perylene, 3,9-di (naphthalene-2-yl)perylene or 3,10-di(naphthalene-2-yl) perylene. Suitable perylene compounds are disclosed in US2007202354.

In a preferred embodiment, the first organic matrix compound comprises a pyrene compound. Suitable pyrene compounds are disclosed in US20050025993.

In a preferred embodiment, the first organic matrix compound comprises a spiro-fluorene compound. Suitable spirofluorene compounds are disclosed in JP2005032686.

In a preferred embodiment, the first organic matrix compound comprises a xanthene compound. Suitable xanthene compounds are disclosed in US2003168970A and WO 2013149958.

In a preferred embodiment, the first organic matrix compound comprises a coronene compound. Suitable coronene compounds are disclosed in Adachi, C.; Tokito, S.; Tsutsui, T.; Saito, S., Japanese Journal of Applied Physics, Part 2: Letters (1988), 27(2), L269-L271.

In a preferred embodiment, the first organic matrix compound comprises a triphenylene compound. Suitable triphenylene compounds are disclosed in US20050025993.

In a preferred embodiment, the first organic matrix compound is selected from carbazole compounds. Suitable carbazole compounds are disclosed in US2015207079.

In a preferred embodiment, the first organic matrix compound is selected from dithienothiophene compounds. Suitable dithienothiophene compounds are disclosed in KR2011085784.

In a preferred embodiment, the first organic matrix compound comprises an anthracene compound. Particularly preferred are anthracene compounds represented by Formula 400 below:

Formula 400

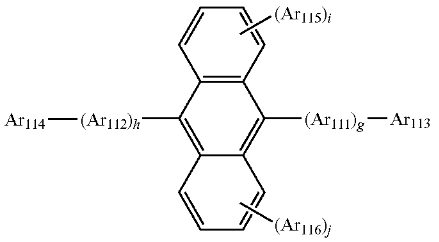

In Formula 400, $Ar_{111}$ and $Ar_{112}$ may be each independently a substituted or unsubstituted $C_6$-$C_{60}$ arylene group; $Ar_{113}$ to $Ar_{116}$ may be each independently a substituted or unsubstituted $C_1$-$C_{10}$ alkyl group or a substituted or unsubstituted $C_6$-$C_{60}$ aryl group; and g, h, i, and j may be each independently an integer from 0 to 4.

In some embodiments, $Ar_{111}$ and $Ar_{112}$ in Formula 400 may be each independently one of a phenylene group, a naphthylene group, a phenanthrenylene group, or a pyrenylene group; or a phenylene group, a naphthylene group, a phenanthrenylene group, a fluorenyl group, or a pyrenylene group, each substituted with at least one of a phenyl group, a naphthyl group, or an anthryl group.

In Formula 400, g, h, i, and j may be each independently an integer of 0, 1, or 2.

In Formula 400, $Ar_{113}$ to $Ar_{116}$ may be each independently one of a $C_1$-$C_{10}$ alkyl group substituted with at least one of a phenyl group, a naphthyl group, or an anthryl group;

a phenyl group, a naphthyl group, an anthryl group, a pyrenyl group, a phenanthrenyl group, or a fluorenyl group;

a phenyl group, a naphthyl group, an anthryl group, a pyrenyl group, a phenanthrenyl group, or a fluorenyl group, each substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a C2-$C_{60}$ alkynyl group, a $C_1$-$C_{60}$ alkoxy group, a phenyl group, a naphthyl group, an anthryl group, a pyrenyl group, a phenanthrenyl group, or a fluorenyl group; or

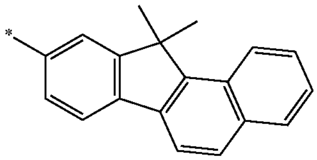

, but embodiments of the invention are not limited thereto.

According to a further more preferred aspect the first organic matrix compound can be selected from a compound of Table 4 below.

TABLE 4

| First organic matrix compounds with a dipole moment ≥0 Debye and ≤2.5 Debye which may be suitable used | |
|---|---|
| Referred to as: | Structure |
| ADN | 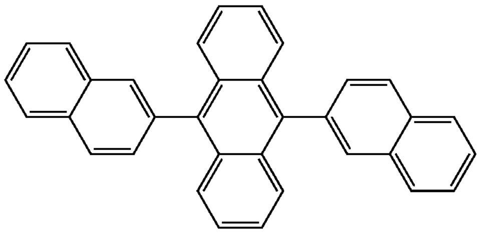 [SMILES: c1ccc2cc(-c3c4ccccc4c(-c4ccc5ccccc5c4)c4ccccc34)ccc2c1] |

TABLE 4-continued
| First organic matrix compounds with a dipole moment ≥0 Debye and ≤2.5 Debye which may be suitable used | |
|---|---|
| Referred to as: | Structure |
| ETM-1 | 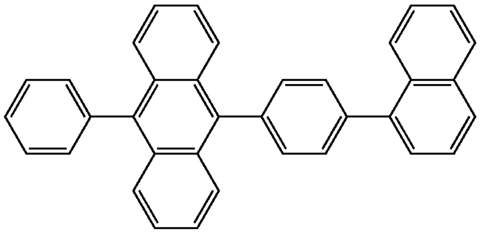 [SMILES: c1ccc(-c2c3ccccc3c(-c3ccc(-c4cccc5ccccc45)cc3)c3ccccc23)cc1] |
| ETM-2 | 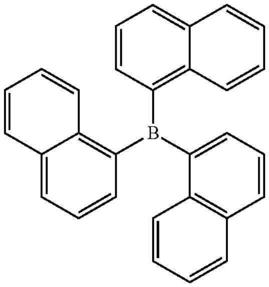 [SMILES: c1ccc2c(B(c3cccc4ccccc34)c3cccc4ccccc34)cccc2c1] |
| ETM-3 | 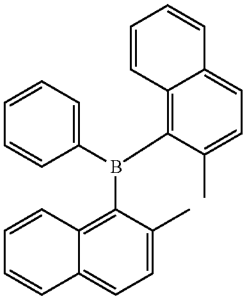 [SMILES: Cc1ccc2ccccc2c1B(c1ccccc1)c1c(C)ccc2ccccc12] |
| ETM-4 | 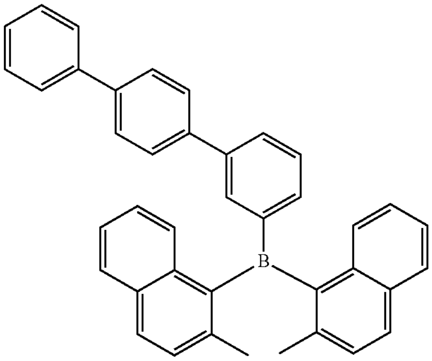 [SMILES: Cc1ccc2ccccc2c1B(c1cccc(-c2ccc(-c3ccccc3)cc2)c1)c1c(C)ccc2ccccc12] |

TABLE 4-continued
| First organic matrix compounds with a dipole moment ≥0 Debye and ≤2.5 Debye which may be suitable used | |
|---|---|
| Referred to as: | Structure |
| ETM-5 | 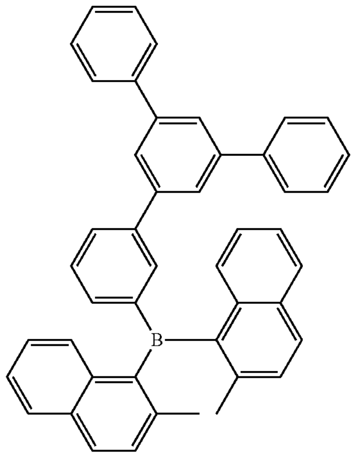 [SMILES: Cc1ccc2ccccc2c1B(c1cccc(-c2cc(-c3ccccc3)cc(-c3ccccc3)c2)c1)c1c(C)ccc2ccccc12] |
| ETM-6 | 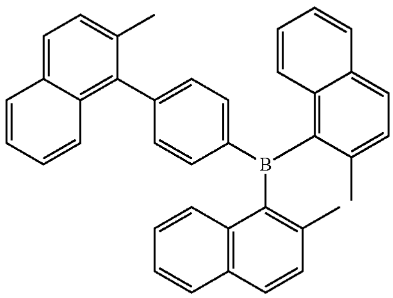 [SMILES: Cc1ccc2ccccc2c1B(c1ccc(-c2c(C)ccc3ccccc23)cc1)c1c(C)ccc2ccccc12] |
| ETM-7 | 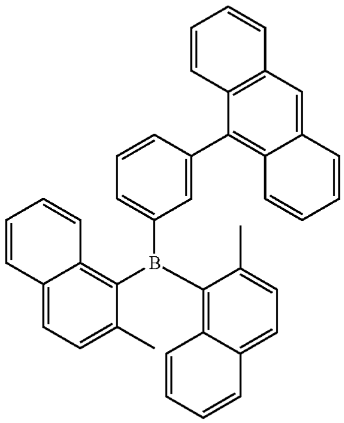 [SMILES: Cc1ccc2ccccc2c1B(c1cccc(-c2c3ccccc3cc3ccccc23)c1)c1c(C)ccc2ccccc12] |
| ETM-8 | 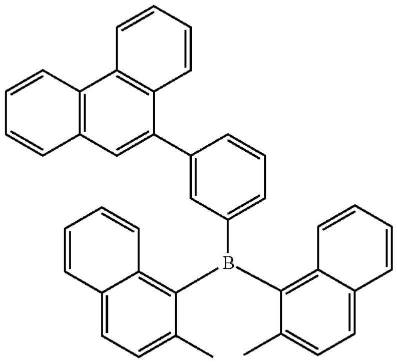 [SMILES: Cc1ccc2ccccc2c1B(c1cccc(-c2cc3ccccc3c3ccccc23)c1)c1c(C)ccc2ccccc12] |

TABLE 4-continued
| First organic matrix compounds with a dipole moment ≥0 Debye and ≤2.5 Debye which may be suitable used | |
|---|---|
| Referred to as: | Structure |
| ETM-9 | 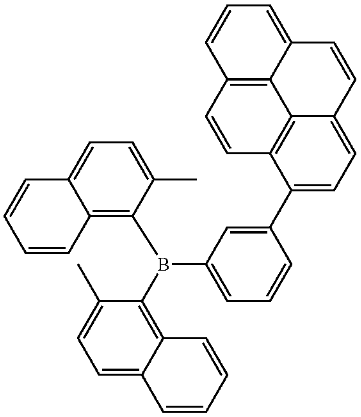 [SMILES: Cc1ccc2ccccc2c1B(c1cccc(-c2ccc3ccc4cccc5ccc2c3c45)c1)c1c(C)ccc2ccccc12] |
| ETM-10 | 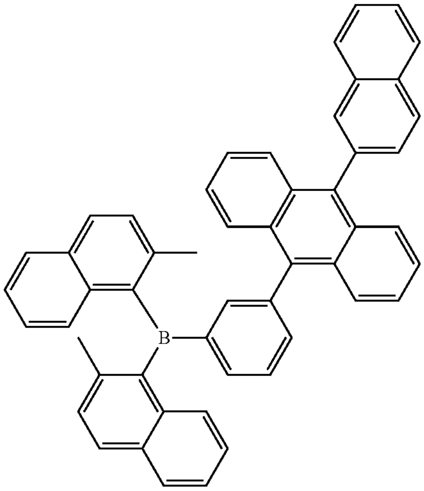 [SMILES: Cc1ccc2ccccc2c1B(c1cccc(-c2c3ccccc3c(-c3ccc4ccccc4c3)c3ccccc23)c1)c1c(C)ccc2ccccc12] |
| ETM-11 | 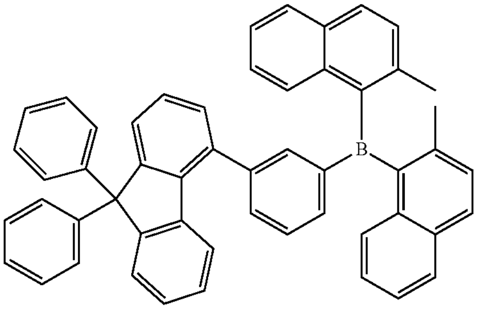 [SMILES: Cc1ccc2ccccc2c1B(c1cccc(-c2cccc3c2-c2ccccc2C3(c2ccccc2)c2ccccc2)c1)c1c(C)ccc2ccccc12] |

TABLE 4-continued
| First organic matrix compounds with a dipole moment ≥0 Debye and ≤2.5 Debye which may be suitable used | |
|---|---|
| Referred to as: | Structure |
| ETM-12 | 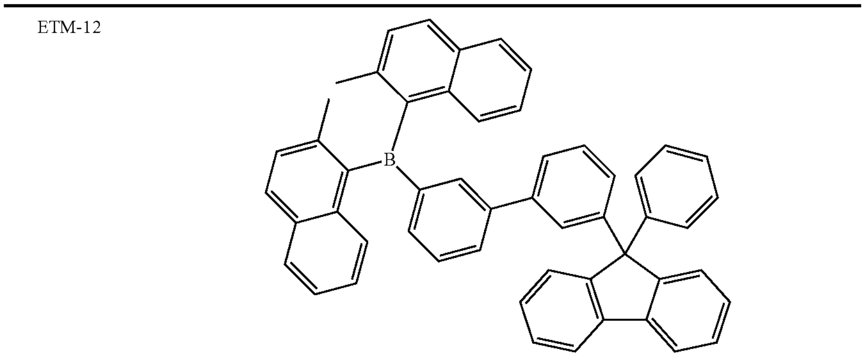 |
| ETM-13 | 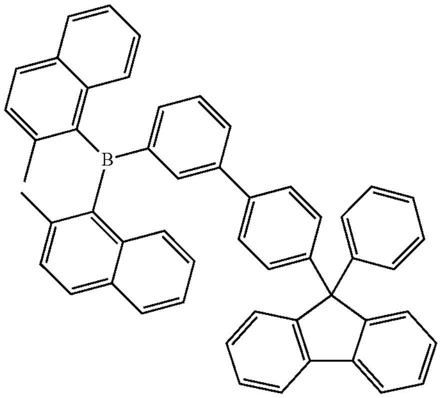 [SMILES: Cc1ccc2ccccc2c1B(c1cccc(-c2ccc(C3(c4ccccc4)c4ccccc4-c4ccccc43)cc2)c1)c1c(C)ccc2ccccc12] |
| ETM-14 | 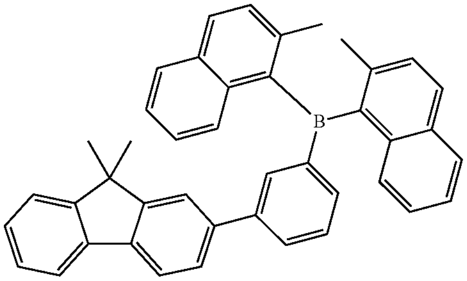 [SMILES: Cc1ccc2ccccc2c1B(c1cccc(-c2ccc3c(c2)C(C)(C)c2ccccc2-3)c1)c1c(C)ccc2ccccc12] |
| ETM-15 | 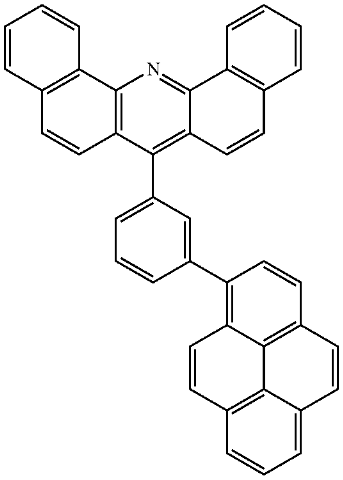 [SMILES: c1cc(-c2c3ccc4ccccc4c3nc3c2ccc2ccccc23)cc(-c2ccc3ccc4cccc5ccc2c3c45)c1] |

TABLE 4-continued
| First organic matrix compounds with a dipole moment ≥0 Debye and ≤2.5 Debye which may be suitable used | |
|---|---|
| Referred to as: | Structure |
| ETM-16 | 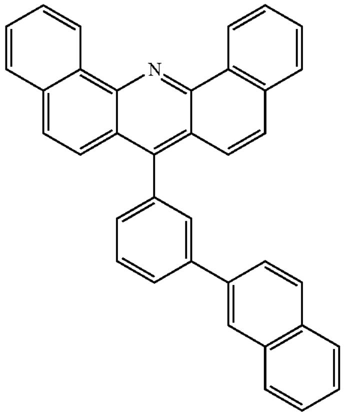 [SMILES: c1cc(-c2ccc3ccccc3c2)cc(-c2c3ccc4ccccc4c3nc3c2ccc2ccccc23)c1] |
| ETM-17 | 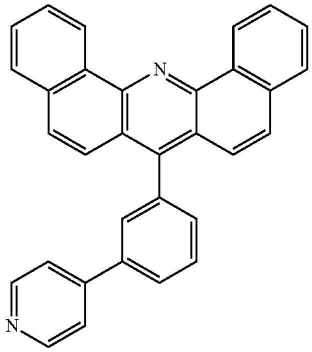 [SMILES: c1cc(-c2ccncc2)cc(-c2c3ccc4ccccc4c3nc3c2ccc2ccccc23)c1] |
| ETM-18 | 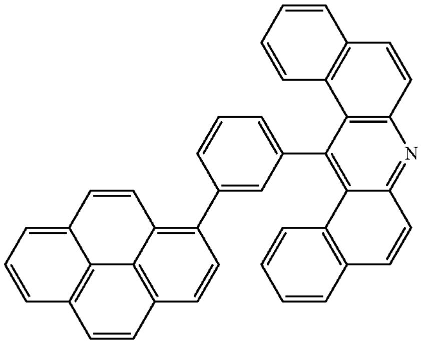 [SMILES: c1cc(-c2ccc3ccc4cccc5ccc2c3c45)cc(-c2c3c(ccc4ccccc43)nc3ccc4ccccc4c23)c1] |

TABLE 4-continued
| First organic matrix compounds with a dipole moment ≥0 Debye and ≤2.5 Debye which may be suitable used | |
|---|---|
| Referred to as: | Structure |
| ETM-19 | 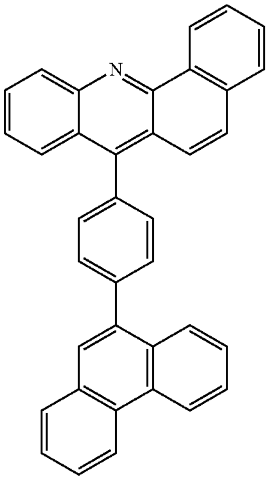 [SMILES: c1ccc2c(c1)cc(-c1ccc(-c3c4ccccc4nc4c3ccc3ccccc34)cc1)c1ccccc12] |
| ETM-20 | 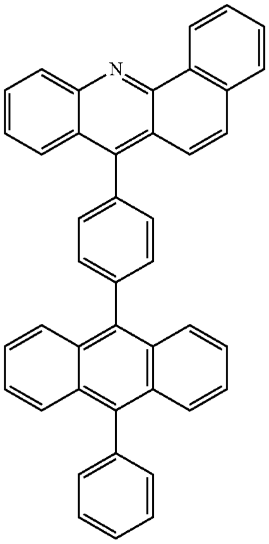 [SMILES: c1ccc(-c2c3ccccc3c(-c3ccc(-c4c5ccccc5nc5c4ccc4ccccc45)cc3)c3ccccc23)cc1] |
| ETM-21 | 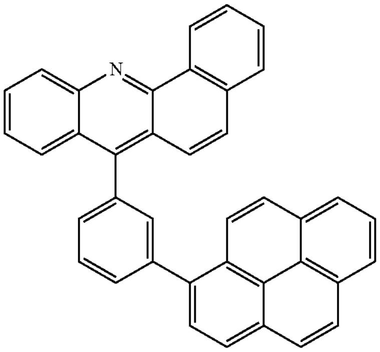 [SMILES: c1cc(-c2c3ccccc3nc3c2ccc2ccccc23)cc(-c2ccc3ccc4cccc5ccc2c3c45)c1] |

TABLE 4-continued
| First organic matrix compounds with a dipole moment ≥0 Debye and ≤2.5 Debye which may be suitable used | |
|---|---|
| Referred to as: | Structure |
| ETM-22 | 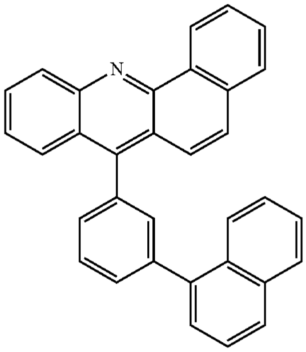 [SMILES: c1cc(-c2cccc3ccccc23)cc(-c2c3ccccc3nc3c2ccc2ccccc23)c1] |
| ETM-23 | 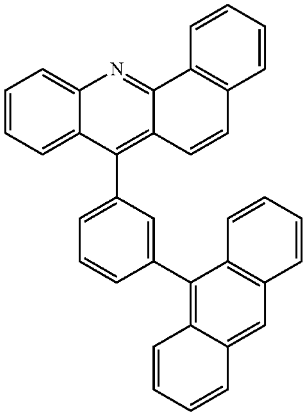 [SMILES: c1cc(-c2c3ccccc3cc3ccccc23)cc(-c2c3ccccc3nc3c2ccc2ccccc23)c1] |
| ETM-24 | 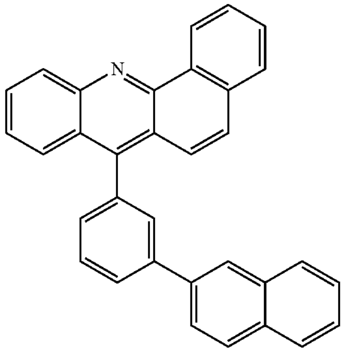 [SMILES: c1cc(-c2ccc3ccccc3c2)cc(-c2c3ccccc3nc3c2ccc2ccccc23)c1] |
| ETM-25 | 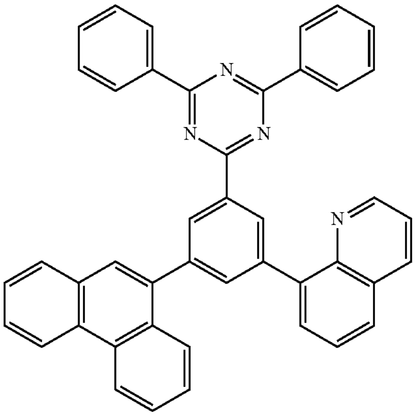 [SMILES: c1ccc(-c2nc(-c3ccccc3)nc(-c3cc(-c4cc5ccccc5c5ccccc45)cc(-c4cccc5cccnc45)c3)n2)cc1] |

TABLE 4-continued
| First organic matrix compounds with a dipole moment ≥0 Debye and ≤2.5 Debye which may be suitable used | |
|---|---|
| Referred to as: | Structure |
| ETM-26 | 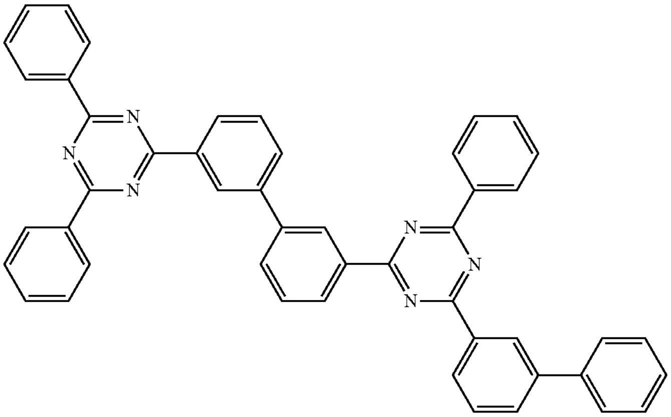 [SMILES: c1ccc(-c2cccc(-c3nc(-c4ccccc4)nc(-c4cccc(-c5cccc(-c6nc(-c7ccccc7)nc(-c7ccccc7)n6)c5)c4)n3)c2)cc1] |
| ETM-27 | 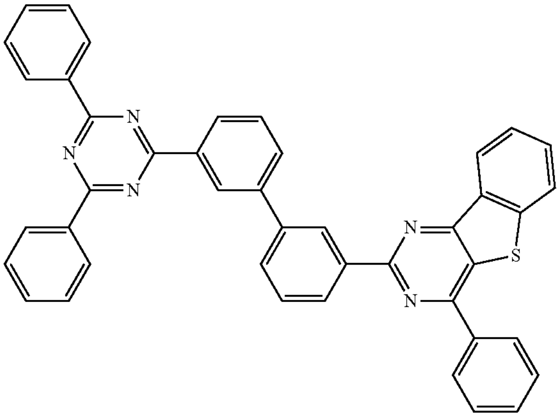 [SMILES: c1ccc(-c2nc(-c3ccccc3)nc(-c3cccc(-c4cccc(-c5nc(-c6ccccc6)c6sc7ccccc7c6n5)c4)c3)n2)cc1] |
| ETM-28 | 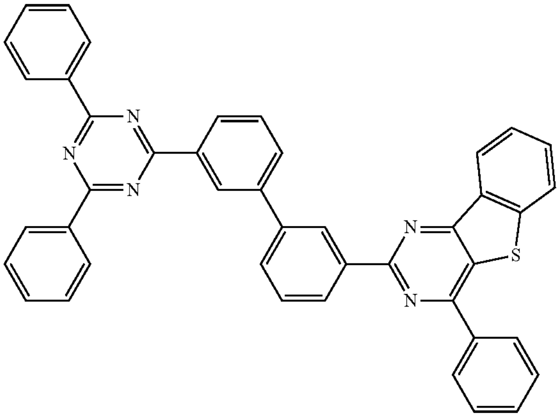 [SMILES: c1ccc(-c2nc(-c3ccccc3)nc(-c3cccc(-c4cccc(-c5nc(-c6ccccc6)c6sc7ccccc7c6n5)c4)c3)n2)cc1] |

TABLE 4-continued
| First organic matrix compounds with a dipole moment ≥0 Debye and ≤2.5 Debye which may be suitable used | |
|---|---|
| Referred to as: | Structure |
| ETM-29 | 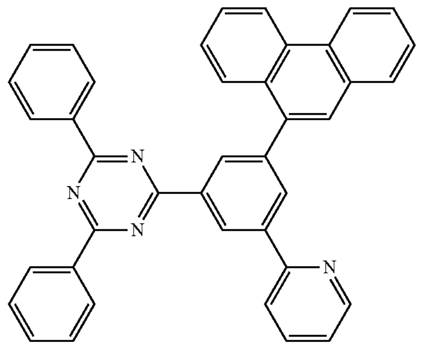 [SMILES: c1ccc(-c2nc(-c3ccccc3)nc(-c3cc(-c4ccccn4)cc(-c4cc5ccccc5c5ccccc45)c3)n2)cc1] |
| ETM-30 | 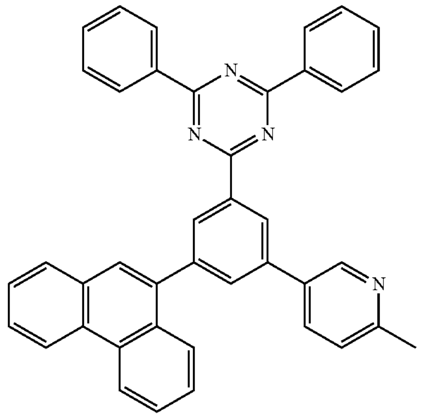 [SMILES: Cc1ccc(-c2cc(-c3nc(-c4ccccc4)nc(-c4ccccc4)n3)cc(-c3cc4ccccc4c4ccccc34)c2)cn1] |
| ETM-31 | 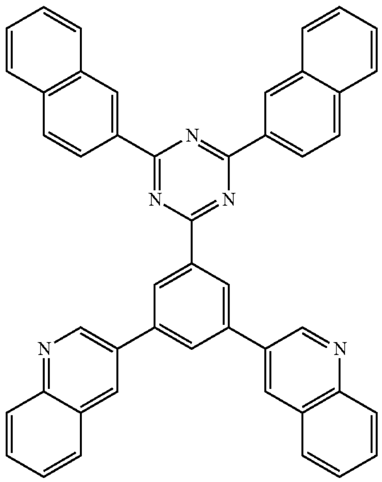 [SMILES: c1ccc2cc(-c3nc(-c4cc(-c5cnc6ccccc6c5)cc(-c5cnc6ccccc6c5)c4)nc(-c4ccc5ccccc5c4)n3)ccc2c1] |

TABLE 4-continued
| First organic matrix compounds with a dipole moment ≥0 Debye and ≤2.5 Debye which may be suitable used | |
|---|---|
| Referred to as: | Structure |
| ETM-32 | 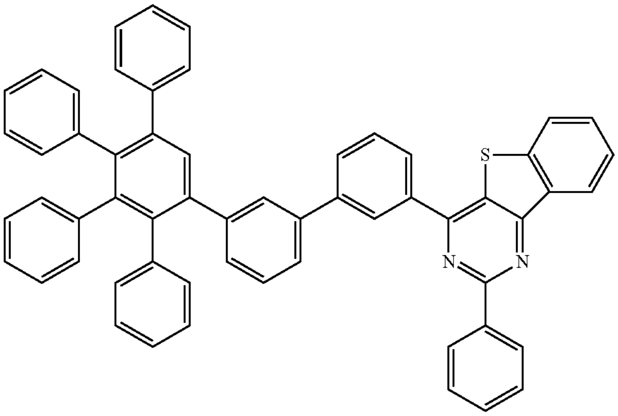 [SMILES: c1ccc(-c2nc(-c3cccc(-c4cccc(-c5cc(-c6ccccc6)c(-c6ccccc6)c(-c6ccccc6)c5-c5ccccc5)c4)c3)c3sc4ccccc4c3n2)cc1] |
| ETM-33 | 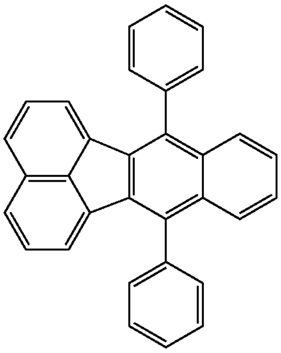 [SMILES: c1ccc(-c2c3c(c(-c4ccccc4)c4ccccc24)-c2cccc4cccc-3c24)cc1] |
| ETM-34 | 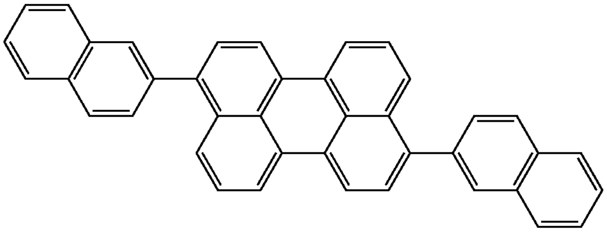 [SMILES: c1ccc2cc(-c3ccc4c5cccc6c(-c7ccc8ccccc8c7)ccc(c7cccc3c74)c65)ccc2c1] |
| ETM-35 | 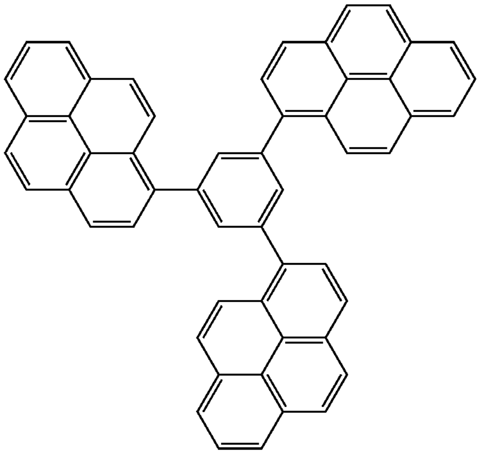 [SMILES: c1cc2ccc3ccc(-c4cc(-c5ccc6ccc7cccc8ccc5c6c78)cc(-c5ccc6ccc7cccc8ccc5c6c78)c4)c4ccc(c1)c2c34] |

TABLE 4-continued

| First organic matrix compounds with a dipole moment ≥0 Debye and ≤2.5 Debye which may be suitable used | |
|---|---|
| Referred to as: | Structure |
| ETM-36 | 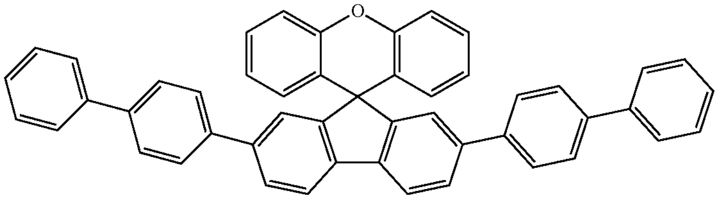 [SMILES: c1ccc(-c2ccc(-c3ccc4c(c3)C3(c5ccccc5Oc5ccccc53)c3cc(-c5ccc(-c6ccccc6)cc5)ccc3-4)cc2)cc1] |
| ETM-37 | 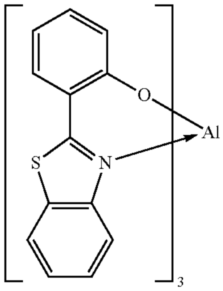 |
| ETM-38 | 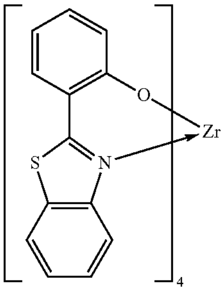 |

Table 5 below shows the dipole moments of representative examples of the first organic matrix compound with a dipole moment ≥0 Debye and ≤2.5 Debye.

TABLE 5

| Reference | Name | Structure | Dipole moment/ Debye |
|---|---|---|---|
| ADN | 9,10-di(naphthalen-2-yl)anthracene | 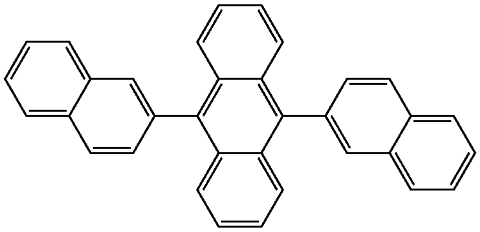 [SMILES: c1ccc2cc(-c3c4ccccc4c(-c4ccc5ccccc5c4)c4ccccc34)ccc2c1] | 0.01 |

TABLE 5-continued
| Reference | Name | Structure | Dipole moment/ Debye |
|---|---|---|---|
| ETM-2 | Tri(naphthalen-1-yl)borane | 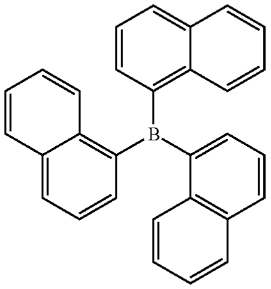 [SMILES: c1ccc2c(B(c3cccc4ccccc34)c3cccc4ccccc34)cccc2c1] | 0.14 |
| ETM-8 | bis(2-methylnaphthalen-1-yl)(3-(phenanthren-9-yl)phenyl)borane | 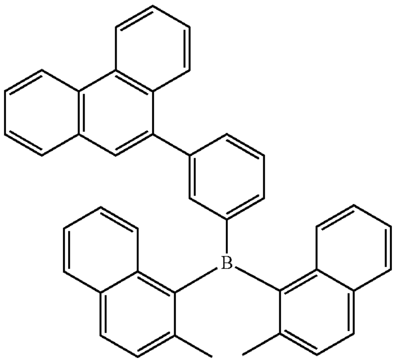 [SMILES: Cc1ccc2ccccc2c1B(c1cccc(-c2cc3ccccc3c3ccccc23)c1)c1c(C)ccc2ccccc12] | 0.18 |
| ETM-15 | 7-(3-(pyren-1-yl)phenyl)dibenzo[c,h] acridine | 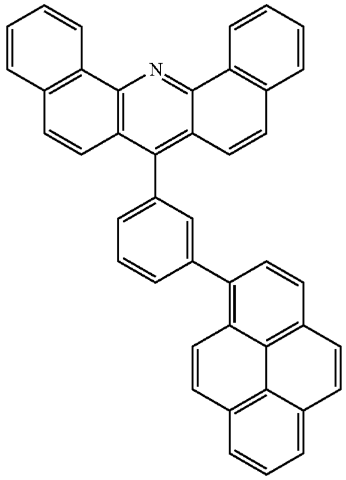 [SMILES: c1cc(-c2c3ccc4ccccc4c3nc3c2ccc2ccccc23)cc(-c2ccc3ccc4cccc5ccc2c3c45)c1] | 1.80 |
| ETM-17 | 7-(3-(pyridin-4-yl)phenyl)dibenzo[c,h] acridine | 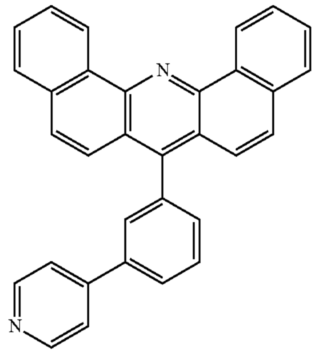 [SMILES: c1cc(-c2ccncc2)cc(-c2c3ccc4ccccc4c3nc3c2ccc2ccccc23)c1] | 2.26 |

TABLE 5-continued
| Reference | Name | Structure | Dipole moment/ Debye |
| --- | --- | --- | --- |
| ETM-18 | 14-(3-(pyren-1-yl)phenyl)dibenzo[a,j] acridine | 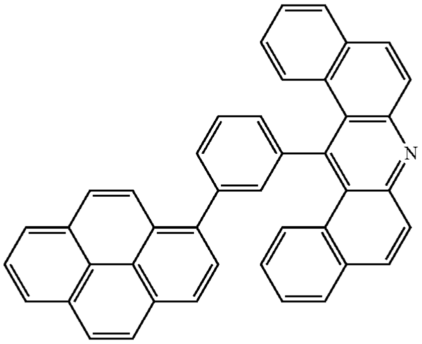 [SMILES: c1cc(-c2ccc3ccc4cccc5ccc2c3c45)cc(-c2c3c(ccc4ccccc43)nc3ccc4ccccc4c23)c1] | 2.50 |
| ETM-21 | 7-(3-(pyren-1-yl)phenyl)benzo[c] acridine | 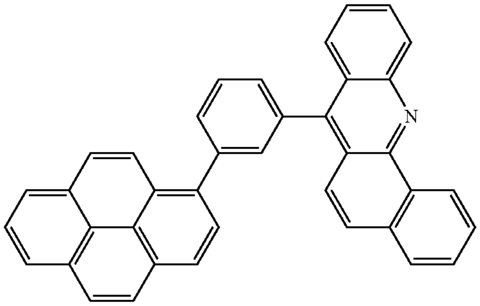 [SMILES: c1cc(-c2c3ccccc3nc3c2ccc2ccccc23)cc(-c2ccc3ccc4cccc5ccc2c3c45)c1] | 2.13 |
| ETM-29 | 2-(3-(phenanthren-9-yl)-5-(pyridin-2-yl)phenyl)-4,6-diphenyl-1,3,5-triazine | 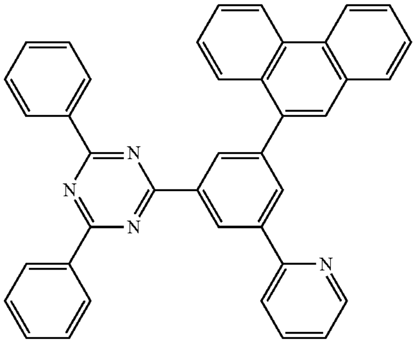 [SMILES: c1ccc(-c2nc(-c3ccccc3)nc(-c3cc(-c4ccccn4)cc(-c4cc5ccccc5c5ccccc45)c3)n2)cc1] | 1.76 |
| ETM-28 | 2,4-diphenyl-6-(5''''-phenyl-[1,1':3',1'':3'',1''':3''',1''''-quinquephenyl]-3-yl)-1,3,5-triazine | 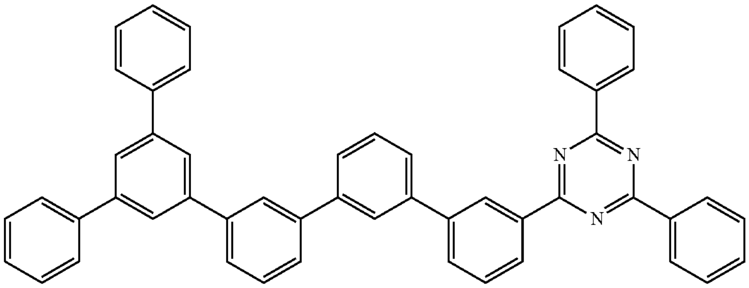 [SMILES: c1ccc(-c2cc(-c3ccccc3)cc(-c3cccc(-c4cccc(-c5cccc(-c6nc(-c7ccccc7)nc(-c7ccccc7)n6)c5)c4)c3)c2)cc1] | 0.23 |

TABLE 5-continued
| Reference | Name | Structure | Dipole moment/ Debye |
|---|---|---|---|
| ETM-26 | 2-([1,1'-biphenyl]-3-yl)-4-(3'-(4,6-diphenyl-1,3,5-triazin-2-yl)-[1,1'-biphenyl]-3-yl)-6-phenyl-1,3,5-triazine | 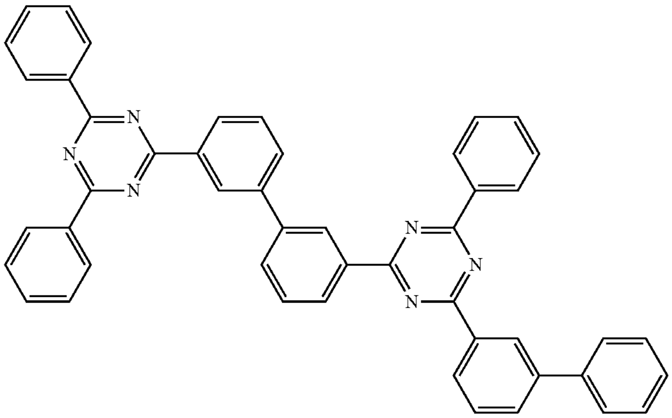 [SMILES: c1ccc(-c2cccc(-c3nc(-c4ccccc4)nc(-c4cccc(-c5cccc(-c6nc(-c7ccccc7)nc(-c7ccccc7)n6)c5)c4)n3)c2)cc1] | 0.13 |
| ETM-27 | 2-(3'-(4,6-diphenyl-1,3,5-triazin-2-yl)-[1,1'-biphenyl]-3-yl)-4-phenylbenzo[4,5]thieno[3,2-d]pyrimidine | 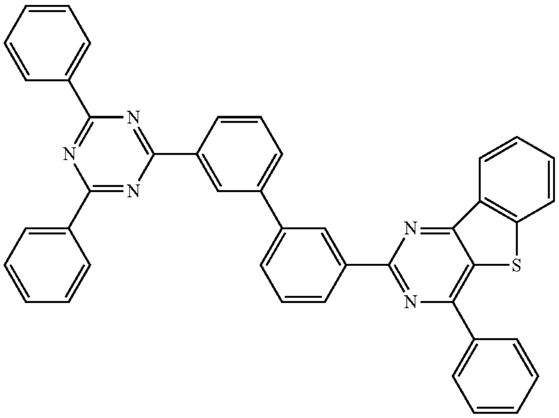 [SMILES: c1ccc(-c2nc(-c3ccccc3)nc(-c3cccc(-c4cccc(-c5nc(-c6ccccc6)c6sc7ccccc7c6n5)c4)c3)n2)cc1] | 2.0 |
| ETM-32 | 2-phenyl-4-(4',5',6'-triphenyl-[1,1':2',1'':3'',1'''-quaterphenyl]-3'''-yl)benzo[4,5]thieno[3,2-d]pyrimidine | 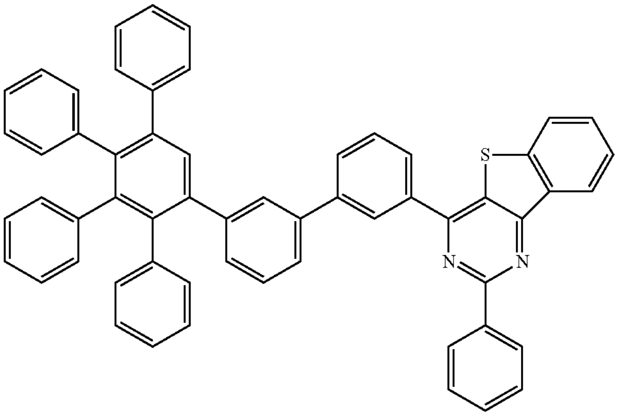 [SMILES: c1ccc(-c2nc(-c3cccc(-c4cccc(-c5cc(-c6ccccc6)c(-c6ccccc6)c(-c6ccccc6)c5-c5ccccc5)c4)c3)c3sc4ccccc4c3n2)cc1] | 1.6 |

TABLE 5-continued

| Reference | Name | Structure | Dipole moment/ Debye |
|---|---|---|---|
| ETM-33 | 7,12-diphenylbenzo[k]fluoranthene (CAS 16391-62-1) | 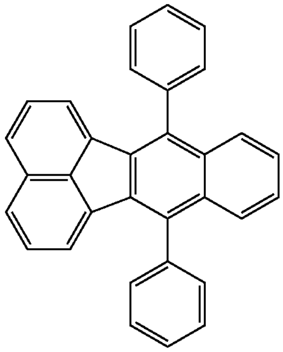 [SMILES: c1ccc(-c2c3c(c(-c4ccccc4)c4ccccc24)-c2cccc4cccc-3c24)cc1] | 0.13 |
| ETM-34 | 3,9-di(naphthalen-2-yl)perylene (CAS 959611-30-4) | 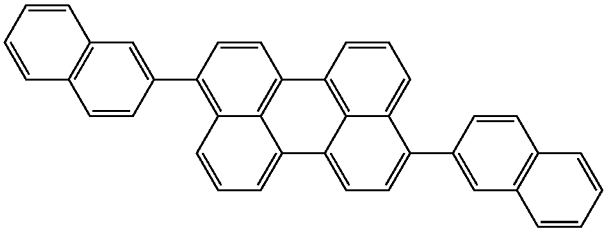 [SMILES: c1ccc2cc(-c3ccc4c5cccc6c(-c7ccc8ccccc8c7)ccc(c7cccc3c74)c65)ccc2c1] | 0.12 |

In another aspect, the electron transport layer may comprise a polar first organic matrix compound. Preferably, the first organic matrix compound has a dipole moment of about ≥2.5 Debye and <10 Debye, preferably >3 and <5 Debye, even more preferred >2.5 and less than 4 Debye.

If an organic matrix compounds has a dipole moment of >2.5 and <10 Debye, the organic matrix compound may be described by one of the following symmetry groups: $C_1$, $C_n$, $C_{nv}$, or $C_s$.

When an organic matrix compound has a dipole moment of >2.5 and <10 Debye, the organic matrix compound may comprise benzofurane, dibenzofurane, dinaphthofurane, pyridine, acridine, phenyltriazole, benzimidazole, phenanthroline, oxadiazole, benzooxazole, oxazole, quinazoline, benzoquinazoline, pyrido[3,2-h]quinazoline, pyrimido[4,5-f]quinazoline, quinoline, benzoquinoline, pyrrolo[2,1-a]isoquinolin, benzofuro[2,3-d]pyridazine, thienopyrimidine, phosphine oxide, phosphole or mixtures thereof.

It is further preferred that the first organic matrix compound comprises a phosphine oxide compound substituted with $C_6$-$C_{40}$ aryl, $C_5$-$C_{40}$ heteroaryl and/or $C_1$-$C_{12}$ alkyl groups, preferably (3-(dibenzo[c,h]acridin-7-yl)phenyl)diphenylphosphine oxide, 3-phenyl-3H-benzo[b]dinaphtho[2,1-d:1',2'-f]phosphepine-3-oxide, phenyldi(pyren-1-yl)phosphine oxide, bis(4-(anthracen-9-yl)phenyl)(phenyl) phosphine oxide, (3-(9,10-di(naphthalen-2-yl)anthracen-2-yl)phenyl)diphenylphosphine oxide, phenyldi(pyren-1-yl) phosphine oxide, diphenyl(5-(pyren-1-yl)pyridin-2-yl) phosphine oxide, diphenyl(4'-(pyren-1-yl)-[1,1'-biphenyl]-3-yl)phosphine oxide, diphenyl(4'-(pyren-1-yl)-[1,1'-biphenyl]-3-yl)phosphine oxide, (3'-(dibenzo[c,h]acridin-7-yl)-[1,1'-biphenyl]-4-yl)diphenylphosphine oxide and/or phenyl bis(3-(pyren-1-yl)phenyl)phosphine oxide.

Diarylphosphine oxide compounds which may be used as first organic matrix compound are disclosed in EP 2395571 A1, WO2013079217 A1, EP 13187905, EP13199361 and JP2002063989 A1. Dialkylphosphine oxide compounds are disclosed in EP15195877.4.

It is further preferred that the first organic matrix compound comprises a benzimidazole compound substituted with $C_6$-$C_{40}$ aryl, $C_5$-$C_{40}$ heteroaryl and/or $C_1$-$C_{12}$ alkyl groups, preferably 2-(4-(9,10-di(naphthalen-2-yl)anthracene-2-yl)phenyl)-1-phenyl-1H-benzo[d]imidazole, 1-(4-(10-([1,1'-biphenyl]-4-yl)anthracen-9-yl)phenyl)-2-ethyl-1H-benzo[d]imidazole, and/or 1,3,5-tris(1-phenyl-1H-benzimidazol-2-yl)benzene.

Benzimidazole compounds that can be used as first organic matrix materials are disclosed in U.S. Pat. No. 6,878,469 and WO2010134352.

In a preferred embodiment, the first organic matrix compound comprises a quinoline compound. Suitable quinoline compounds are disclosed in US 20090108746 and US 20090166670.

In a preferred embodiment, the first organic matrix matrix compound comprises a benzoquinoline compound. Suitable benzoquinoline compounds are disclosed in JP 2004281390 and US 20120280613.

In a preferred embodiment, the first organic matrix compound comprises a pyrimidine compound. Suitable pyrimidine compounds are disclosed in JP2004031004.

In a preferred embodiment, the first organic matrix compound comprises an oxazole compound. Preferred oxazole compounds are disclosed in JP2003007467 and WO2014163173.

In a preferred embodiment, the first organic matrix compound comprises an oxadiazole compound. Preferred oxadiazole compounds are disclosed in US2015280160.

In a preferred embodiment, the first organic matrix compound comprises an benzooxazole compound. Preferred benzooxazole compounds are disclosed in Shirota and Kageyama, Chem. Rev. 2007, 107, 953-1010.

In a preferred embodiment, the first organic matrix compound comprises a triazole compound. Suitable triazole compounds are disclosed in US2015280160.

In a preferred embodiment, the first organic matrix compound comprises a pyrimido[4,5-f]quinazoline compound. Suitable pyrimido[4,5-f]quinazoline compounds are disclosed in EP2504871.

In a preferred embodiment, the first organic matrix compound may be selected from the group consisting of a compound represented by Formula 2, and a compound represented by Formula 3 below:

Formula 2

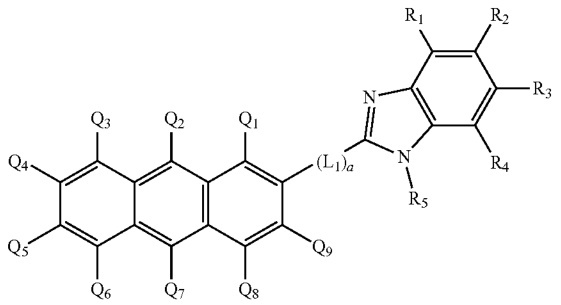

Formula 3

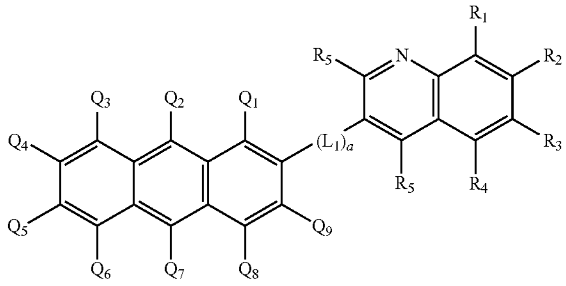

In Formulae 2 and 3, $R_1$ to $R_6$ are each independently a hydrogen atom, a halogen atom, a hydroxy group, a cyano group, a substituted or unsubstituted $C_1$-$C_{30}$ alkyl group, a substituted or unsubstituted $C_1$-$C_{30}$ alkoxy group, a substituted or unsubstituted $C_1$-$C_{30}$ acyl group, a substituted or unsubstituted $C_2$-$C_{30}$ alkenyl group, a substituted or unsubstituted $C_2$-$C_{30}$ alkynyl group, a substituted or unsubstituted $C_6$-$C_{30}$ aryl group, or a substituted or unsubstituted $C_3$-$C_{30}$ heteroaryl group. At least two adjacent $R_1$ to $R_6$ groups are optionally bonded to each other, to form a saturated or unsaturated ring. $L_1$ is a bond, a substituted or unsubstituted $C_1$-$C_{30}$ alkylene group, a substituted or unsubstituted $C_6$-$C_{30}$ arylene group, or a substituted or unsubstituted $C_3$-$C_{30}$ hetero arylene group. $Q_1$ through $Q_9$ are each independently a hydrogen atom, a substituted or unsubstituted $C_6$-$C_{30}$ aryl group, or a substituted or unsubstituted $C_3$-$C_{30}$ hetero aryl group, and "a" is an integer from 1 to 10.

For example, $R_1$ to $R_6$ may be each independently selected from the group consisting of a hydrogen atom, a halogen atom, a hydroxy group, a cyano group, a methyl group, an ethyl group, a propyl group, a butyl group, a methoxy group, an ethoxy group, a propoxy group, a butoxy group, a phenyl group, a naphthyl group, an anthryl group, a pyridinyl group, and a pyrazinyl group.

In particular, in Formula 2 and/or 3, $R_1$ to $R_4$ may each be a hydrogen atom, $R_5$ may be selected from the group consisting of a halogen atom, a hydroxy group, a cyano group, a methyl group, an ethyl group, a propyl group, a butyl group, a methoxy group, an ethoxy group, a propoxy group, a butoxy group, a phenyl group, a naphthyl group, an anthryl group, a pyridinyl group, and a pyrazinyl group. In addition, in Formula 3, $R_1$ to $R_6$ may each be a hydrogen atom.

For example, in Formula 2 and/or 3, $Q_1$ to $Q_9$ are each independently a hydrogen atom, a phenyl group, a naphthyl group, an anthryl group, a pyridinyl group, and a pyrazinyl group. In particular, in Formulae 2 and/or 3, $Q_1$, $Q_3$-$Q_6$, $Q_8$ and $Q_9$ are hydrogen atoms, and $Q_2$ and $Q_7$ may be each independently selected from the group consisting of a phenyl group, a naphthyl group, an anthryl group, a pyridinyl group, and a pyrazinyl group.

For example, $L_1$, in Formula 2 and/or 3, may be selected from the group consisting of a phenylene group, a naphthylene group, an anthrylene group, a pyridinylene group, and a pyrazinylene group. In particular, $L_1$ may be a phenylene group or a pyridinylene group. For example, "a" may be 1, 2, or, 3.

The first organic matrix compound may be further selected from Compound 5, 6, or 7 below:

Compound 6

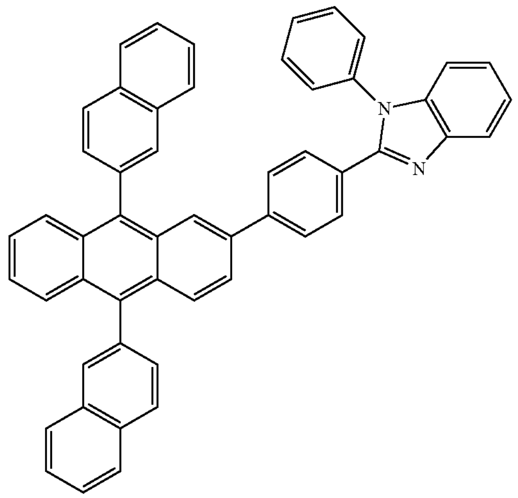

Compound 7

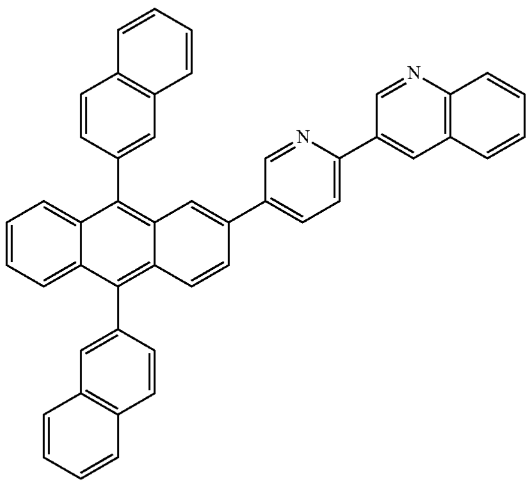

Preferably, the first organic matrix compound comprises a phenanthroline compound substituted with $C_6$-$C_{40}$ aryl, $C_5$-$C_{40}$ heteroaryl and/or $C_1$-$C_{12}$ alkyl groups, preferably 2,4,7,9-tetraphenyl-1,10-phenanthroline, 4,7-diphenyl-2,9-di-p-tolyl-1,10-phenanthroline, 2,9-di(biphenyl-4-yl)-4,7- diphenyl-1,10-phenanthroline and/or 3,8-bis(6-phenyl-2-pyridinyl)-1,10-phenanthroline.

Phenanthroline compounds that can be used as first organic matrix materials are disclosed in EP 1786050 A1 and CN102372708.

Other suitable first organic matrix compounds that can be used are quinazoline compounds substituted with aryl or heteroaryl groups, preferably 9-phenyl-9'-(4-phenyl-2-quinazolinyl)-3,3'-bi-9H-carbazole. It is further preferred that the first organic matrix compound comprises a quinazoline compound substituted with $C_6$-$C_{40}$ aryl, $C_5$-$C_{40}$ heteroaryl and/or $C_1$-$C_{12}$ alkyl groups, preferably 9-phenyl-9'-(4-phenyl-2-quinazolinyl)-3,3'-bi-9H-carbazole. Quinazoline compounds that can be used as first organic matrix materials are disclosed in KR2012102374.

It is further preferred that the first organic matrix compound comprises a benzo[h]quinazoline compound substituted with $C_6$-$C_{40}$ aryl, $C_5$-$C_{40}$ heteroaryl and/or $C_1$-$C_{12}$ alkyl groups, preferably 4-(2-naphthalenyl)-2-[4-(3-quinolinyl)phenyl]-benzo[h]quinazoline. Benzo[h]quinazoline compounds that can be used as first organic matrix materials are disclosed in KR2014076522.

It is also preferred that the first organic matrix compound comprises a pyrido[3,2-h]quinazoline compound substituted with $C_6$-$C_{40}$ aryl, $C_5$-$C_{40}$ heteroaryl and/or $C_1$-$C_{12}$ alkyl groups, preferably 4-(naphthalen-1-yl)-2,7,9-triphenylpyrido[3,2-h]quinazoline. Pyrido[3,2-h]quinazoline compounds that can be used as first organic matrix materials are disclosed in EP1970371.

In a further preferred embodiment, the first organic matrix compound is selected from acridine compounds. Suitable acridine compounds are disclosed in CN104650032.

Extraordinary preferred first organic matrix compounds are that of the following structures of Table 6.

TABLE 6

First organic matrix compounds with a dipole moment >2.5 Debye and ≤10 Debye which may be suitable used

| Compound | Structure |
| --- | --- |
| ETM-35 | 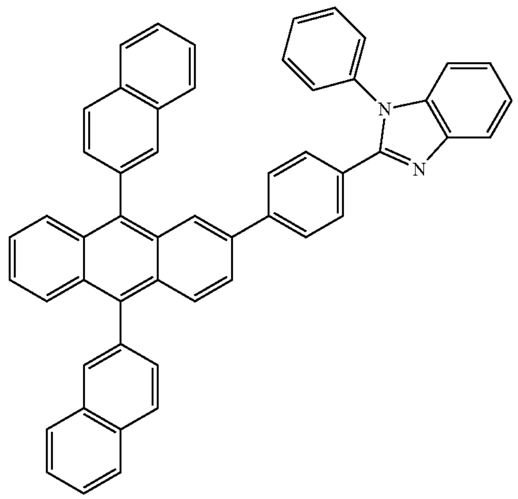 [SMILES: c1ccc(-n2c(-c3ccc(-c4ccc5c(-c6ccc7ccccc7c6)c6ccccc6c(-c6ccc7ccccc7c6)c5c4)cc3)nc3ccccc32)cc1] |
| ETM-36 | 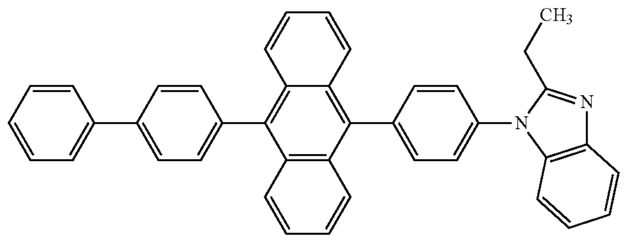 [SMILES: CCc1nc2ccccc2n1-c1ccc(-c2c3ccccc3c(-c3ccc(-c4ccccc4)cc3)c3ccccc23)cc1] |

TABLE 6-continued
| First organic matrix compounds with a dipole moment >2.5 Debye and ≤10 Debye which may be suitable used | |
|---|---|
| Compound | Structure |
| ETM-37 | 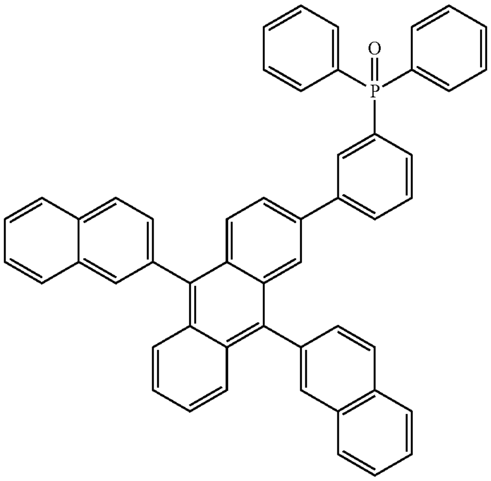 [SMILES: O=P(c1ccccc1)(c1ccccc1)c1cccc(-c2ccc3c(-c4ccc5ccccc5c4)c4ccccc4c(-c4ccc5ccccc5c4)c3c2)c1] |
| ETM-38 | 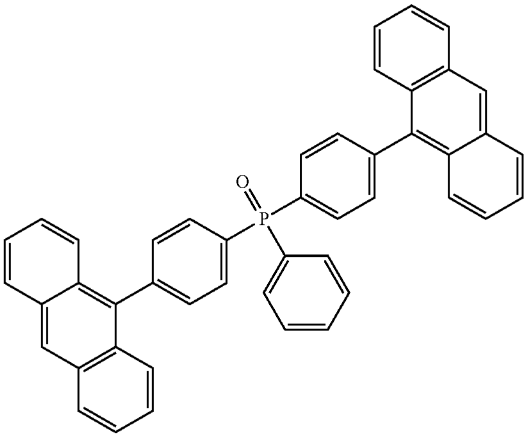 [SMILES: O=P(c1ccccc1)(c1ccc(-c2c3ccccc3cc3ccccc23)cc1)c1ccc(-c2c3ccccc3cc3ccccc23)cc1] |
| ETM-39 | 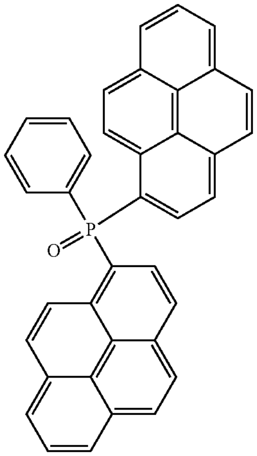 [SMILES: O=P(c1ccccc1)(c1ccc2ccc3cccc4ccc1c2c34)c1ccc2ccc3cccc4ccc1c2c34] |

TABLE 6-continued
First organic matrix compounds with a dipole moment >2.5 Debye and ≤10 Debye which may be suitable used
| Compound | Structure |
|---|---|
| ETM-40 | 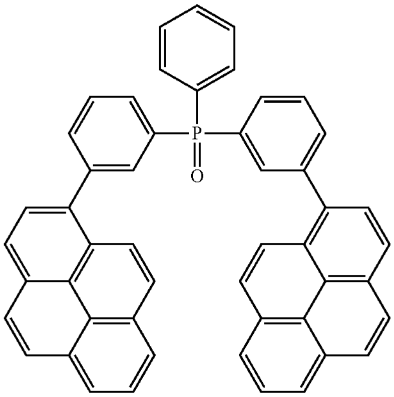 [SMILES: O=P(c1ccccc1)(c1cccc(-c2ccc3ccc4cccc5ccc2c3c45)c1)c1cccc(-c2ccc3ccc4cccc5ccc2c3c45)c1] |
| ETM-41 | 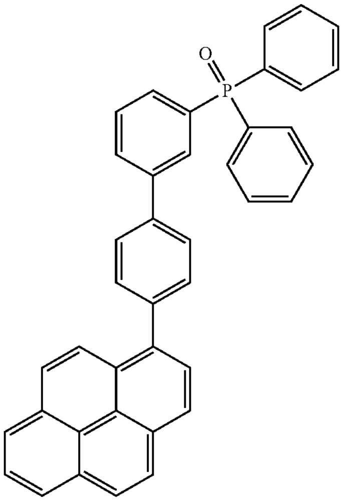 [SMILES: O=P(c1ccccc1)(c1ccccc1)c1cccc(-c2ccc(-c3ccc4ccc5cccc6ccc3c4c56)cc2)c1] |
| ETM-42 | 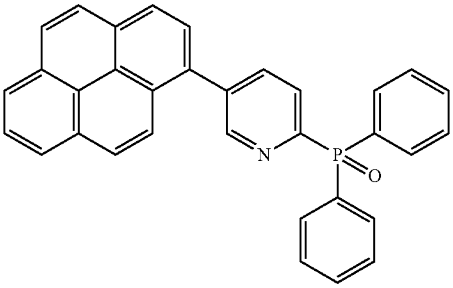 [SMILES: O=P(c1ccccc1)(c1ccccc1)c1ccc(-c2ccc3ccc4cccc5ccc2c3c45)cn1] |

TABLE 6-continued
| First organic matrix compounds with a dipole moment >2.5 Debye and ≤10 Debye which may be suitable used | |
|---|---|
| Compound | Structure |
| ETM-43 | 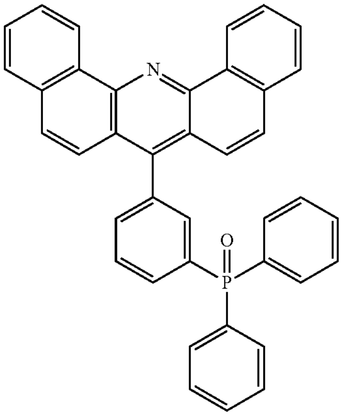 [SMILES: O=P(c1ccccc1)(c1ccccc1)c1cccc(-c2c3ccc4ccccc4c3nc3c2ccc2ccccc23)c1] |
| ETM-44 | 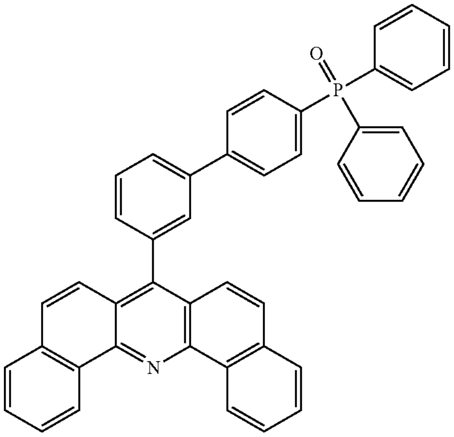 [SMILES: O=P(c1ccccc1)(c1ccccc1)c1ccc(-c2cccc(-c3c4ccc5ccccc5c4nc4c3ccc3ccccc34)c2)cc1] |
| ETM-45 | 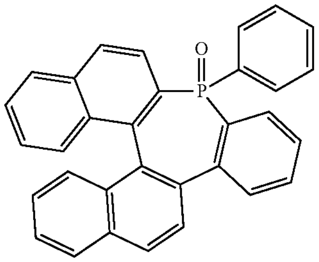 [SMILES: O=P1(c2ccccc2)c2ccccc2-c2ccc3ccccc3c2-c2c1ccc1ccccc21] |
| ETM-46 | 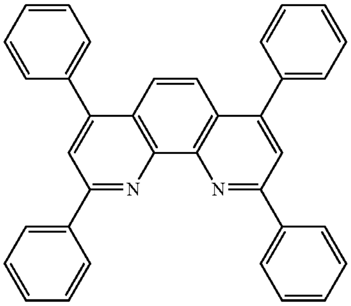 [SMILES: c1ccc(-c2cc(-c3ccccc3)c3ccc4c(-c5ccccc5)cc(-c5ccccc5)nc4c3n2)cc1] |

TABLE 6-continued
| First organic matrix compounds with a dipole moment >2.5 Debye and ≤10 Debye which may be suitable used | |
|---|---|
| Compound | Structure |
| ETM-47 | 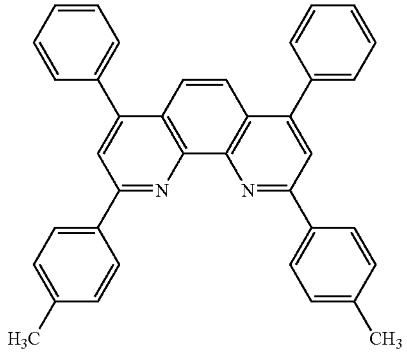 [SMILES: Cc1ccc(-c2cc(-c3ccccc3)c3ccc4c(-c5ccccc5)cc(-c5ccc(C)cc5)nc4c3n2)cc1] |
| ETM-48 | 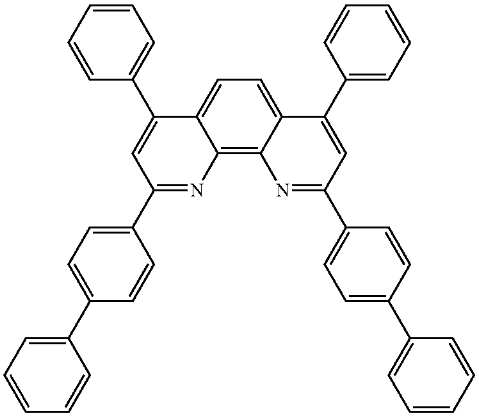 [SMILES: c1ccc(-c2ccc(-c3cc(-c4ccccc4)c4ccc5c(-c6ccccc6)cc(-c6ccc(-c7ccccc7)cc6)nc5c4n3)cc2)cc1] |
| ETM-49 | 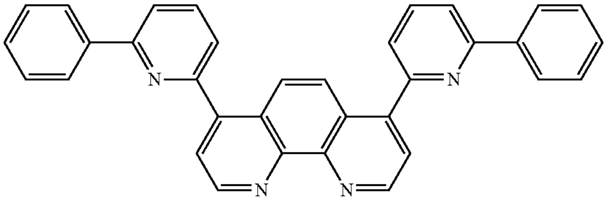 [SMILES: c1ccc(-c2cccc(-c3ccnc4c3ccc3c(-c5cccc(-c6ccccc6)n5)ccnc34)n2)cc1] |
| ETM-50 | 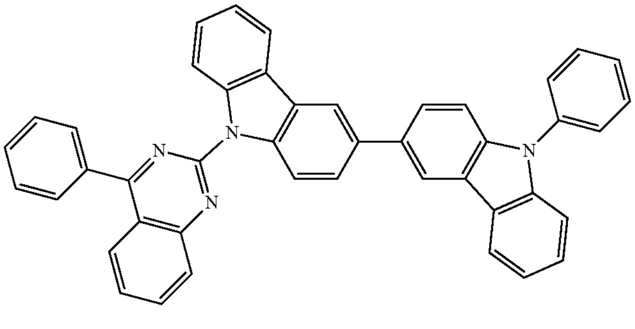 [SMILES: c1ccc(-c2nc(-n3c4ccccc4c4cc(-c5ccc6c(c5)c5ccccc5n6-c5ccccc5)ccc43)nc3ccccc23)cc1] |

TABLE 6-continued

| First organic matrix compounds with a dipole moment >2.5 Debye and ≤10 Debye which may be suitable used | |
|---|---|
| Compound | Structure |
| ETM-51 | 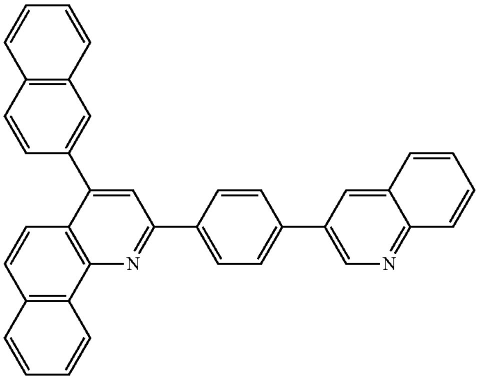 [SMILES: c1ccc2cc(-c3cc(-c4ccc(-c5cnc6ccccc6c5)cc4)nc4c3ccc3ccccc34)ccc2c1] |
| ETM-52 | 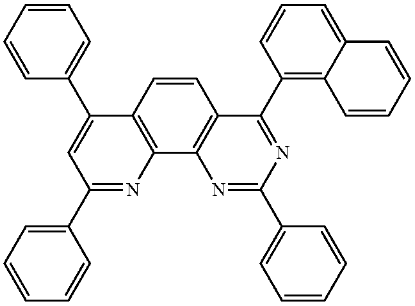 [SMILES: c1ccc(-c2cc(-c3ccccc3)c3ccc4c(-c5cccc6ccccc56)nc(-c5ccccc5)nc4c3n2)cc1] |

Table 7 below shows the dipole moments of representative examples of the first organic matrix compound with a dipole moment of ≥2.5 Debye and ≤10 Debye.

TABLE 7

| Compound | Name | Structure | Dipole moment/ Debye |
|---|---|---|---|
| ETM-53 | 1,2-diphenyl-1H-benzo[d]imidazole | 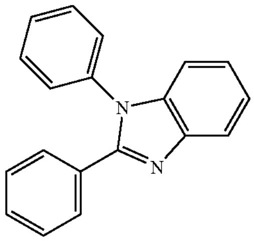 [SMILES: c1ccc(-c2nc3ccccc3n2-c2ccccc2)cc1] | 3.75 |
| ETM-54 | Triphenylphosphine oxide | 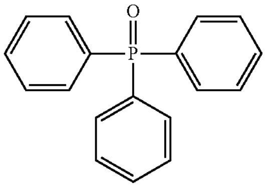 [SMILES: O=P(c1ccccc1)(c1ccccc1)c1ccccc1] | 3.97 |

TABLE 7-continued

| Compound | Name | Structure | Dipole moment/ Debye |
|---|---|---|---|
| ETM-55 | 4,7-diphenyl-1,10-phenanthroline | 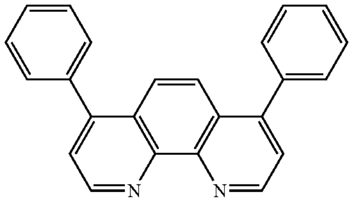 [SMILES: c1ccc(-c2ccnc3c2ccc2c(-c4ccccc4)ccnc23)cc1] | 3.65 |
| ETM-56 | 9-phenyl-9'-(quinazolin-2-yl)-9H,9'H-3,3'-bicarbazole | 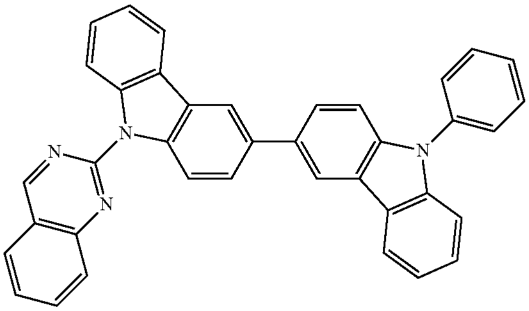 [SMILES: c1ccc(-n2c3ccccc3c3cc(-c4ccc5c(c4)c4ccccc4n5-c4ncc5ccccc5n4)ccc32)cc1] | 3.2/1.65*⁾ |
| ETM-51 | 4-(2-naphthalenyl)-2-[4-(3-quinolinyl)phenyl]-benzo[h]quinazoline | 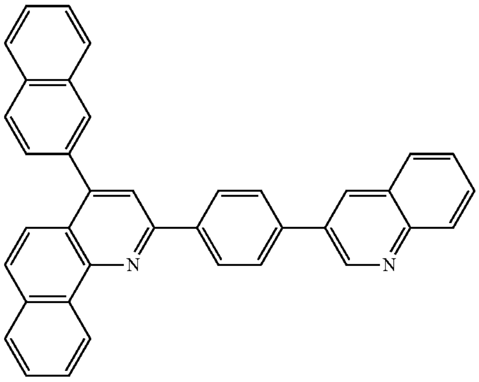 [SMILES: c1ccc2cc(-c3cc(-c4ccc(-c5cnc6ccccc6c5)cc4)nc4c3ccc3ccccc34)ccc2c1] | 3 |
| ETM-52 | 4-(naphthalen-1-yl)-2,7,9-triphenylpyrido[3,2-h]quinazoline | 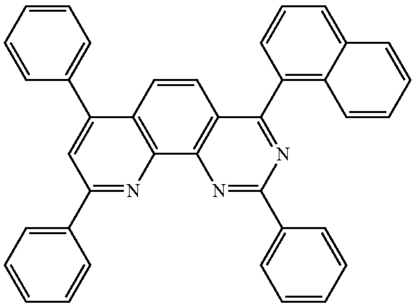 [SMILES: c1ccc(-c2cc(-c3ccccc3)c3ccc4c(-c5cccc6ccccc56)nc(-c5ccccc5)nc4c3n2)cc1] | 3.81 |

*⁾Two conformers with a difference of 1 kJ/mol difference in total energy. Therefore, both conformers are present at room temperature.

According to another aspect, the electron transport layer can be in direct contact with the electron injection layer according to the invention comprises a first organic matrix compound. If more than one electron transport layer is present, the electron injection layer is contacting sandwiched between the first electron transport layer comprising the first organic matrix compound and the first cathode electrode layer. The second electron transport layer, if present, is contacting sandwiched between the emission layer and the first electron transport layer.

According to a preferred embodiment, the first electron transport layer comprises a first organic matrix compound with a dipole moment of ≥0 Debye and ≤2.5 Debye, and the second electron transport layer comprises a second organic matrix compound with a dipole moment of >2.5 Debye and ≤10 Debye.

Preferably, the organic phosphine compound in the electron injection layer and the second organic matrix compound in the second electron transport layer are selected the same.

In a particularly preferred embodiment, the organic phosphine compound in the electron injection layer and the second organic matrix compound in the second electron transport layer are selected the same, and the first electron transport layer comprises a first organic matrix compound with a dipole moment of ≥0 Debye and ≤2.5 Debye, Thereby, low operating voltage and/or high external quantum efficiency EQE and/or high TACT time are achieved.

According to various embodiments of the OLED of the present invention the thicknesses of the electron transport layer may be in the range of about ≥0.5 nm to about ≤95 nm, preferably of about ≥3 nm to about ≤80 nm, further preferred of about ≥5 nm to about ≤60 nm, also preferred of about ≥6 nm to about ≤40 nm, in addition preferred about ≥8 nm to about ≤20 nm and more preferred of about ≥10 nm to about ≤18 nm.

According to various embodiments of the OLED of the present invention the thicknesses of the electron transport layer stack can be in the range of about ≥25 nm to about ≤100 nm, preferably of about ≥30 nm to about ≤80 nm, further preferred of about ≥35 nm to about ≤60 nm, and more preferred of about ≥36 nm to about ≤40 nm.

The ETL may be formed optional on an EML or on the HBL if the HBL is formed.

The ETL may have a stacked structure, preferably of two ETL-layers, so that injection and transport of electrons may be balanced and holes may be efficiently blocked. In a conventional OLED, since the amounts of electrons and holes vary with time, after driving is initiated, the number of excitons generated in an emission area may be reduced. As a result, a carrier balance may not be maintained, so as to reduce the lifetime of the OLED.

However, in the ETL, the first layer and the second layer may have similar or identical energy levels, so that the carrier balance may be uniformly maintained, while controlling the electron-transfer rate.

The organic light emitting device may comprise further electron transport layers, preferably a third and optional fourth electron transport layer, wherein the third and optional fourth electron transport layer is arranged between the charge generation layer and the cathode. Preferably, the first electron transport layer and third electron transport layer are selected the same, and the second and fourth electron transport layer are selected the same.

The ETL may be formed on the EML by vacuum deposition, spin coating, slot-die coating, printing, casting, or the like. When the ETL is formed by vacuum deposition or spin coating, the deposition and coating conditions may be similar to those for formation of the HIL. However, the deposition and coating conditions may vary, according to a compound that is used to form the ETL.

Substrate

The substrate may be any substrate that is commonly used in manufacturing of organic light-emitting diodes. If light is emitted through the substrate, the substrate may be a transparent material, for example a glass substrate or a transparent plastic substrate, having excellent mechanical strength, thermal stability, transparency, surface smoothness, ease of handling, and waterproofness. If light is emitted through the top surface, the substrate may be a transparent or non-transparent material, for example a glass substrate, a plastic substrate, a metal substrate or a silicon substrate.

Anode Electrode

The anode electrode may be formed by depositing or sputtering a compound that is used to form the anode electrode. The compound used to form the anode electrode may be a high work-function compound, so as to facilitate hole injection. The anode material may also be selected from a low work function material (i.e. Aluminum). The anode electrode may be a transparent or reflective electrode. Transparent conductive compounds, such as indium tin oxide (ITO), indium zinc oxide (IZO), tin-dioxide ($SnO_2$), and zinc oxide (ZnO), may be used to form the anode electrode 120. The anode electrode 120 may also be formed using magnesium (Mg), aluminum (Al), aluminum-lithium (Al—Li), calcium (Ca), magnesium-indium (Mg—In), magnesium-silver (Mg—Ag), silver (Ag), gold (Au), or the like.

The anode electrode may be formed from a high conductivity metal, for example copper (Cu) or silver (Ag).

HIL

A hole injection layer (HIL), comprising a first and/or second hole injection layer, that can be suitable used for the OLED of the present invention are described in US2002158242 AA, EP1596445A1 and EP1988587A1.

The first HIL may be formed on the anode electrode by vacuum deposition, spin coating, printing, casting, slot-die coating, Langmuir-Blodgett (LB) deposition, or the like.

The second HIL may be formed on the n-type charge generation layer by vacuum deposition, spin coating, slot-die coating, printing, casting, Langmuir-Blodgett (LB) deposition, or the like.

When the HIL is formed using vacuum deposition, the deposition conditions may vary according to the compound that is used to form the HIL, and the desired structure and thermal properties of the HIL. In general, however, conditions for vacuum deposition may include a deposition temperature of 100° C. to 500° C., a pressure of $10^{-8}$ to $10^{-3}$ torr (1 torr equals 133.322 Pa), and a deposition rate of 0.1 to 10 nm/sec.

For example, the coating conditions may include a coating speed of about 2000 rpm to about 5000 rpm, and a thermal treatment temperature of about 80° C. to about 200° C. Thermal treatment removes a solvent after the coating is performed.

HTL

A hole transport layer (HTL), comprising a first and/or second hole transport layer, that can be suitable used for the OLED of the present invention are described in Shirota and Kageyama, Chem. Rev. 2007, 107, 953-1010.

The first hole transport layer (HTL) may be formed on the HIL by vacuum deposition, spin coating, slot-die coating, printing, casting, Langmuir-Blodgett (LB) deposition, or the like.

The second hole transport layer (HTL) may be formed on the second hole injection layer by vacuum deposition, spin coating, slot-die coating, printing, casting, Langmuir-Blodgett (LB) deposition, or the like.

When the HTL is formed by vacuum deposition or spin coating, the conditions for deposition and coating may be similar to those for the formation of the HIL. However, the conditions for the vacuum or solution deposition may vary, according to the compound that is used to form the HTL.

Electron Blocking Layer

The function of the electron blocking layer (EBL) 150 is to prevent electrons from being transferred from the emission layer to the hole transport layer and thereby confine electrons to the emission layer. Thereby, efficiency, operating voltage and/or lifetime are improved. Typically, the electron blocking layer comprises a triarylamine compound. The triarylamine compound may have a LUMO level closer to vacuum level than the LUMO level of the hole transport layer. The electron blocking layer may have a HOMO level that is further away from vacuum level compared to the HOMO level of the hole transport layer. The thickness of the electron blocking layer is selected between 2 and 20 nm.

The electron blocking layer may comprise a compound of Formula Z below (Z)

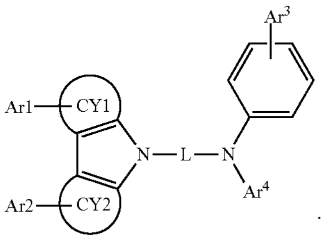

In Formula Z,

CY1 and CY2 are the same as or different from each other, and each independently represent a benzene cycle or a naphthalene cycle, Ar1 to Ar3 are the same as or different from each other, and each independently selected from the group consisting of hydrogen; a substituted or unsubstituted aryl group having 6 to 30 carbon atoms; and a substituted or unsubstituted heteroaryl group having 5 to 30 carbon atoms, Ar4 is selected from the group consisting of a substituted or unsubstituted phenyl group, a substituted or unsubstituted biphenyl group, a substituted or unsubstituted terphenyl group, a substituted or unsubstituted triphenylene group, and a substituted or unsubstituted heteroaryl group having 5 to 30 carbon atoms, L is a substituted or unsubstituted arylene group having 6 to 30 carbon atoms.

If the electron blocking layer has a high triplet level, it may also be described as triplet control layer.

The function of the triplet control layer is to reduce quenching of triplets if a phosphorescent green or blue emission layer is used. Thereby, higher efficiency of light emission from a phosphorescent emission layer can be achieved. The triplet control layer is selected from triarylamine compounds with a triplet level above the triplet level of the phosphorescent emitter in the adjacent emission layer. Suitable triplet control layer, in particular the triarylamine compounds, are described in EP 2 722 908 A1, and fully incorporated by reference.

Emission Layer (EML)

The EML may be formed on the HTL by vacuum deposition, spin coating, slot-die coating, printing, casting, LB, or the like. When the EML is formed using vacuum deposition or spin coating, the conditions for deposition and coating may be similar to those for the formation of the HIL.

The first emission layer may be formed on the first hole transport layer.

The second emission layer may be formed on the second hole transport layer.

However, the conditions for deposition and coating may vary, according to the compound that is used to form the EML.

The emission layer (EML) may be formed of a combination of a host and a dopant. Example of the host are Alq3,4,4'-N,N'-dicarbazole-biphenyl (CBP), poly(n-vinylcarbazole) (PVK), 9,10-di(naphthalene-2-yl)anthracenee (ADN), 4,4',4"-Tris(carbazol-9-yl)-triphenylamine (TCTA), 1,3,5-tris(N-phenylbenzimidazole-2-yl)benzene (TPBI), 3-tert-butyl-9,10-di-2-naphthylanthracenee (TBADN), distyrylarylene (DSA), Bis(2-(2-hydroxyphenyl)-benzothiazolate)zinc (Zn(BTZ) 2), E3 below, AND, Compound 12 below, and Compound 13 below.

E3

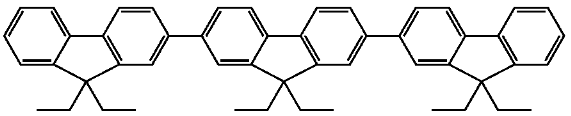

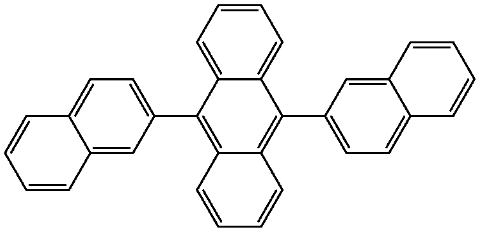

AND

Compound 12

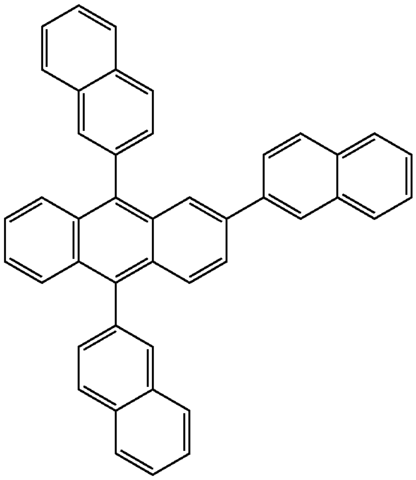

Compound 13

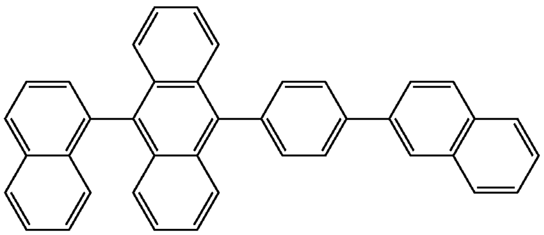

The dopant may be a phosphorescent or fluorescent emitter. Phosphorescent emitters and emitters which emit light via a thermally activated delayed fluorescence (TADF) mechanism are preferred due to their higher efficiency. The emitter may be a small molecule or a polymer. Examples of a red dopant are PtOEP, $Ir(piq)_3$, and Btp 2Ir(acac), but are not limited thereto. These compounds are phosphorescent emitters, however, fluorescent red dopants could also be used.

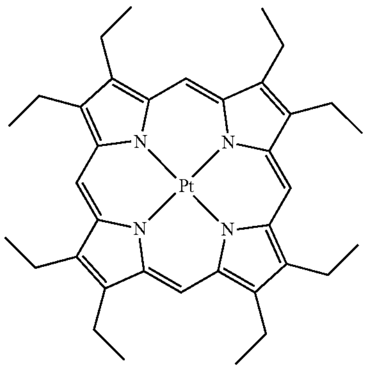

PtOEP

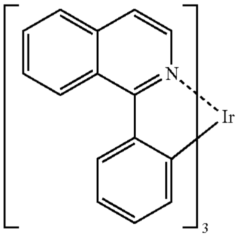

Ir(piq)$_3$

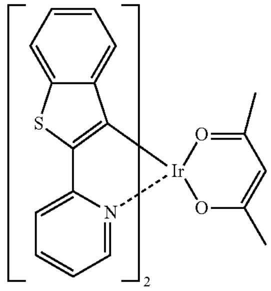

Btp$_2$Ir(acac)

Examples of a phosphorescent green dopant are Ir(ppy)$_3$ (ppy=phenylpyridine), Ir(ppy)$_2$(acac), Ir(mpyp)$_3$ are shown below. Compound 14 is an example of a fluorescent green emitter and the structure is shown below.

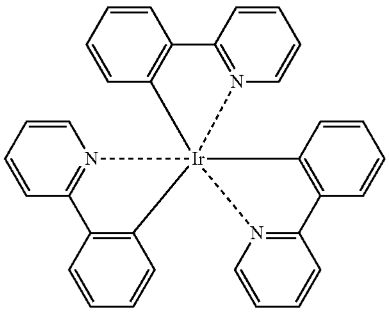

Ir(ppy)$_3$

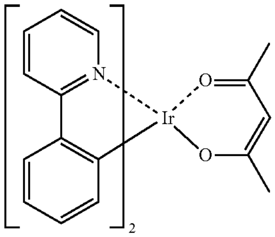

Ir(ppy)$_2$(acac)

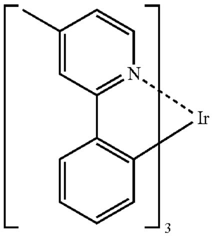

Ir(mpyp)$_3$

-continued

Compound 14

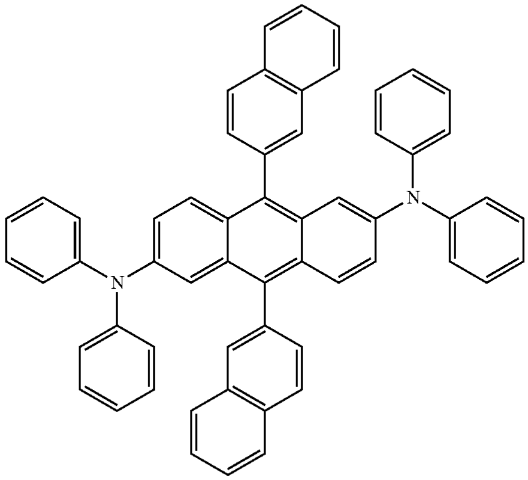

Examples of a phosphorescent blue dopant are F$_2$Irpic, (F$_2$ppy)$_2$Ir(tmd) and Ir(dfppz) 3, ter-fluorene, the structures are shown below. 4.4'-bis(4-diphenyl amiostyryl)biphenyl (DPAVBi), 2,5,8,11-tetra-tert-butyl perylene (TBPe), and Compound 15 below are examples of fluorescent blue dopants.

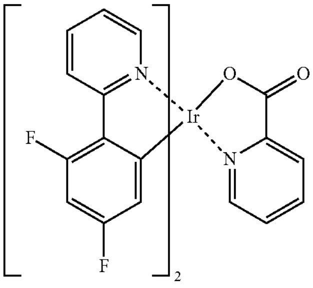

F$_2$Irpic

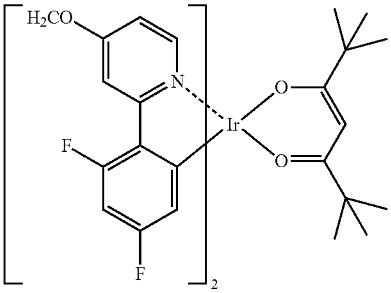

(F$_2$ppy)$_2$Ir(tmd)

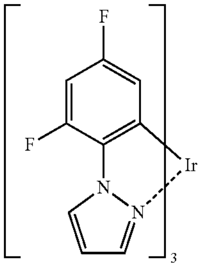

Ir(dfppz) 3

-continued

Compound 15

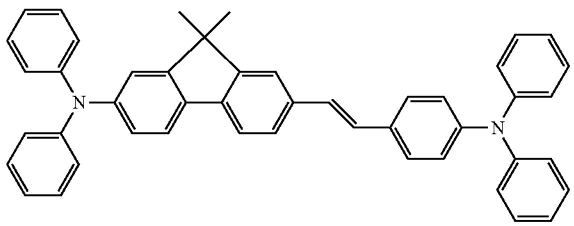

The amount of the dopant may be in the range of about 0.01 to about 50 parts by weight, based on 100 parts by weight of the host. Alternatively, the emission layer may consist of a light-emitting polymer. The EML may have a thickness of about 10 nm to about 100 nm, for example, about 20 nm to about 60 nm. When the thickness of the EML is within this range, the EML may have excellent light emission, without a substantial increase in driving voltage.

In a preferred embodiment, the electron injection layer according to the invention is contacting sandwiched between the emission layer comprising a light-emitting polymer and the first cathode electrode layer.

Hole Blocking Layer (HBL)

When the EML comprises a phosphorescent dopant, a hole blocking layer (HBL) may be formed on the EML, by using vacuum deposition, spin coating, slot-die coating, printing, casting, LB deposition, or the like, in order to prevent the diffusion of triplet excitons or holes into the ETL.

Hole blocking layer that can be suitable used for the OLED of the present invention are described in US2015207093A and US2015060794A, and fully incorporated by reference.

When the HBL is formed using vacuum deposition or spin coating, the conditions for deposition and coating may be similar to those for the formation of the HIL. However, the conditions for deposition and coating may vary, according to the compound that is used to form the HBL. Any compound that is commonly used to form a HBL may be used. Examples of compounds for forming the HBL include an oxadiazole derivative, a triazole derivative, a triazine derivative, an acridine derivative, and a phenanthroline derivative.

If the hole blocking layer has a high triplet level, it may also be described as triplet control layer. The function of the triplet control layer is to reduce quenching of triplets if a phosphorescent green or blue emission layer is used. Thereby, higher efficiency of light emission from a phosphorescent emission layer can be achieved. The triplet control layer is selected from a heteroaryl compound with a triplet level above the triplet level of the phosphorescent emitter in the adjacent emission layer.

The first hole blocking layer may be formed on the first emission layer.

The second hole blocking layer may be formed on the second emission layer.

The HBL may have a thickness of about 5 nm to about 100 nm, for example, about 10 nm to about 30 nm. When the thickness of the HBL is within this range, the HBL may have excellent hole-blocking properties, without a substantial increase in driving voltage.

Charge Generation Layer

Charge generation layers (CGL) that can be suitable used for the OLED of the present invention are described in US 2012098012 A.

The charge generation layer is generally composed of a double layer. The charge generation layer can be a pn junction charge generation layer joining n-type charge generation layer and p-type charge generation layer. The pn junction charge generation layer generates charges or separates them into holes and electrons; and injects the charges into the individual light emission layer. In other words, the n-type charge generation layer provides electrons for the first light emission layer adjacent to the anode electrode while the p-type charge generation layer provides holes to the second light emission layer adjacent to the cathode electrode, by which luminous efficiency of an organic light emitting device incorporating multiple light emission layers can be further improved and at the same time, driving voltage can be lowered.

The p-type charge generation layer can be composed of metal or organic material doped with p-type dopant. Here, the metal can be one or an alloy consisting of two or more selected from a group consisting of Al, Cu, Fe, Pb, Zn, Au, Pt, W, In, Mo, Ni, and Ti. Also, p-type dopant and host used for organic material doped with the p-type can employ conventional materials. For example, the p-type dopant can be one selected from a group consisting of tetrafluore-7,7,8,8-tetracyanoquinodimethane (F4-TCNQ), derivative of tetracyanoquinodimethane, radialene derivative, iodine, FeCl3, FeF3, and SbCl5. Also, the host can be one selected from a group consisting of N,N'-di(naphthalen-1-yl)-N,N-diphenyl-benzidine (NPB), N,N'-diphenyl-N,N'-bis(3-methylphenyl)-1,1-biphenyl-4,4'-diamine (TPD) and N,N',N'-tetranaphthyl-benzidine (TNB).

The n-type charge generation layer can be composed of metal or organic material doped with n-type. The metal can be one selected from a group consisting of Li, Na, K, Rb, Cs, Mg, Ca, Sr, Ba, La, Ce, Sm, Eu, Tb, Dy, and Yb. Also, n-type dopant and host used for organic material doped with the n-type can employ conventional materials. For example, the n-type dopant can be alkali metal, alkali metal compound, alkali earth metal, or alkali earth metal compound. More specifically, the n-type dopant can be one selected from a group consisting of Cs, K, Rb, Mg, Na, Ca, Sr, Eu and Yb. The host material can be one selected from a group consisting of tris(8-hydroxyquinoline)aluminum, triazine, hydroxyquinoline derivative, benzazole derivative, and silole derivative.

In another preferred embodiment, the n-type charge generation layer is arranged adjacent to the electron transport layer. The n-type charge generation layer according to one embodiment may include compounds of the following Chemical Formula 16.

(16)

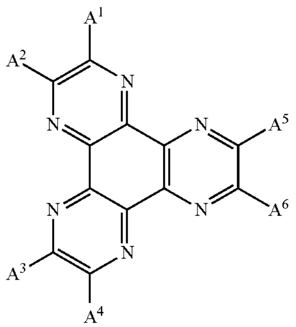

, wherein each of $A^1$ to $A^6$ may be hydrogen, a halogen atom, nitrile (—CN), nitro (—$NO_2$), sulfonyl (—$SO_2R$), sulfoxide (—SOR), sulfonamide (—$SO_2NR$), sulfonate (—$SO_3R$), trifluoromethyl (—$CF_3$), ester (—COOR), amide (—CONHR or —CONRR'), substituted or unsubstituted straight-chain or branched-chain C1-C12 alkoxy, substituted or unsubstituted straight-chain or branched-chain C1-C12 alkyl, substituted or unsubstituted straight-chain or branched chain C2-C12 alkenyl, a substituted or unsubstituted aromatic or non-aromatic heteroring, substituted or unsubstituted aryl, substituted or unsubstituted mono- or di-arylamine, substituted or unsubstituted aralkylamine, or the like.

Herein, each of the above R and R' may be substituted or unsubstituted $C_1$-$C_{60}$ alkyl, substituted or unsubstituted aryl, or a substituted or unsubstituted 5- to 7-membered heteroring, or the like.

Particularly preferred is an n-type charge generation layer comprising a compound of Formula (17)

(17)

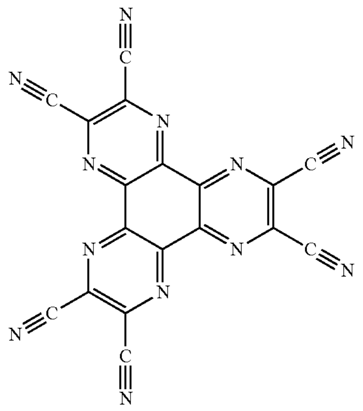

.

The p-type charge generation layer is arranged on top of the n-type charge generation layer. As the materials for the p-type charge generation layer, aryl amine-based compounds may be used. One embodiment of the aryl amine-based compounds includes compounds of the following Chemical Formula 18:

(18)

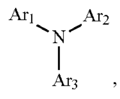

, wherein $Ar_1$, $Ar_2$ and $Ar_3$ are each independently hydrogen or a hydrocarbon group. Herein, at least one of $Ar_1$, $Ar_2$ and $Ar_3$ may include aromatic hydrocarbon substituents, and each substituent may be the same, or they may be composed of different substituents. When $Ar_1$, $Ar_2$ and $Ar_3$ are not aromatic hydrocarbons, they may be hydrogen; a straight-chain, branched-chain or cyclic aliphatic hydrocarbon; or a heterocyclic group including N, O, S or Se.

In another aspect of the present invention, the organic light emitting diode (100) further comprises an n-type CGL (185), a p-type CGL (135) and an ETL stack (160), wherein the ETL stack (160) comprises a first electron transport layer (160*a*) comprising a first organic matrix compound selected from organic phosphine compound and a second electron transport layer (160*b*) comprising a second organic matrix compound. Preferably, the organic phosphine compound is selected from the group of organic phosphine oxide, organic thioxophosphine compound and/or an organic selenoxophosphine compound, and the second organic matrix compound is selected from an organic compound with a dipole moment of about ≥0 Debye and about ≤2.5 Debye. In a particularly preferred embodiment, the electron injection layer (180) and the first electron transport layer (160) comprise the same organic phosphine compound. In a preferred embodiment, the n-type CGL comprises or consists of the first zero-valent metal.

Light-Emitting Diode (OLED)

According to another aspect of the present invention, there is provided an organic light-emitting diode (OLED) comprising: a substrate, an anode electrode a hole injection layer, a hole transport layer, optional an electron blocking layer, an emission layer, optional a hole blocking layer, optional an electron transport layer, an electron injection layer, and a first cathode electrode layer, wherein the layers are arranged in that order.

According to another aspect of the present invention, there is provided an organic light-emitting diode (OLED) comprising: a substrate, an anode electrode a first hole injection layer, a first hole transport layer, optional first electron blocking layer, a first emission layer, optional a first hole blocking layer, optional a first electron transport layer, an n-type charge generation layer, an p-type charge generation layer, a second hole transport layer, optional second electron blocking layer a second emission layer, optional a second hole blocking layer, optional a second electron transport layer, an electron injection layer, a first cathode electrode layer, and a second cathode electrode layer, wherein the layers are arranged in that order.

According to various embodiments of the OLED of the present invention, the OLED may not comprises an electron transport layer.

According to various embodiments of the OLED of the present invention, the OLED may not comprises an electron blocking layer.

According to various embodiments of the OLED of the present invention, the OLED may not comprises a hole blocking layer.

According to various embodiments of the OLED of the present invention, the OLED may not comprises a charge generation layer.

According to various embodiments of the OLED of the present invention, the OLED may not comprises a second emission layer.

Method of Manufacture

According to various embodiments of the present invention, the method may further include forming on a substrate an anode electrode a hole injection layer, a hole transport layer, optional an electron blocking layer, an emission layer, optional a hole blocking layer, optional an electron transport layer, an electron injection layer, and a first cathode electrode layer, wherein the layers are arranged in that order; or the layers can be deposited the other way around, starting with the first cathode electrode layer, and more preferred the first electron injection layer is be deposited before the first cathode electrode layer is deposited.

Particularly low operating voltage and/or high external quantum efficiency EQE may be achieved when the electron injection layer is deposited before the first cathode electrode layer.

According to various embodiments of the present invention, the method may further include forming on a substrate an anode electrode a first hole injection layer, a first hole transport layer, optional first electron blocking layer, a first emission layer, optional a first hole blocking layer, optional a first electron transport layer, an n-type charge generation layer, an p-type charge generation layer, a second hole transport layer, optional second electron blocking layer, a second emission layer, optional a second hole blocking layer, optional a second electron transport layer, an electron injection layer, a first cathode electrode layer, and a second cathode electrode layer, wherein the layers are arranged in that order; or the layers are deposited the other way around, starting with the second cathode electrode layer; and more preferred the second injection layer is be deposited before the first cathode electrode layer is deposited.

However, according to one aspect the layers are deposited the other way around, starting with the cathode electrode, and sandwiched between the cathode electrode and the anode electrode.

For example, starting with the first cathode electrode layer, electron injection layer, optional electron transport layer, optional hole blocking layer, emission layer, optional electron blocking layer, hole transport layer, hole injection layer, anode electrode, exactly in this order.

The anode electrode and/or the cathode electrode can be deposited on a substrate. Preferably the anode is deposited on a substrate.

According to another aspect of the present invention, there is provided a method of manufacturing an organic light-emitting diode (OLED), the method using:

- at least one deposition source, preferably two deposition sources and more preferred at least three deposition sources; and/or
- deposition via vacuum thermal evaporation; and/or
- deposition via solution processing, preferably the processing is selected from spin-coating, printing, casting and/or slot-die coating.

Electronic Device

Another aspect is directed to an electronic device comprising at least one organic light-emitting diode (OLED). A device comprising organic light-emitting diodes (OLED) is for example a display or a lighting panel.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the present invention will become apparent and more readily appreciated from the following description of the exemplary embodiments, taken in conjunction with the accompanying drawings, of which.

DETAILED DESCRIPTION

Figure 1:
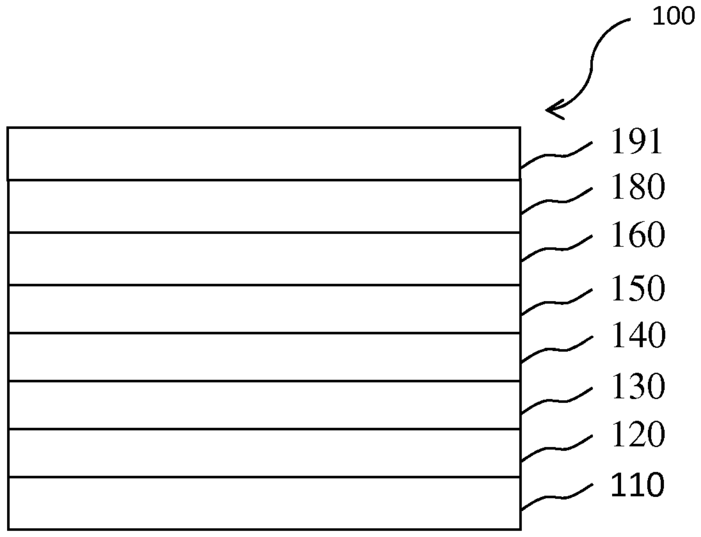
FIG. 1 is a schematic sectional view of an organic light-emitting diode (OLED), according to an exemplary embodiment of the present invention.

Reference will now be made in detail to the exemplary embodiments of the present invention, examples of which are illustrated in the accompanying drawings, wherein like reference numerals refer to the like elements throughout. The exemplary embodiments are described below, in order to explain the aspects of the present invention, by referring to the figures.

Herein, when a first element is referred to as being formed or disposed "on" a second element, the first element can be disposed directly on the second element, or one or more other elements may be disposed there between. When a first element is referred to as being formed or disposed "directly on" a second element, no other elements are disposed there between.

FIG. 1 is a schematic sectional view of an organic light-emitting diode (OLED) 100, according to an exemplary embodiment of the present invention. The OLED 100 includes a substrate 110, an anode electrode 120, a hole injection layer (HIL) 130, a hole transport layer (HTL) 140, an emission layer (EML) 150, an electron transport layer (ETL) 160. Onto the electron transport layer (ETL) 160 an electron injection layer (EIL) 180 is disposed. The electron injection layer (EIL) 180 comprising or consisting of an organic phosphine compound selected from the group of organic phosphine oxide compound or an organic thioxophosphine compound or an organic selenoxophosphine compound, wherein the electron injection layer (EIL) 180 is formed directly on the ETL 160. The first cathode electrode layer 191 is disposed directly onto the electron injection layer (EIL) 180.

Instead of a single electron transport layer 160, optional an electron transport layer stack (ETL) can be used.

Figure 2:
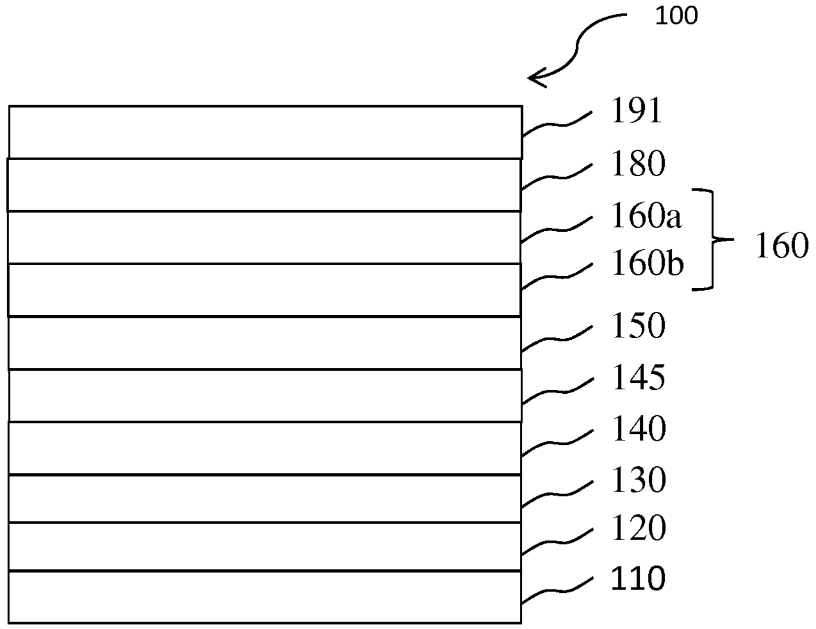
FIG. 2 is a schematic sectional view of an OLED, according to an exemplary embodiment of the present invention.

FIG. 2 is a schematic sectional view of an OLED 100, according to another exemplary embodiment of the present invention. FIG. 2 differs from FIG. 1 in that the OLED 100 of FIG. 2 comprises an electron blocking layer (EBL) 145 and an electron transport layer stack (ETL stack) 160.

Referring to FIG. 2 the OLED 100 includes a substrate 110, an anode electrode 120, a hole injection layer (HIL) 130, a hole transport layer (HTL) 140, an electron blocking layer (EBL) 145, an emission layer (EML) 150, an electron transport layer stack (ETL) 160 and an electron injection layer (EIL 180). The ETL stack 160 comprises a first electron transport layer (ETL1) **160*a* and a second electron transport layer (ETL2) 160*b*. The second electron transport layer 160*b* is disposed directly on the emission layer 150. The first electron transport layer 160*a* is disposed directly on the second electron transport layer. The electron injection layer (EIL) 180 comprising or consisting of an organic phosphine compound selected from the group of an organic phosphine oxide compound or an organic thioxophosphine compound or an organic selenoxophosphine compound, is disposed directly on the first electron transport layer 160*a*. The first cathode electrode layer 191 is disposed directly onto the electron injection layer (EIL) 180**.

Figure 3:
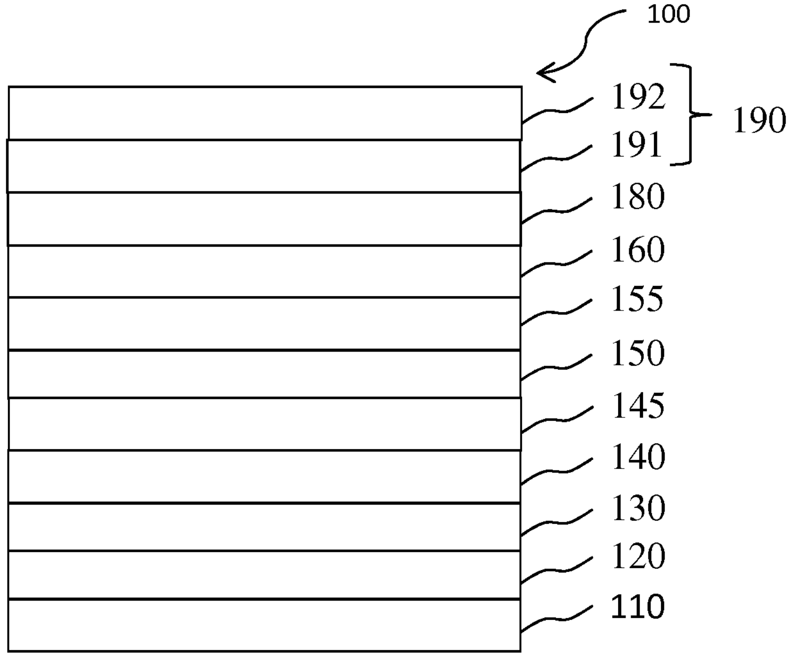
FIG. 3. is a schematic sectional view of an OLED, according to another exemplary embodiment of the present invention.

FIG. 3 is a schematic sectional view of an OLED 100, according to another exemplary embodiment of the present invention. FIG. 3 differs from FIG. 1 in that the OLED 100 of FIG. 2 comprises an electron blocking layer (EBL) 145, a hole blocking layer (HBL) 155 and a second cathode electrode layer 192.

Referring to FIG. 3 the OLED 100 includes a substrate 110, an anode electrode 120, a hole injection layer (HIL) 130, a hole transport layer (HTL) 140, an electron blocking layer (EBL) 145, an 181 (EML) 150, a hole blocking layer (HBL) 155, an electron transport layer (ETL) 160 and an electron injection layer (EIL) 180. The electron injection layer (EIL) 180 comprising or consisting of an organic phosphine compound selected from the group of an organic phosphine oxide compound or an organic thioxophosphine compound or an organic selenoxophosphine compound, wherein the electron injection layer (EIL) 180 is disposed directly on the ETL 160. The first cathode electrode layer 191 is disposed directly onto the electron injection layer (EIL) 180. The second cathode electrode layer 192 is disposed directly onto the first cathode electrode layer 191. The first and second cathode electrode layer together form the cathode electrode 190.

In the description above the method of manufacture an OLED 100 of the present invention is started with a substrate 110 onto which an anode electrode 120 is formed, on the anode electrode 120, an hole injection layer 130, hole transport layer 140, optional an electron blocking layer 145, an emission layer 150, optional a hole blocking layer 155, optional at least one electron transport layer 160, an electron injection layer 180, a first cathode electrode layer 191 and an optional second cathode electrode layer 192 are formed, in that order or the other way around.

Figure 4:
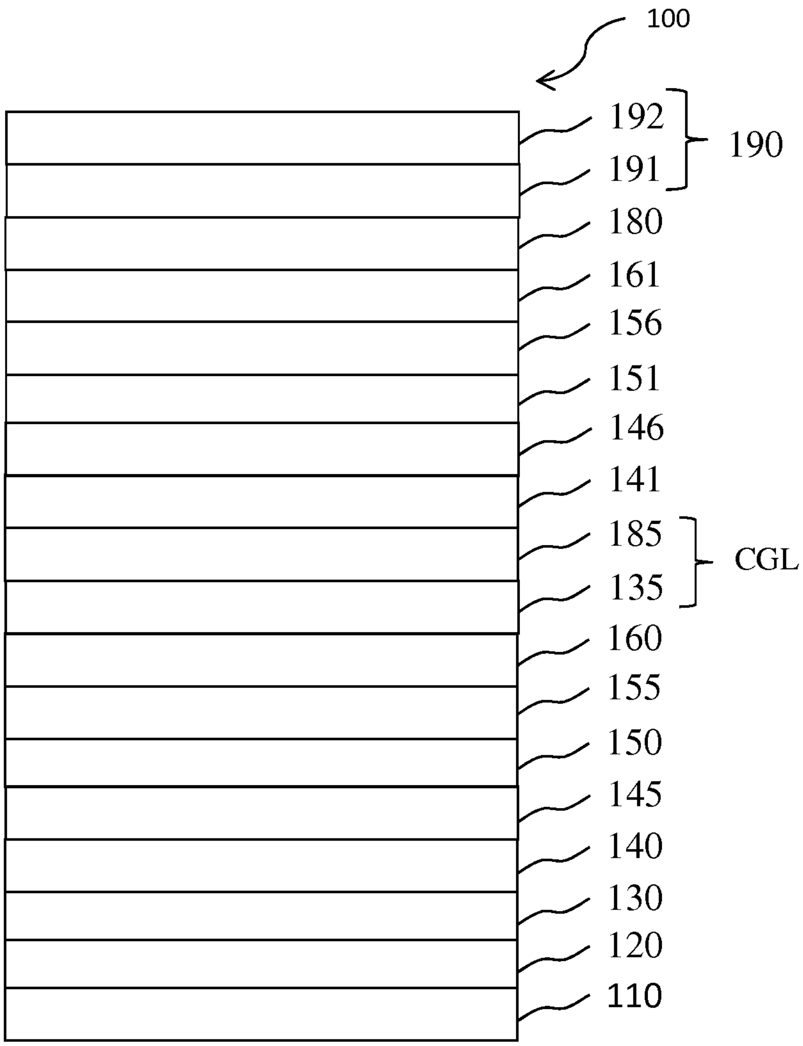
FIG. 4 is a schematic sectional view of a tandem OLED comprising a charge generation layer, according to an exemplary embodiment of the present invention.

FIG. 4 is a schematic sectional view of a tandem OLED 100, according to another exemplary embodiment of the present invention. FIG. 4 differs from FIG. 2 in that the OLED 100 of FIG. 4 further comprises a charge generation layer and a second emission layer.

Referring to FIG. 4 the OLED 200 includes a substrate 110, an anode electrode 120, a first hole injection layer (HIL) 130, a first hole transport layer (HTL) 140, a first electron blocking layer (EBL) 145, a first emission layer (EML) 150, a first hole blocking layer (HBL) 155, a first electron transport layer (ETL) 160, an n-type charge generation layer (n-type CGL) 185, a p-type charge generation layer (p-type GCL) 135, a second hole transport layer (HTL) 141, a second electron blocking layer (EBL) 146, a second emission layer (EML) 151, a second hole blocking layer (EBL) 156, a second electron transport layer (ETL) 161, an electron injection layer (EIL) 180, a first cathode electrode layer 191 and a second cathode electrode layer 192. The electron injection layer 180 comprising or consisting of an organic phosphine compound selected from the group of organic phosphine oxide compound or an organic thioxophosphine compound or an organic selenoxophosphine compound is disposed directly onto the second electron transport layer 161 and the first cathode electrode layer 191 is disposed directly onto the electron injection layer 180.

In the description above the method of manufacture an OLED 100 of the present invention is started with a substrate 110 onto which an anode electrode 120 is formed, on the anode electrode 120, a first hole injection layer 130, first hole transport layer 140, optional a first electron blocking layer 145, a first emission layer 150, optional a first hole blocking layer 155, optional an ETL stack 160, comprising a first electron transport layer 160*a* and a second electron transport layer 160*b*, an n-type CGL 185, a p-type CGL 135, a second hole transport layer 141, optional a second electron blocking layer 146, a second emission layer 151, an optional second hole blocking layer 156, an optional at least one second electron transport layer 161, an electron injection layer 180, a first cathode electrode layer 191 and an optional second cathode electrode layer 192 are formed, in that order or the other way around.

Figure 5:
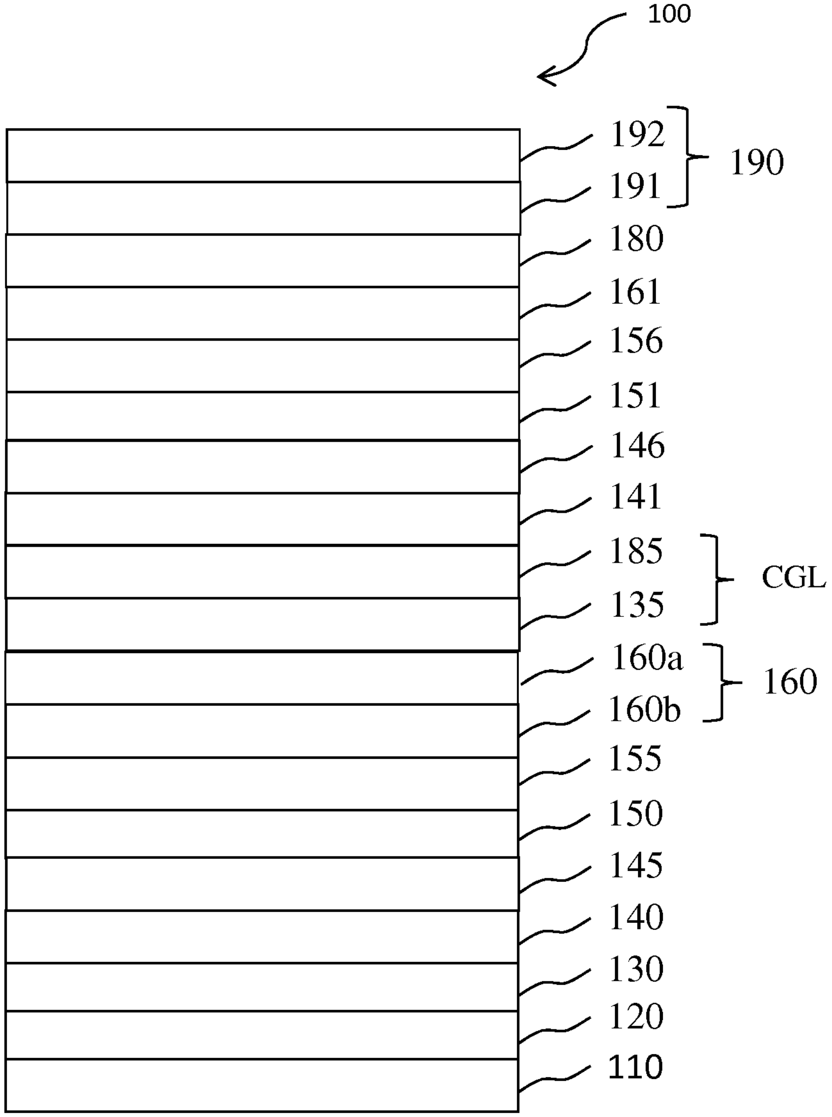
FIG. 5 is a schematic sectional view of a tandem OLED comprising a charge generation layer and an ETL stack, according to an exemplary embodiment of the present invention

FIG. 5 is a schematic sectional view of a tandem OLED 100, according to another exemplary embodiment of the present invention. FIG. 5 differs from FIG. 4 in that the OLED 100 of FIG. 5 further comprises an ETL stack 160.

Referring to FIG. 5 the OLED 200 includes a substrate 110, an anode electrode 120, a first hole injection layer (HIL) 130, a first hole transport layer (HTL) 140, a first electron blocking layer (EBL) 145, a first emission layer (EML) 150, a first hole blocking layer (HBL) 155, an ETL stack (ETL) 160, an n-type charge generation layer (n-type CGL) 185, a p-type charge generation layer (p-type GCL) 135, a second hole transport layer (HTL) 141, a second electron blocking layer (EBL) 146, a second emission layer (EML) 151, a second hole blocking layer (EBL) 156, a third electron transport layer (ETL) 161, an electron injection layer (EIL) 180, a first cathode electrode layer 191 and a second cathode electrode layer 192. The ETL stack 160 comprises a first electron transport layer (ETL1) 160*a* and a second electron transport layer (ETL2) 160*b*. The second electron transport layer 160*b* is disposed directly on the first emission layer 150. The first electron transport layer 160*a* is disposed directly on the second electron transport layer 160*b*. The electron injection layer 180 comprising or consisting of an organic phosphine compound selected from the group of organic phosphine oxide compound or an organic thioxophosphine compound or an organic selenoxophosphine compound is disposed directly onto the second electron transport layer 161 and the first cathode electrode layer 191 is disposed directly onto the electron injection layer 180.

While not shown in FIG. 1, FIG. 2, FIG. 3, FIG. 4 and FIG. 5, a sealing layer may further be formed on the cathode electrodes 190, in order to seal the OLEDs 100 and 200. In addition, various other modifications may be applied thereto.

Figure 6:
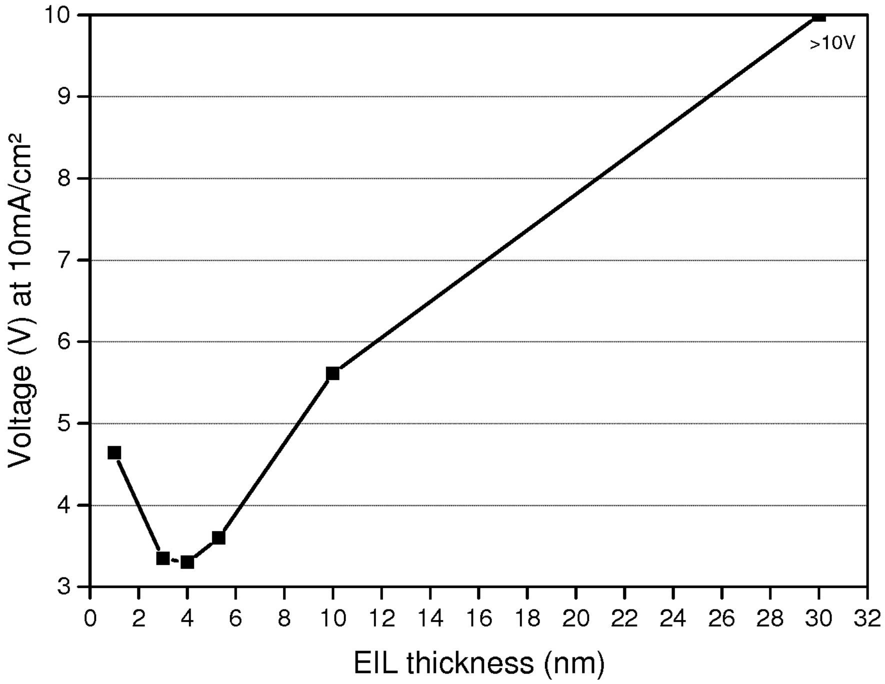
FIG. 6 is a graph showing the operating voltage of an OLED according to invention plotted against the layer thickness of the electron injection layer according to invention.

FIG. 6 shows the effect of the thickness of the electron injection layer (EIL) according to invention on the operating voltage of a fluorescent blue OLED. Organic phosphine compound (Va) is used as electron injection layer with a thickness ranging from 1 to 10 nm. 2 nm Yb is used as first cathode electrode layer. 100 nm Al is used as second cathode electrode layer. The electron injection layer is contacting sandwiched between an electron transport layer and the first cathode electrode layer. The electron transport layer comprises non-polar anthracene compound ETM-1 and the thickness is 34 nm. The emission layer comprises 97 wt.-% of ABH113 (Sun Fine Chemicals) as a host and 3 wt.-% of NUBD370 (Sun Fine Chemicals) as a fluorescent blue dopant. The lowest operating voltage is achieved for an EIL thickness of more than 1 nm and less than 6 nm. A thickness range of ≥1 nm and ≤5 nm is particularly preferred. The lowest operating voltage is observed for an EIL thickness of 3 to 4 nm.

EXAMPLES

Organic phosphine compounds may be synthesized as described in JP2004095221, US 20030144487, WO2015/097225A1 and EP15195877.

General Procedure

Bottom Emission Devices with an Evaporated Emission Layer

For bottom emission devices—Examples 1 to 10 and comparative examples 1 to 2, a 15 Ω/$cm^2$ glass substrate (available from Corning Co.) with 100 nm ITO was cut to a size of 50 mm×50 mm×0.7 mm, ultrasonically cleaned with isopropyl alcohol for 5 minutes and then with pure water for 5 minutes, and cleaned again with UV ozone for 30 minutes, to prepare a first electrode.

Then, 92 wt.-% of Biphenyl-4-yl(9,9-diphenyl-9H-fluoren-2-yl)-[4-(9-phenyl-9H-carbazol-3-yl)phenyl]-amine and 8 wt.-% of 2,2',2"-(cyclopropane-1,2,3-triylidene)tris(2-(p-cyanotetrafluorophenyl)acetonitrile) was vacuum deposited on the ITO electrode, to form a HIL having a thickness of 10 nm. Then Biphenyl-4-yl(9,9-diphenyl-9H-fluoren-2-yl)-[4-(9-phenyl-9H-carbazol-3-yl)phenyl]-amine was vacuum deposited on the HIL, to form a HTL having a thickness of 120 nm. 97 wt.-% of ABH113 (Sun Fine Chemicals) as a host and 3 wt.-% of NUBD370 (Sun Fine Chemicals) as a dopant were deposited on the HTL, to form a blue-emitting EML with a thickness of 20 nm.

Then, the electron transport layer is formed by deposing a first organic matrix compound according to examples 1 to 10 and comparative example 1 and 2 by deposing the compound from a first deposition source directly on the EML. Further, the thickness d (in nm) of the ETL can be taken from Table 8.

Then, the electron injection layer is formed by deposing an organic phosphine compound according to example 1 to 10 and comparative examples 1 and 2 directly on the electron transport layer. The composition and thickness of the electron injection layer can be taken from Table 8.

For comparative example 2, a 0.4 nm thick layer of LiF is deposited on the electron injection layer, thereby forming a second electron injection layer.

The first cathode electrode layer is evaporated at ultra-high vacuum of $10^{-7}$ mbar. Therefore, a thermal single co-evaporation of one or several metals is performed with a rate of 0.1 to 10 nm/s (0.01 to 1 Å/s) in order to generate a homogeneous cathode electrode with a thickness of 5 to 1000 nm. Then, the optional second cathode electrode layer is deposed directly on to the first cathode electrode layer under the same conditions. The composition and thickness of the first and second cathode electrode layer can be taken from Table 8.

The OLED stack is protected from ambient conditions by encapsulation of the device with a glass slide. Thereby, a cavity is formed, which includes a getter material for further protection.

Bottom Emission Devices with a Solution-Processed Emission Layer

For bottom emission devices, a glass substrate with 100 nm Ag was cut to a size of 50 mm×50 mm×0.7 mm, ultrasonically cleaned with isopropyl alcohol for 5 minutes and then with pure water for 5 minutes, and cleaned again with UV ozone for 30 minutes, to prepare a first electrode.

Then, PEDOT:PSS (Clevios P VP AI 4083) is spin-coated directly on top of the first electrode to form a 55 nm thick HIL. The HIL is baked on hotplate at 150° C. for 5 min. Then, a light-emitting polymer, for example MEH-PPV, is spin-coated directly on top of the HIL to form a 40 nm thick EML. The EML is baked on a hotplate at 80° C. for 10 min. The device is transferred to an evaporation chamber and the following layers are deposited in high vacuum.

Organic phosphine compound (Vr) is deposed directly on top of the EML to form an EIL with a thickness of 4 nm. A first cathode electrode layer is formed by depositing a 2 nm thick layer of ytterbium directly on top of the EIL. A second cathode electrode layer is formed by deposing a 100 nm thick layer of aluminium directly on top of the first cathode electrode layer.

Top Emission Devices

For top emission devices—Examples 11 to 15, the anode electrode was formed from 100 nm silver on glass which is prepared by the same methods as described above.

Then, 92 wt.-% of biphenyl-4-yl(9,9-diphenyl-9H-fluoren-2-yl)-[4-(9-phenyl-9H-carbazol-3-yl)phenyl]-amine (CAS 1242056-42-3) and 8 wt.-% of 2,2',2"-(cyclopropane-1,2,3-triylidene)tris(2-(p-cyanotetrafluorophenyl)acetonitrile) is vacuum deposited on the ITO electrode, to form a HIL having a thickness of 10 nm. Then biphenyl-4-yl(9,9-diphenyl-9H-fluoren-2-yl)-[4-(9-phenyl-9H-carbazol-3-yl)phenyl]-amine (CAS 1242056-42-3) is vacuum deposited on the HIL, to form a HTL having a thickness of 125 nm. Then N,N-bis(4-(dibenzo[b,d]furan-4-yl)phenyl)-[1,1':4',1"-terphenyl]-4-amine is deposed directly on top of the HTL to form an EBL with a thickness of 5 nm.

97 wt.-% of 2-(10-phenyl-9-anthracenyl)-benzo[b]naphtho[2,3-d]furan as a host and 3 wt.-% of NUBD370 (Sun Fine Chemicals) as a dopant are deposited on the EBL, to form a blue-emitting EML with a thickness of 20 nm.

Then the electron transport layer is formed by deposing a first organic matrix compound according to examples 10 to 15 by deposing the compound from a first deposition source directly on the EML. Further, the thickness d (in nm) of the ETL can be taken from Table 9.

Then, the electron injection layer according to the invention is formed by deposing an organic phosphine compound according to examples 11 to 15 directly on the electron transport layer. The composition and thickness of the electron injection layer can be taken from Table 9.

The first cathode electrode layer is evaporated at ultra-high vacuum of $10^{-7}$ mbar. Therefore, a thermal single co-evaporation of one or several metals is performed with a rate of 0.1 to 10 nm/s (0.01 to 1 Å/s) in order to generate a homogeneous cathode electrode with a thickness of 5 to 1000 nm. Then, the optional second cathode electrode layer is deposed directly on to top of the first cathode electrode layer under the same conditions. The composition and thickness of the first and second cathode electrode layer can be taken from Table 9.

60 nm biphenyl-4-yl(9,9-diphenyl-9H-fluoren-2-yl)-[4-(9-phenyl-9H-carbazol-3-yl)phenyl]-amine (CAS 1242056-42-3) is deposed directly on top of the second cathode electrode layer.

The OLED stack is protected from ambient conditions by encapsulation of the device with a glass slide. Thereby, a cavity is formed, which includes a getter material for further protection.

To assess the performance of the inventive examples compared to the prior art, the current efficiency is measured under ambient conditions (20° C.). Current voltage measurements are performed using a Keithley 2400 sourcemeter, and recorded in V. At 10 $mA/cm^2$ for bottom emission and 10 $mA/cm^2$ for top emission devices, a calibrated spectrometer CAS140 from Instrument Systems is used for measurement of CIE coordinates and brightness in Candela. Lifetime LT of bottom emission device is measured at ambient conditions (20° C.) and 10 $mA/cm^2$, using a Keithley 2400 sourcemeter, and recorded in hours. Lifetime LT of top emission device is measured at ambient conditions (20° C.) and 8 $mA/cm^2$. The brightness of the device is measured using a calibrated photo diode. The lifetime LT is defined as the time till the brightness of the device is reduced to 97% of its initial value.

In bottom emission devices, the emission is predominately Lambertian and quantified in percent external quantum efficiency (EQE). To determine the efficiency EQE in % the light output of the device is measured using a calibrated photodiode at 10 mA/cm2.

In top emission devices, the emission is forward directed, non-Lambertian and also highly dependent on the micro-cavity. Therefore, the efficiency EQE will be higher compared to bottom emission devices. To determine the efficiency EQE in % the light output of the device is measured using a calibrated photodiode at 10 mA/cm2.

Technical Effect of the Invention a) Bottom emission device with fluorescent blue emission layer, electron transport layer and electron injection layer The beneficial effect of the electron injection layer according to the invention on the performance of bottom emission devices can be seen in Table 8.

An electron transport layer comprising an anthracene compound as first organic matrix compound is used in Example 1 to 10 and in comparative examples 1 and 2. The anthracene compounds may have a dipole moment of ≥0 Debye and ≤2.5 Debye, see Table 5.

In comparative example 1, the electron injection layer comprising organic phosphine oxide compound (Vr) is in direct contact with the aluminium cathode electrode. The operating voltage is very high at 4.7 V.

In comparative example 2, the electron injection layer comprising organic phosphine oxide compound (Vr) is in direct contact with a thin layer of LiF. The LiF layer is contacting sandwiched between the electron injection layer and the aluminium cathode electrode. The operating voltage is 3.2 V and thereby significantly lower than in comparative example 1. However, this improvement in operating voltage is achieved by using toxic and thermally unstable LiF.

In example 1, the electron injection layer comprising organic phosphine oxide compound (Vr) is in direct contact with a first cathode electrode layer of 0.4 nm layer of lithium and a second cathode electrode layer of 100 nm aluminium. The operating voltage is 3.3 V and therefore comparable to comparative example 2. However, this very low operating voltage is achieved by using lithium instead of LiF. Lithium is thermally stable and, additionally, it is not a toxic compound and therefore can be easily handled in manufacturing processes. Additionally, the operating voltage is significantly lower than in comparative example 1, where high workfunction metal aluminium is used. Lithium has a workfunction of 2.95 eV while aluminium has a workfunction of 4.3 eV. Therefore, the workfunction of lithium is significantly lower than the workfunction of aluminium and it is therefore easier to inject electrons from a lithium layer into the electron injection layer comprising a phosphine compound.

In example 2, a first cathode electrode layer of 2 nm ytterbium is used in place of lithium. The operating voltage is unchanged. The same operating voltage is obtained in example 3, where barium is used to form the first cathode electrode layer. Ytterbium and barium have a workfunction which is lower than the workfunction of aluminium.

In example 4 to 10, various electron injection layers comprising an organic phosphine compound of formula (Ia) are tested. In all examples the first cathode electrode layer is formed from 2 nm ytterbium and the second cathode electrode layer is formed from 100 nm aluminium.

In example 4 to 6, the electron injection layer comprises an organic phosphine compound of formula (II). The operating voltage is 3.3 and 3.4 V.

In example 7 to 10, the electron injection layer comprises an organic phosphine compound of formula (III). The operating voltage is between 3.2 and 3.4 V.

In summary, a wide range of organic phosphine compounds can be used in the electron injection layer according to the invention.

TABLE 8

Bottom emission device comprising an emission layer, electron transport layer (ETL), electron injection layer comprising an organic phosphine compound and a cathode electrode comprising a first cathode electrode layer and optionally a second cathode electrode layer

| | ETL | d (ETL)/ nm | EIL1 | d (EIL1)/ nm | EIL2 | d (EIL1)/ nm | Cathode electrode layer 1 | d (cathode electrode layer 1)/nm | Cathode electrode layer 2 | d (cathode electrode layer 2)/ nm | U at 10 mA/ $cm^2$/V |
|---|---|---|---|---|---|---|---|---|---|---|---|
| Comparative example 1 | ADN | 36 | Compound (Vr) | 4 | — | — | Al | 100 | — | — | 4.7 |
| Comparative example 2 | ADN | 36 | Compound (Vr) | 4 | LiF | 0.4 | Al | 100 | — | — | 3.2 |
| Example 1 | ETM-1 | 34 | Compound (Vr) | 4 | — | — | Li | 0.4 | Al | 100 | 3.3 |
| Example 2 | ETM-1 | 34 | Compound (Vr) | 4 | — | — | Yb | 2 | Al | 100 | 3.3 |
| Example 3 | ETM-1 | 34 | Compound (Vr) | 4 | — | — | Ba | 2 | Al | 100 | 3.2 |
| Example 4 | ETM-1 | 34 | Compound (Va) | 4 | — | — | Yb | 2 | Al | 100 | 3.35 |
| Example 5 | ETM-1 | 34 | Compound (Vb) | 4 | — | — | Yb | 2 | Al | 100 | 3.3 |
| Example 6 | ETM-1 | 34 | Compound (Vd) | 4 | — | — | Yb | 2 | Al | 100 | 3.4 |
| Example 7 | ETM-1 | 34 | Compound (Vf) | 4 | — | — | Yb | 2 | Al | 100 | 3.3 |
| Example 8 | ETM-1 | 34 | Compound (Vj) | 4 | — | — | Yb | 2 | Al | 100 | 3.2 |
| Example 9 | ETM-1 | 34 | Compound (Vq) | 4 | — | — | Yb | 2 | Al | 100 | 3.4 |
| Example 10 | ETM-1 | 34 | Compound (Vl) | 4 | — | — | Yb | 2 | Al | 100 | 3.3 |

b) Top emission device with fluorescent blue emission layer, electron transport layer and electron injection layer The beneficial effect of the electron injection layer according to the invention on the performance of top emission devices can be seen in Table 9.

The electron injection layer comprising organic phosphine compound (Vr) is in direct contact with a first cathode electrode layer which consists of 2 nm ytterbium. In example 11 and 12, the second cathode electrode layer consists of 11 nm Ag. In example 13 to 15, the second cathode electrode layer consists of 13 nm MgAg alloy (15:85 vol.-%).

An electron transport layer is used in examples 11 to 15. The electron transport layer comprises a first organic matrix compound with a dipole moment of ≥0 Debye and ≤2.5 Debye, see Table 9. In examples 11 and 13 to 15, triazine compound ETM-28 is used. In example 12, dibenzo[c,h] acridine compound ETM-15 is used.

In all examples, the operating voltage is very low at 3.2 to 3.3 V, the external quantum efficiency is very high at 15.5 to 16.5% EQE and the lifetime is high at 44 to 60 hours see Table 9.

TABLE 9

Top emission device comprising an emission layer, electron transport layer (ETL), electron injection layer comprising an organic phosphine compound and a cathode electrode comprising a first cathode electrode layer and a second cathode electrode layer

| | ETL | d (ETL)/ nm | EIL | d (EIL)/ nm | Cathode electrode layer 1 | d (cathode electrode layer 1)/ nm | Cathode electrode layer 2 | d (cathode electrode layer 2)/ nm | U at 10 mA/ $cm^2$/V | EQE at 10 mA/ $cm^2$/% | LT at 8 mA/ $cm^2$/h |
|---|---|---|---|---|---|---|---|---|---|---|---|
| Example 11 | ETM-28 | 29 | Compound (Vr) | 4 | Yb | 2 | Ag | 11 | 3.3 | 16.5 | 44 |
| Example 12 | ETM-15 | 29 | Compound (Vr) | 4 | Yb | 2 | Ag | 11 | 3.2 | 15.6 | 46 |
| Example 13 | ETM-28 | 29 | Compound (Vd) | 4 | Yb | 2 | Mg:Ag (15:85 vol.-%) | 13 | 3.2 | 15.5 | 60 |
| Example 14 | ETM-28 | 29 | Compound (Vq) | 4 | Yb | 2 | Mg:Ag (15:85 vol.-%) | 13 | 3.2 | 15.5 | 60 |
| Example 15 | ETM-28 | 29 | Compound (Vr) | 4 | Yb | 2 | Mg:Ag (15:85 vol.-%) | 13 | 3.3 | 16 | 50 |

From the foregoing detailed description and examples, it will be evident that modifications and variations can be made to the compositions and methods of the invention without departing from the spirit and scope of the invention. Therefore, it is intended that all modifications made to the invention without departing from the spirit and scope of the invention come within the scope of the appended claims.

The invention claimed is:

1. Organic light emitting diode comprising at least one emission layer, an electron injection layer and at least one cathode electrode, wherein:

the electron injection layer comprises an organic phosphine compound, wherein the electron injection layer is free of a metal, metal salt, metal complex and metal organic compound;

the cathode electrode comprises at least a first cathode electrode layer and at least a second cathode electrode layer, wherein the first cathode electrode layer comprises a first zero-valent metal selected from Yb; and the composition of the first cathode electrode layer differs from the composition of the second cathode electrode layer, wherein the second cathode electrode layer comprises at least an additional metal, wherein the additional metal is an MgAg alloy; and wherein the electron injection layer is arranged in direct contact to the first cathode electrode layer;

the first cathode electrode layer does not comprise or consist of an organic compound;

the organic light emitting diode is a top emission device; and the organic phosphine compound of the electron injection layer is a compound having the Formula Ia:

Formula (Ia)

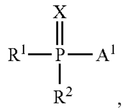

wherein:

X is selected from O, S, or Se;

$R^1$ and $R^2$ are independently selected from $C_1$ to $C_{12}$ alkyl, substituted or unsubstituted $C_6$ to $C_{20}$ aryl or substituted or unsubstituted $C_5$ to $C_{20}$ heteroaryl; or $R^1$ and $R^2$ are bridged with an alkene-di-yl group forming with the P atom a substituted or unsubstituted five, six or seven membered ring; and $A^1$ is phenyl or selected from Formula (II):

Formula (II)

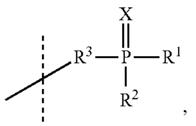

wherein $R^3$ is selected from $C_1$ to $C_8$ alkane-di-yl, substituted or unsubstituted $C_6$ to $C_{20}$ arylene, or substituted or unsubstituted $C_5$ to $C_{20}$ heteroarylene; or $A^1$ is selected from Formula (III)

Formula (III)

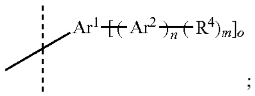

wherein n is selected from 0 or 1;

m is selected from 1 or 2;

o is selected from 1 or 2;

and m is 1 if o is 2;

$Ar^1$ is selected from substituted or unsubstituted $C_6$ to $C_{20}$ arylene and substituted or unsubstituted $C_5$ to $C_{20}$ heteroarylene;

$Ar^2$ is selected from substituted or unsubstituted $C_{18}$ to $C_{40}$ arylene and substituted or unsubstituted $C_{10}$ to $C_{40}$ heteroarylene;

$R^4$ is selected from H, $C_1$ to $C_{12}$ alkyl, substituted or unsubstituted $C_6$ to $C_{20}$ aryl and substituted or unsubstituted $C_5$ to $C_{20}$ heteroaryl.

2. The organic light emitting diode according to claim 1, wherein the first cathode electrode layer is free of a metal halide and/or free of a metal organic complex.

3. The organic light emitting diode according to claim 1, further comprising at least one electron transport layer comprising at least one matrix compound, wherein the electron injection layer is contacting sandwiched between the first cathode electrode layer and the electron transport layer.

4. The organic light emitting diode according to claim 1, wherein $Ar^1$ is selected from substituted $C_6$ to $C_{20}$ arylene, and/or substituted $C_5$ to $C_{20}$ heteroarylene, wherein the $C_6$ to $C_{20}$ arylene, and/or $C_5$ to $C_{20}$ heteroarylene is substituted with at least one $C_1$ to $C_{12}$ alkyl and/or at least one $C_1$ to $C_{12}$ heteroalkyl group;

$Ar^2$ is selected from substituted $C_{18}$ to $C_{40}$ arylene and/or substituted $C_{10}$ to $C_{40}$ heteroarylene, wherein the $C_{18}$ to $C_{40}$ arylene and/or $C_{10}$ to $C_{40}$ heteroarylene is substituted with at least one $C_1$ to $C_{12}$ alkyl and/or at least one $C_1$ to $C_{12}$ heteroalkyl group.

5. The organic light emitting diode according to claim 1, wherein:

$R^1$ and $R^2$ are independently selected from substituted $C_6$ to $C_{20}$ aryl, or substituted $C_5$ to $C_{20}$ heteroaryl, wherein the $C_6$ to $C_{20}$ aryl, and/or $C_5$ to $C_{20}$ heteroaryl is substituted with at least one $C_1$ to $C_{12}$ alkyl and/or at least one $C_1$ to $C_{12}$ heteroalkyl group; and/or $R^3$ is independently selected from substituted $C_6$ to $C_{20}$ arylene, or substituted $C_5$ to $C_{20}$ heteroarylene, wherein the $C_6$ to $C_{20}$ arylene, and/or $C_5$ to $C_{20}$ heteroarylene is substituted with at least one $C_1$ to $C_{12}$ alkyl and/or at least one $C_1$ to $C_{12}$ heteroalkyl group; and/or $R^4$ is independently selected from substituted $C_6$ to $C_{20}$ aryl, or substituted $C_5$ to $C_{20}$ heteroaryl, wherein the $C_6$ to $C_{20}$ aryl, and/or Cs to $C_{20}$ heteroaryl is substituted with at least one $C_1$ to $C_{12}$ alkyl and/or at least one $C_1$ to $C_{12}$ heteroalkyl group.

6. The organic light emitting diode according to claim 1, wherein for o=2 the organic phosphine compound of the electron injection layer is a compound having the Formula Ib:

(Ib)

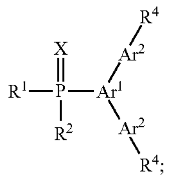

or o=1 the organic phosphine compound of the electron injection layer is a compound having the Formula Ic, Id, Ie or If:

(Ic)

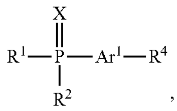

, (Id)

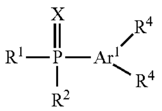

, (Ie)

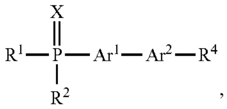

, or (If)

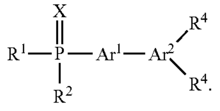

7. The organic light emitting diode according to claim 1, wherein $R^1$ and $R^2$ is independently selected from $C_1$ to $C_4$ alkyl, unsubstituted or substituted $C_6$ to $C_{10}$ aryl, or unsubstituted or substituted $C_5$ to $C_{10}$ heteroaryl, wherein the $C_6$ to $C_{10}$ aryl, and/or $C_5$ to $C_{10}$ heteroaryl is substituted with at least one $C_1$ to $C_{12}$ alkyl and/or at least one $C_1$ to $C_{12}$ heteroalkyl group; and/or X is O or S; and/or $R^3$ is selected from $C_1$ to $C_6$ alkane-di-yl, unsubstituted or substituted $C_6$ to $C_{10}$ arylene or unsubstituted or substituted $C_5$ to $C_{10}$ heteroarylene; and/or $R^4$ is selected from H, phenyl, biphenyl, terphenyl, fluorenyl, naphthyl, anthranyl, phenanthryl, pyrenyl, carbazoyl, dibenzofuranyl, dinapthofuranyl; and/or n is 0 or 1;

m is 1 or 2 and n is 0 or 1, or m is 2 and n is 2; and/or $Ar^1$ is selected from phenylene, biphenylene, terphenylene, naphthylene, fluorenylene, pyridylene, quinolinylene, and pyrimidinylene; and/or $Ar^2$ is selected from fluorenylene, anthranylene, pyrenylene, phenanthrylene, carbazoylene, benzo[c]acridinylene, dibenzo[c,h]acridinylene, dibenzo[a,j]acridinylene.

8. The organic light emitting diode according to claim 1, wherein $R^1$, $R^2$, $R^3$, $R^4$, $Ar^1$ and/or $Ar^2$ are unsubstituted.

9. The organic light emitting diode according to claim 1, wherein $Ar^2$ is selected from a compound according to Formula IVa to IVh:

(IVa)

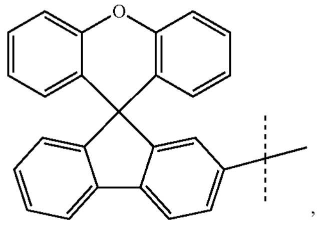

,

-continued
(IVb)
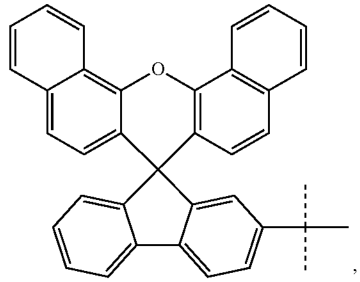
,
(IVc)
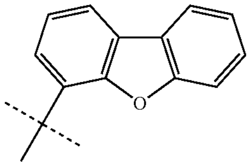
,
(IVd)
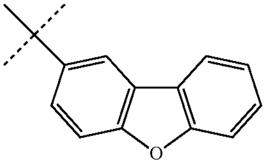
,
(IVe)
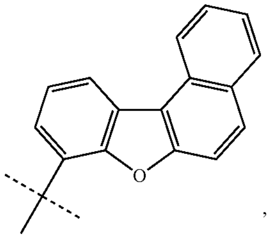
,
(IVf)
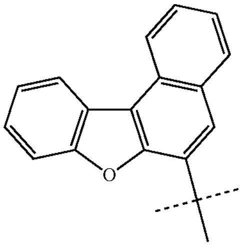
,
(IVg)
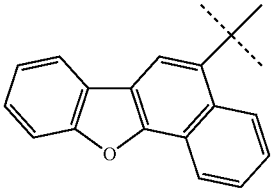
,
(IVh)
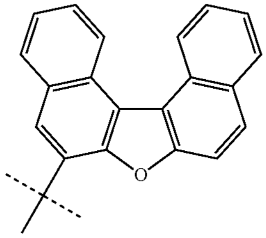
.
10. The organic light emitting diode according to claim 1, wherein the compound of Formula (Ia) is selected from a compound according to:
- Formula Va to Ve:
(Va)
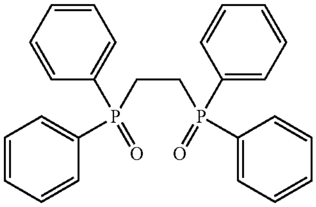
,
(Vb)
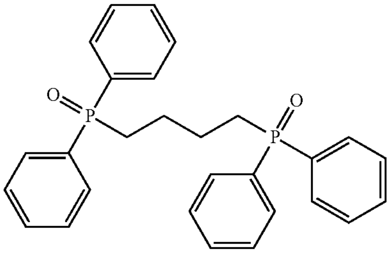
,
(Vc)
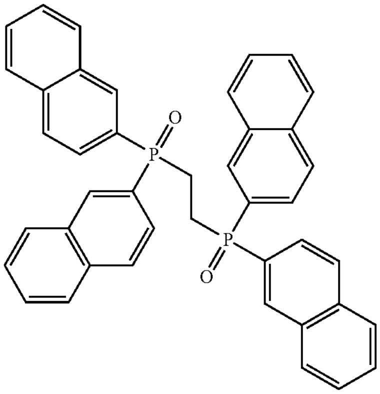
,
(Vd)
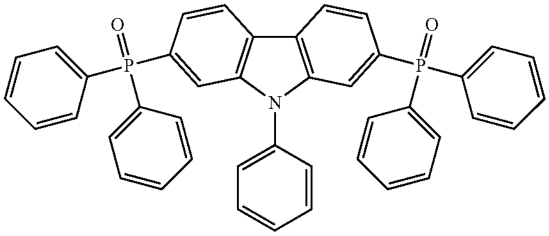
, -continued
(Ve)
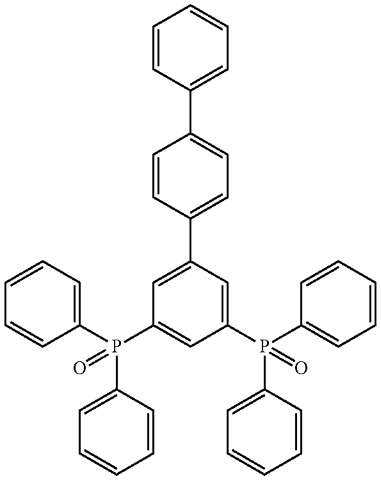
, or
- Formula Vf to Vq:
(Vf)
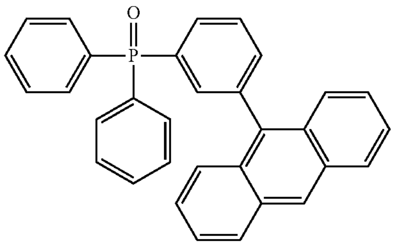
,
(Vg)
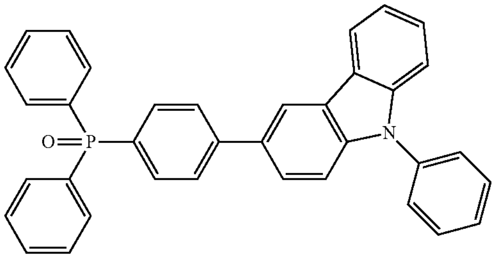
,
(Vh)
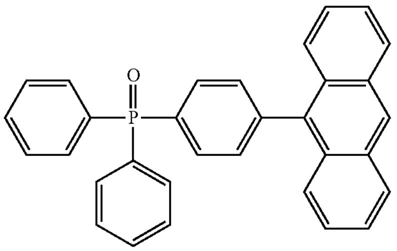
,
(Vi)
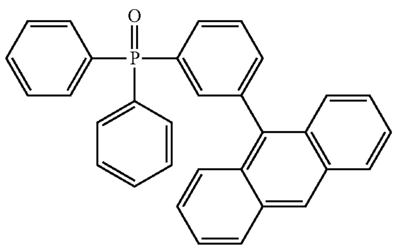
,
-continued
(Vj)
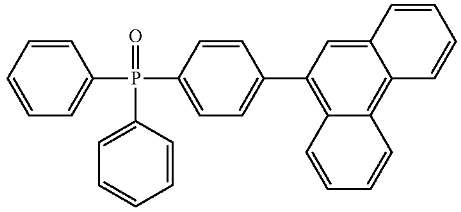
,
(Vk)
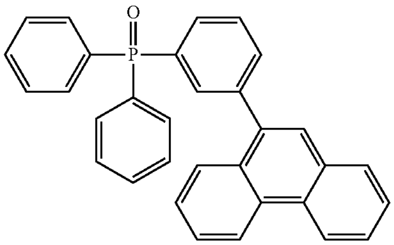
,
(Vl)
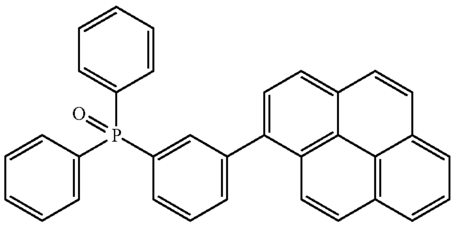
,
(Vm)
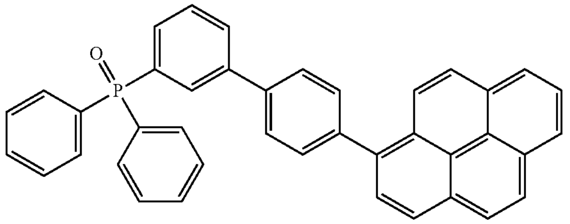
,
(Vn)
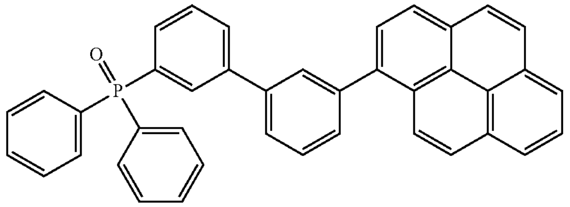
,
(Vo)
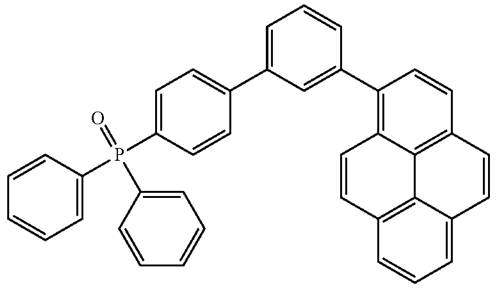
, -continued
(Vp)
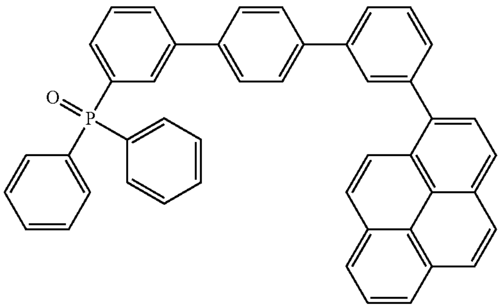
,
(Vq)
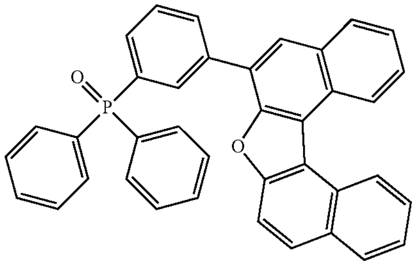
, or
- Formula Vr to Vt:
(Vr)
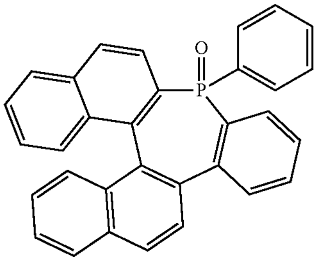
,
(Vs)
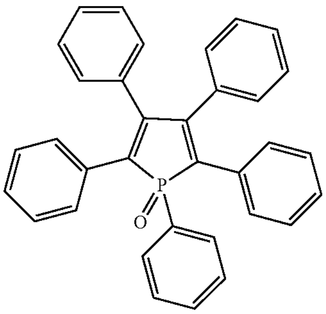
,
(Vt)
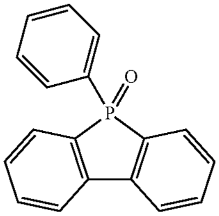
,
-continued
- Formula Vu to Vai:
(Vu)
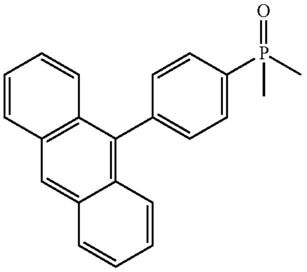
,
(Vv)
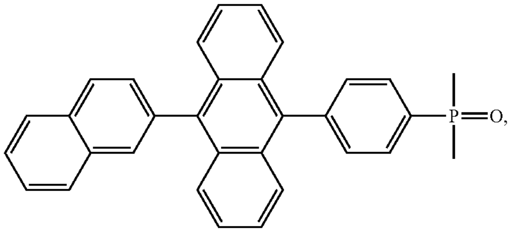
(Vw)
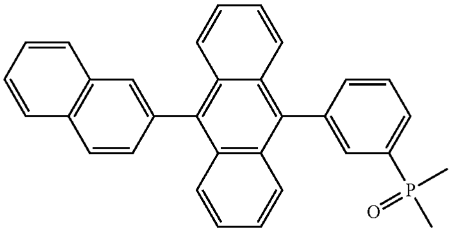
,
(Vx)
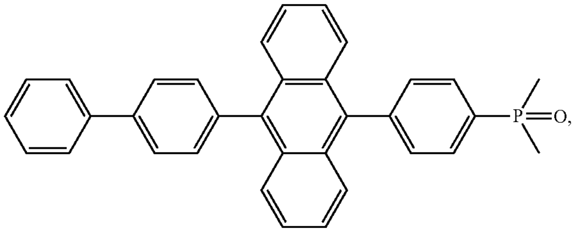
(Vy)
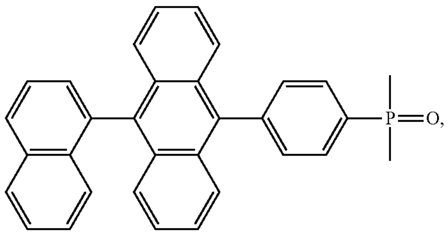

-continued
(Vz)
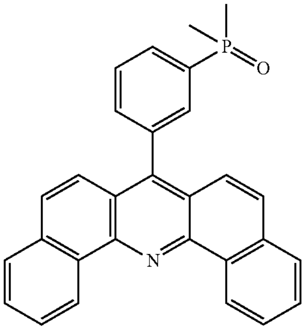
,
(Vaa)
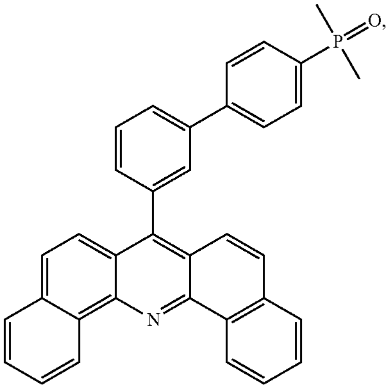
(Vab)
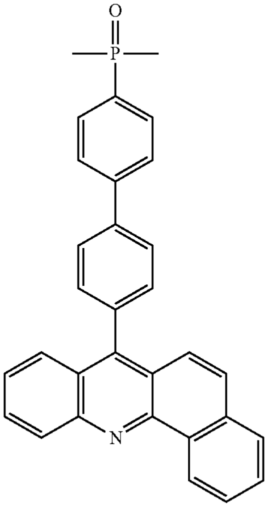
,
(Vac)
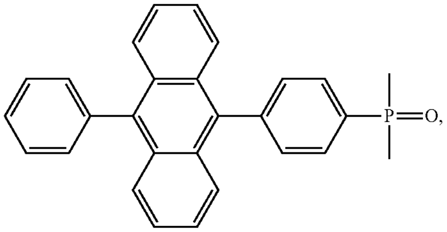
-continued
(Vad)
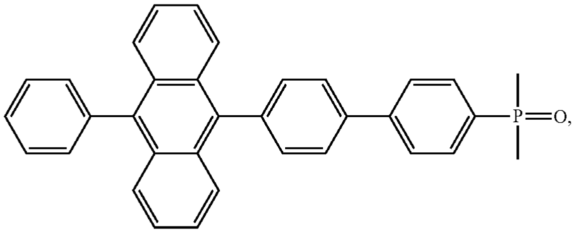
(Vae)
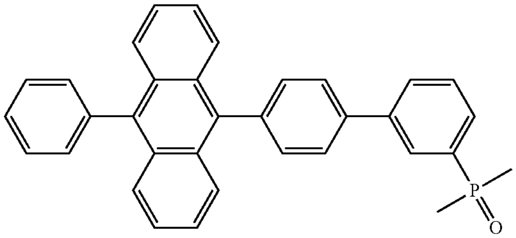
,
(Vaf)
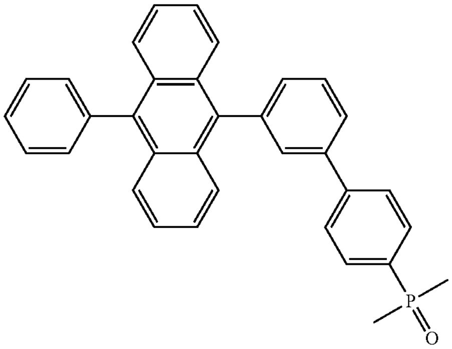
,
(Vag)
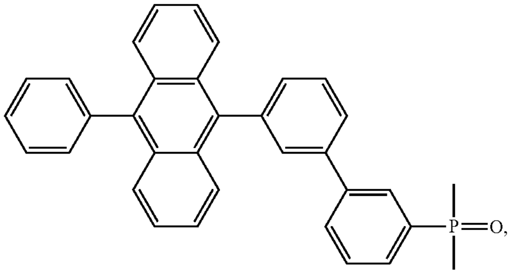
(Vah)
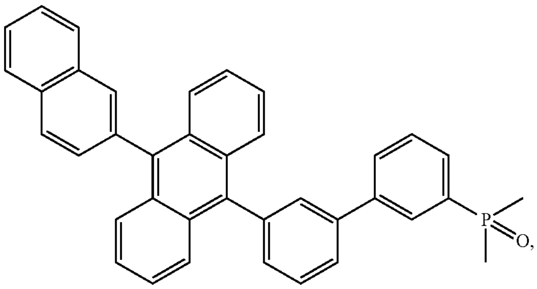

-continued (Vai)

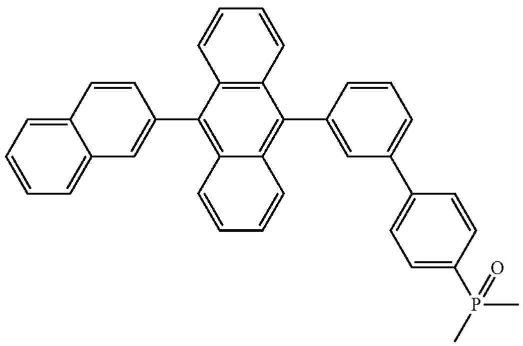

11. A method of manufacturing an organic light emitting diode, according to claim 1, wherein on the substrate an anode electrode is deposited and on the anode electrode the other layers of hole injection layer, hole transport layer, optional electron blocking layer, emission layer, optional hole blocking layer, optional electron transport layer, electron injection layer, and first cathode electrode layer, are deposited in that order; or the layers are deposited the other way around, starting with the first cathode electrode.

12. Electronic device comprising at least one organic light emitting diode, according to claim 1.

* * * * *